US012119359B2

(12) United States Patent
Baba

(10) Patent No.: US 12,119,359 B2
(45) Date of Patent: Oct. 15, 2024

(54) IMAGING DEVICE

(71) Applicant: Sony Semiconductor Solutions Corporation, Kanagawa (JP)

(72) Inventor: Koichi Baba, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 679 days.

(21) Appl. No.: 17/292,258

(22) PCT Filed: Dec. 6, 2019

(86) PCT No.: PCT/JP2019/047885

§ 371 (c)(1),
(2) Date: May 7, 2021

(87) PCT Pub. No.: WO2020/129712

PCT Pub. Date: Jun. 25, 2020

(65) Prior Publication Data

US 2021/0375966 A1 Dec. 2, 2021

(30) Foreign Application Priority Data

Dec. 20, 2018 (JP) ................................ 2018-238179

(51) Int. Cl.
*H01L 27/146* (2006.01)
*H04N 25/75* (2023.01)
(Continued)

(52) U.S. Cl.
CPC .. *H01L 27/14612* (2013.01); *H01L 27/14603* (2013.01); *H01L 27/14609* (2013.01);
(Continued)

(58) Field of Classification Search
CPC ........... H01L 27/1469; H01L 27/14612; H01L 27/14634; H01L 27/14609
See application file for complete search history.

(56) References Cited

U.S. PATENT DOCUMENTS

2012/0293698 A1* 11/2012 Sukegawa ......... H01L 27/14634 257/774
2015/0179691 A1* 6/2015 Yanagita ........... H01L 27/14636 257/292
2015/0221694 A1* 8/2015 Baba ................. H01L 27/14636 257/443

(Continued)

FOREIGN PATENT DOCUMENTS

CN 101471361 A 7/2009
CN 101998070 A 3/2011

(Continued)

OTHER PUBLICATIONS

International Search Report issued in International Patent Application No. PCT/JP2019/047885 on Feb. 25, 2020 and English translation of same. 7 pages.

(Continued)

*Primary Examiner* — Alia Sabur
(74) *Attorney, Agent, or Firm* — K&L Gates LLP

(57) ABSTRACT

An imaging device according to an embodiment of the present disclosure includes: a first substrate including, in a first semiconductor substrate, a sensor pixel that performs photoelectric conversion; a second substrate including, in a second semiconductor substrate, a readout circuit that outputs a pixel signal based on charges outputted from the sensor pixel, in which the second substrate is stacked on the first substrate; and a first hydrogen diffusion prevention layer provided between the first semiconductor substrate and the second semiconductor substrate.

17 Claims, 37 Drawing Sheets

(51) Int. Cl.
*H04N 25/766* (2023.01)
*H04N 25/79* (2023.01)

(52) U.S. Cl.
CPC .. *H01L 27/14625* (2013.01); *H01L 27/14634* (2013.01); *H01L 27/14636* (2013.01); *H04N 25/75* (2023.01); *H04N 25/766* (2023.01); *H04N 25/79* (2023.01); *H01L 27/14683* (2013.01)

(56) References Cited

U.S. PATENT DOCUMENTS

| | | | | |
|---|---|---|---|---|
| 2015/0249107 | A1* | 9/2015 | Baba | H01L 27/1469 257/292 |
| 2016/0043144 | A1* | 2/2016 | Sato | H01L 27/14636 257/40 |
| 2016/0358967 | A1* | 12/2016 | Madurawe | H01L 27/14636 |
| 2017/0207223 | A1* | 7/2017 | Kugimiya | H01L 27/14634 |
| 2017/0243909 | A1 | 8/2017 | Kurokawa | |

FOREIGN PATENT DOCUMENTS

| | | | |
|---|---|---|---|
| CN | 102668081 | A | 9/2012 |
| CN | 107615488 | A | 1/2018 |
| CN | 108807433 | A | 11/2018 |
| JP | 2006-216617 | A | 8/2006 |
| JP | 2010-245506 | A | 10/2010 |
| JP | 2014-022561 | A | 2/2014 |
| JP | 2016-039328 | A | 3/2016 |
| JP | 2016-195229 | A | 11/2016 |
| WO | WO2011/077580 | A1 | 6/2011 |
| WO | WO2014/050694 | A1 | 4/2014 |
| WO | WO-2015016140 | A1 | 2/2015 |
| WO | WO2017/038403 | A1 | 3/2017 |

OTHER PUBLICATIONS

Written Opinion issued in International Patent Application No. PCT/JP2019/047885 on Feb. 25, 2020. 5 pages.

* cited by examiner

[ FIG. 1 ]
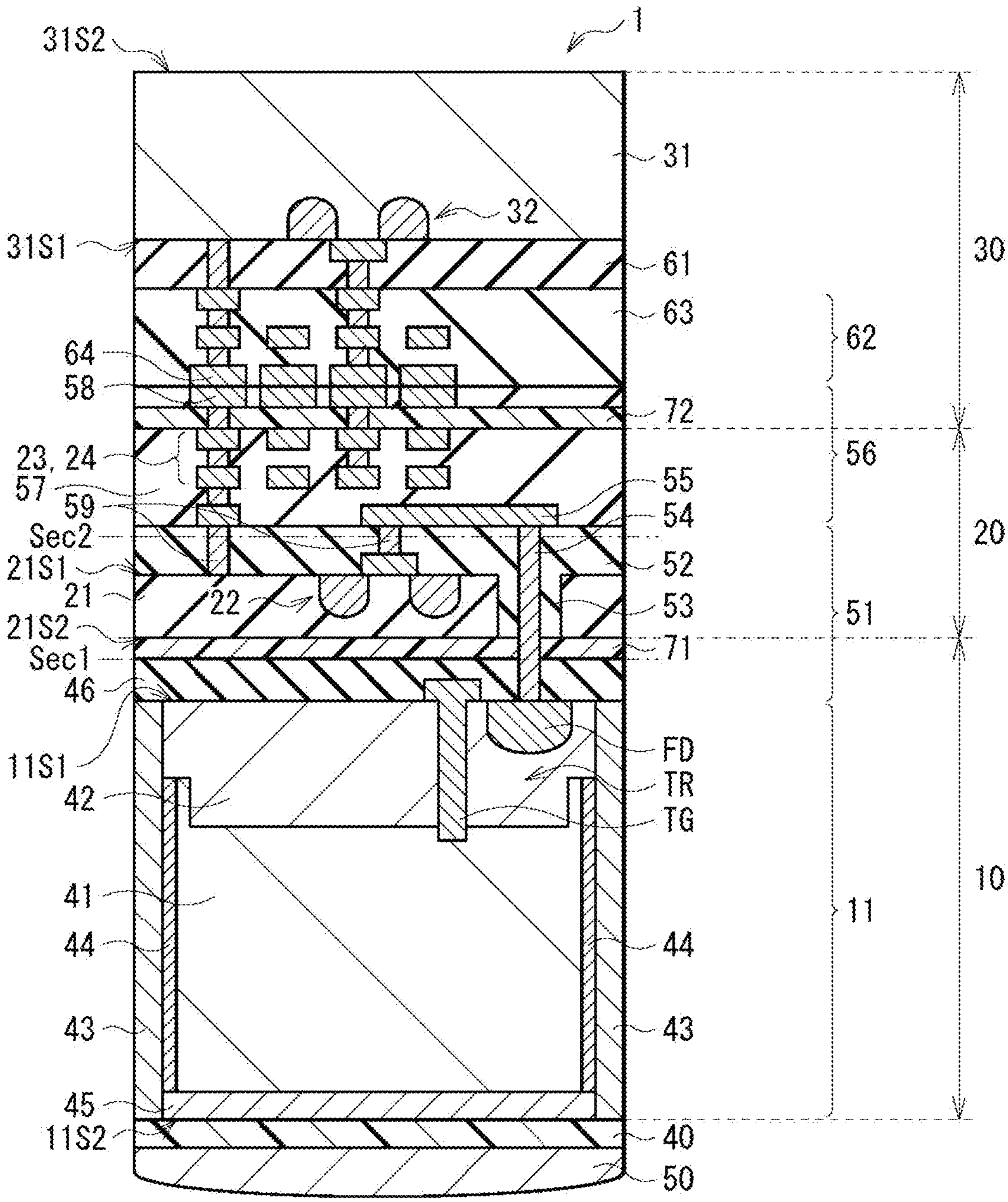

[ FIG. 2 ]
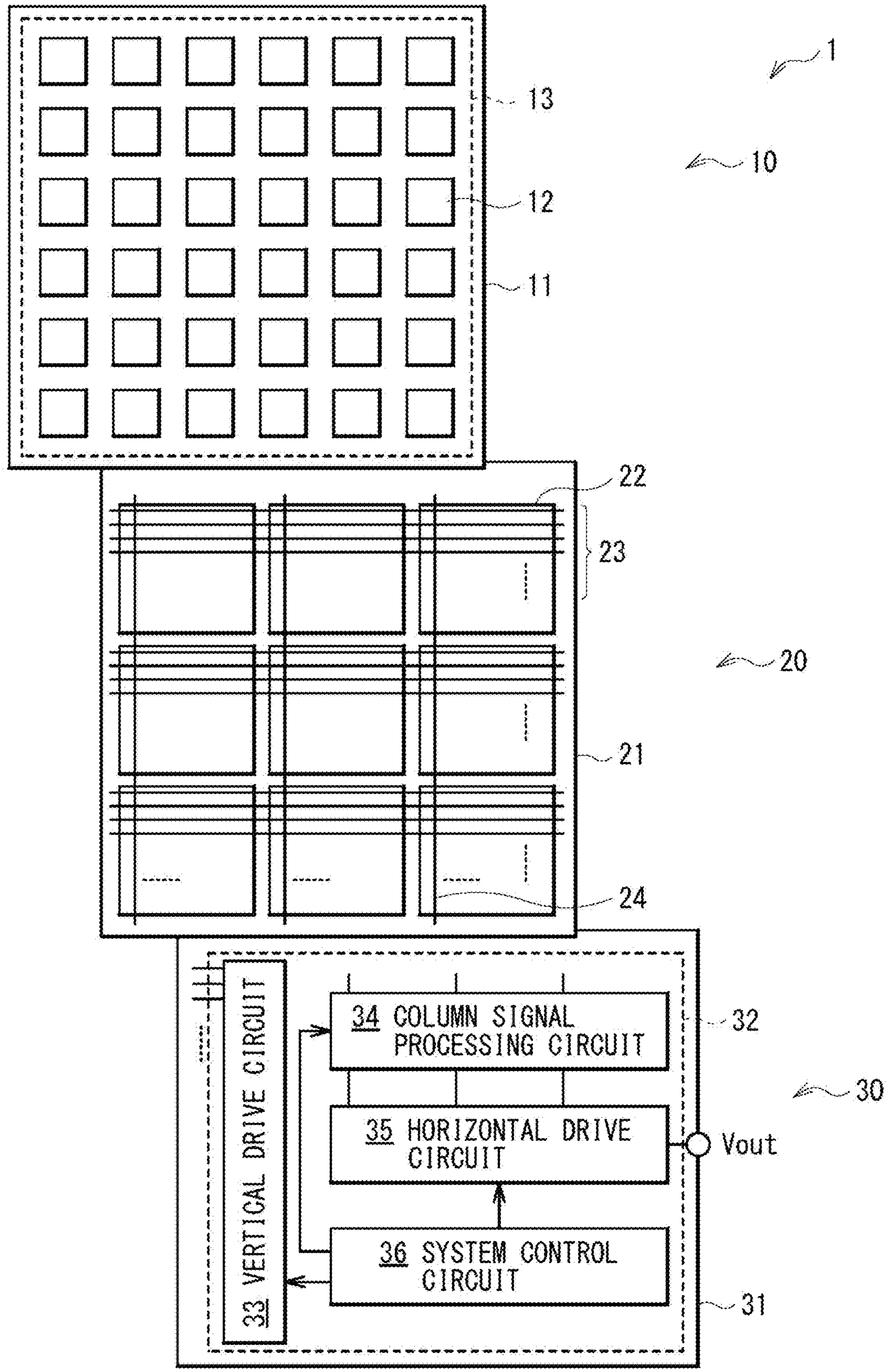

[ FIG. 3 ]
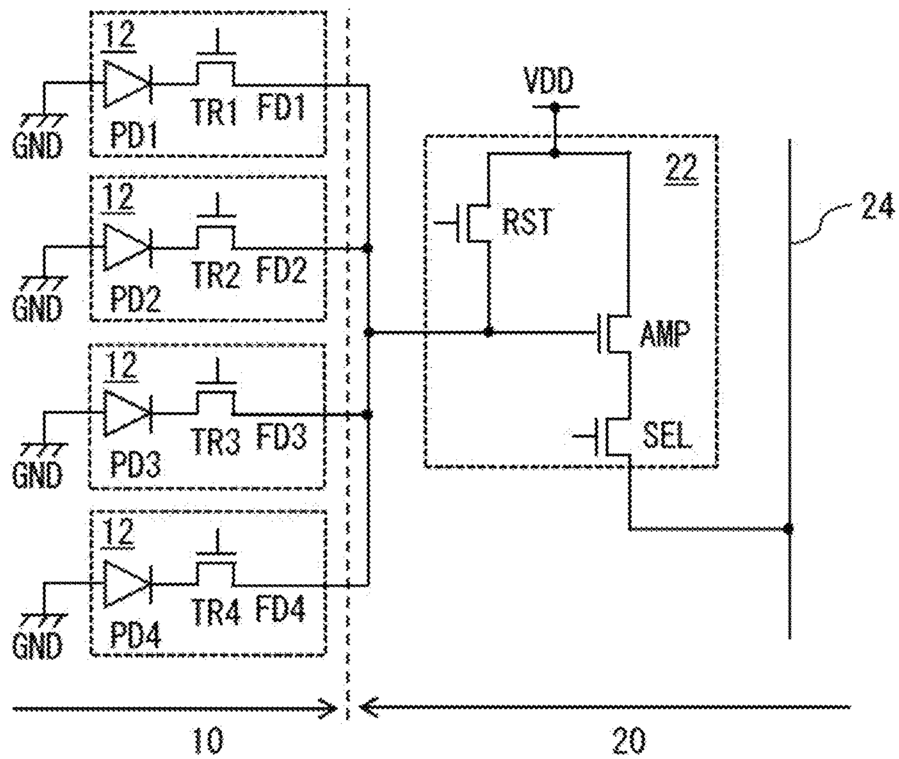

[ FIG. 4 ]
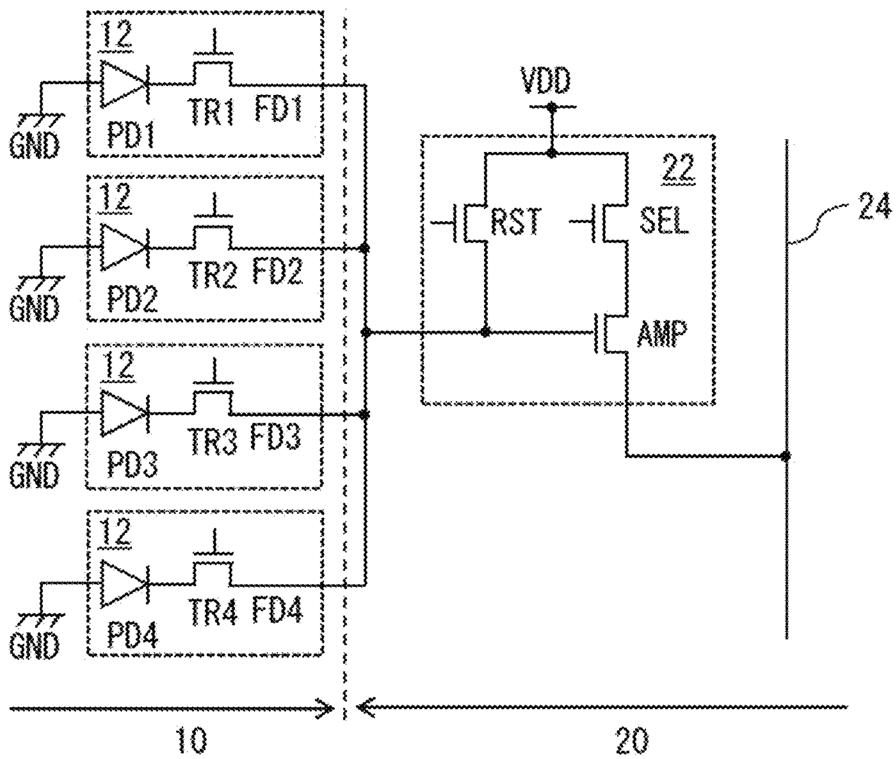

[ FIG. 5 ]
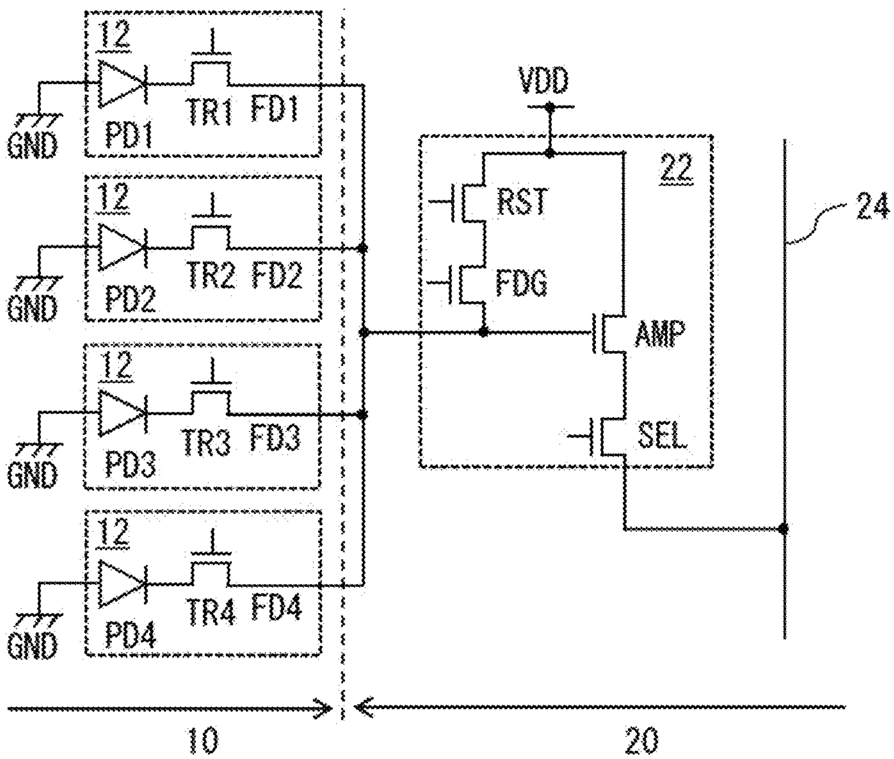

[ FIG. 6 ]
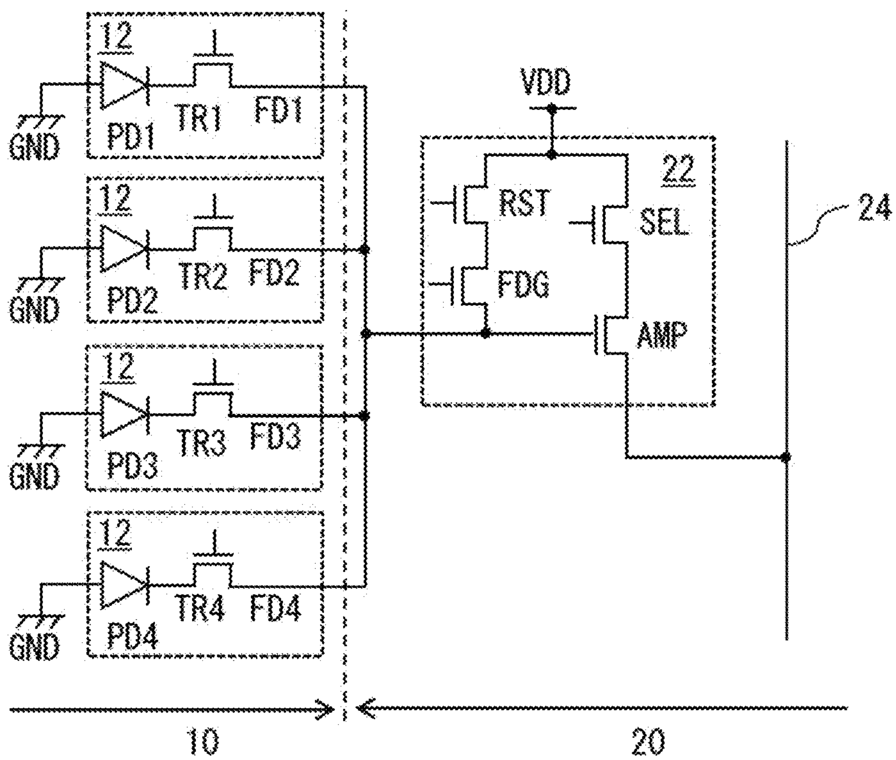

[ FIG. 7 ]
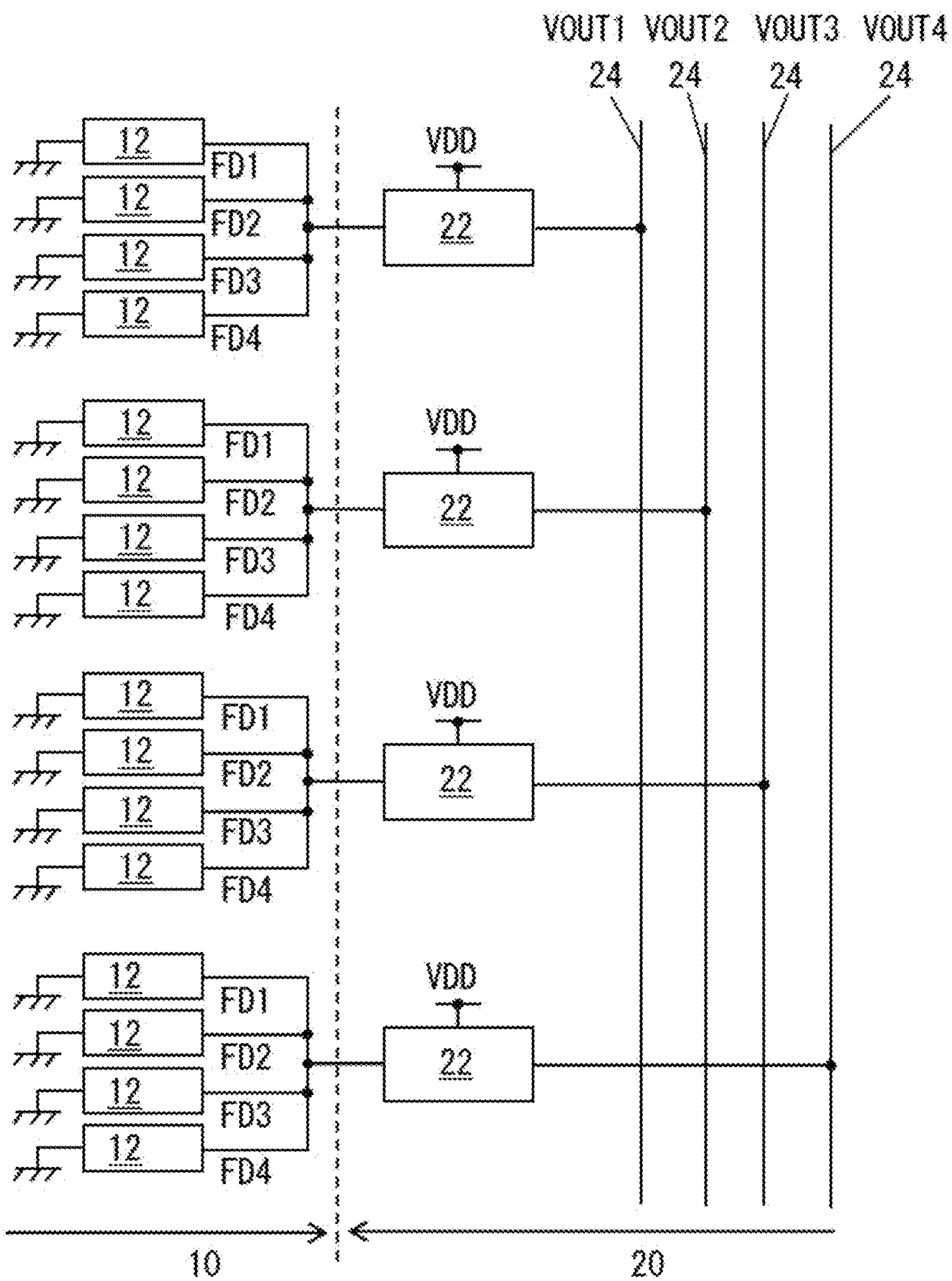

[ FIG. 8 ]
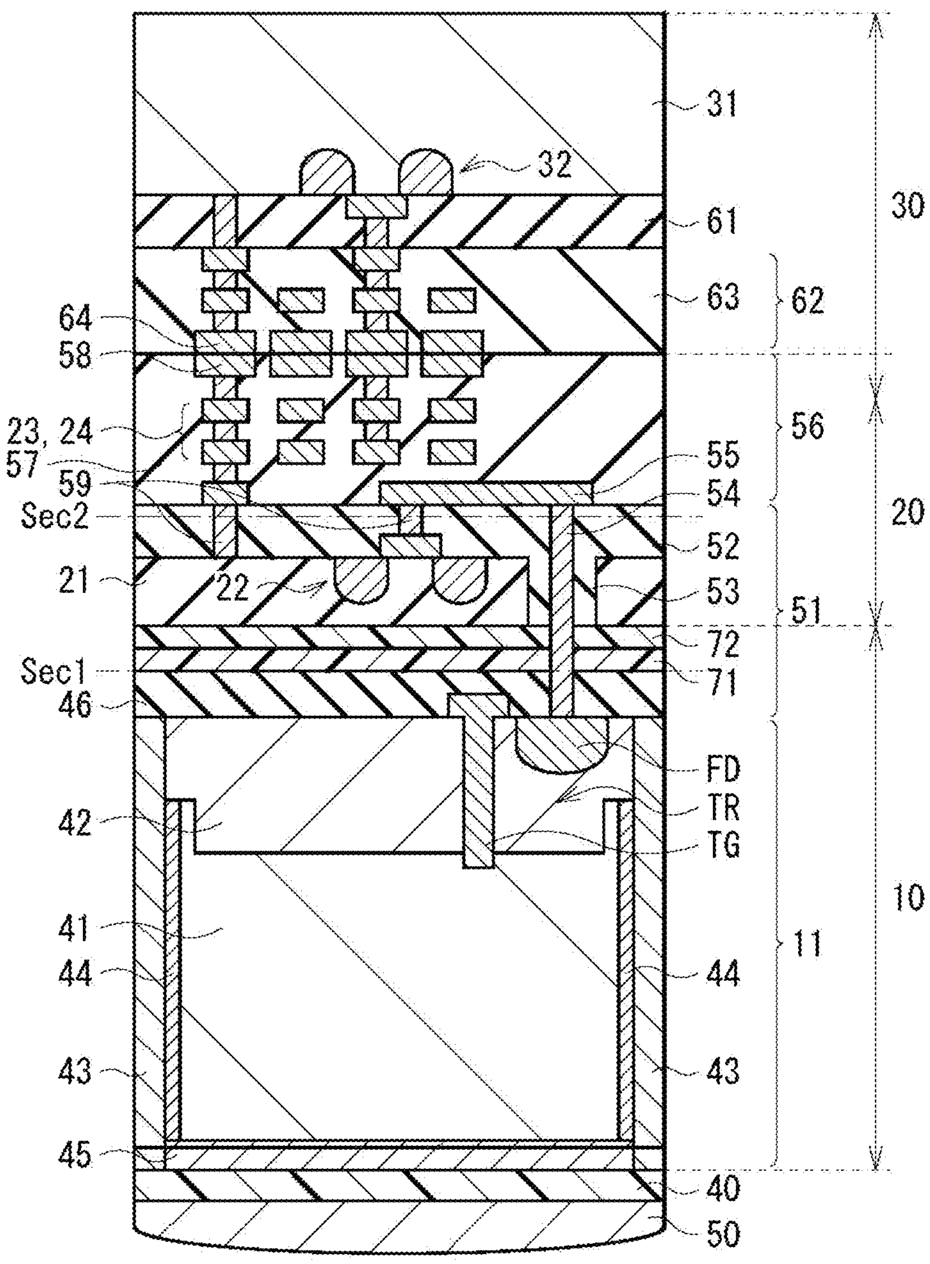

[ FIG. 9 ]
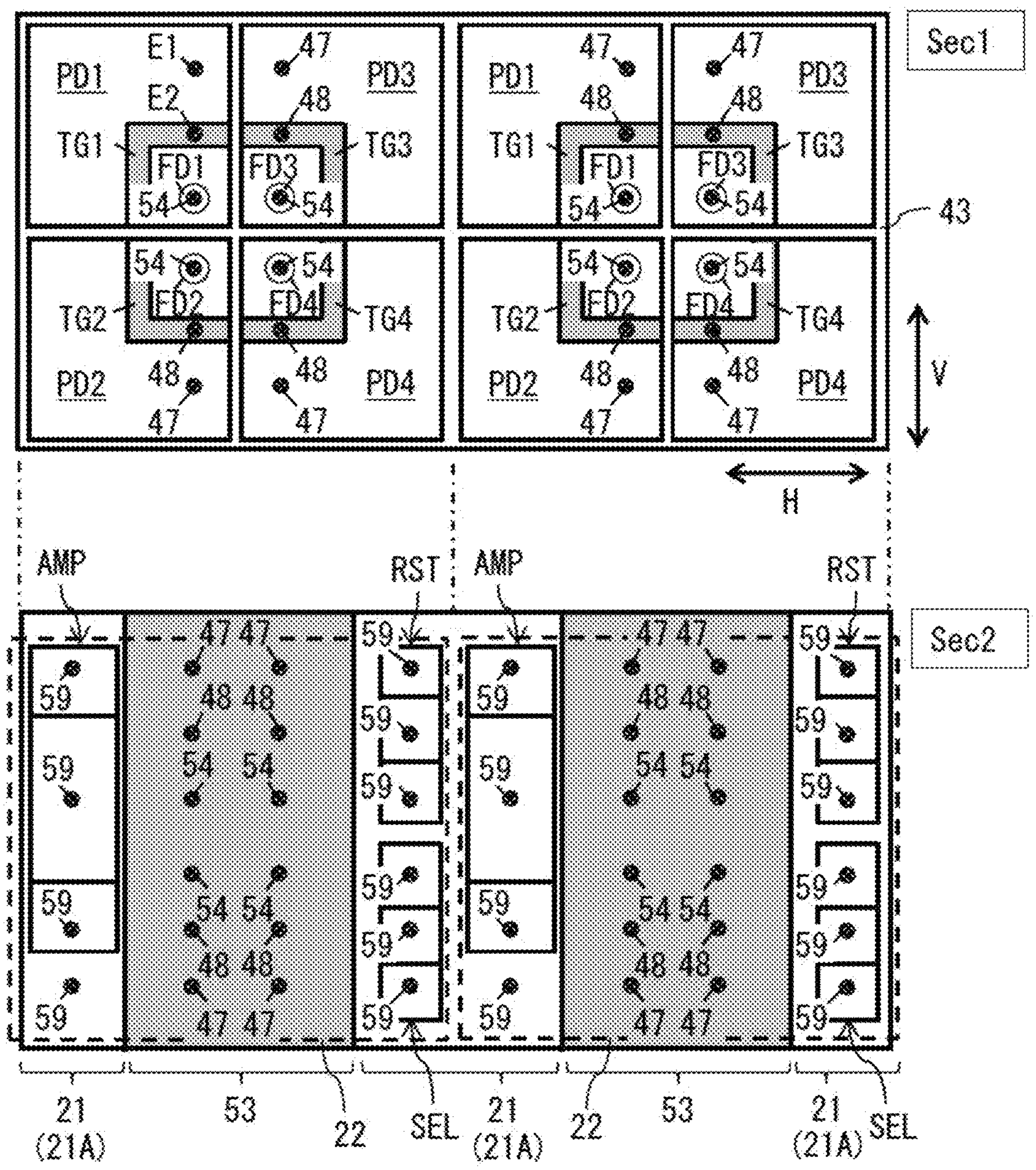

[ FIG. 10 ]
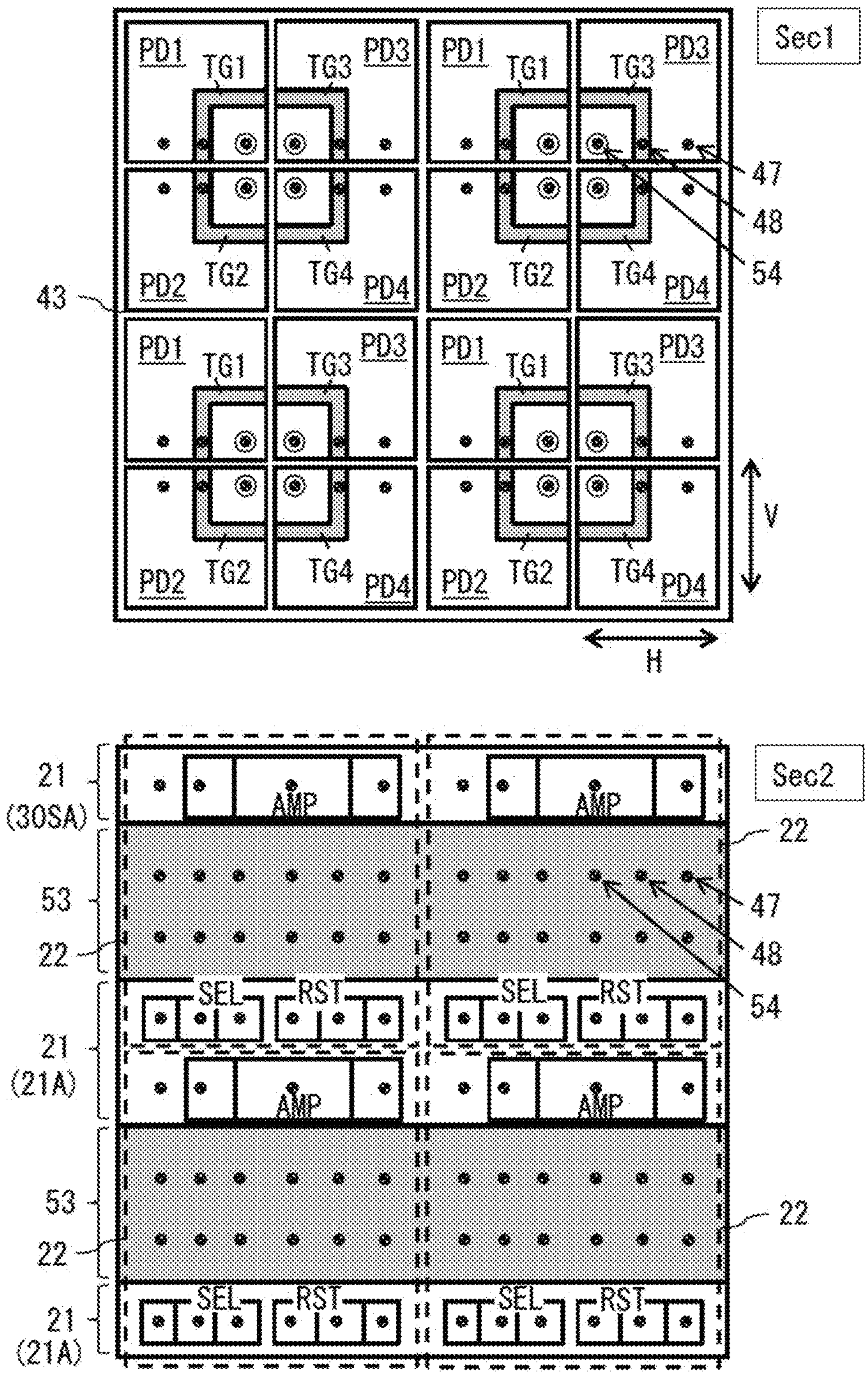

[ FIG. 11 ]
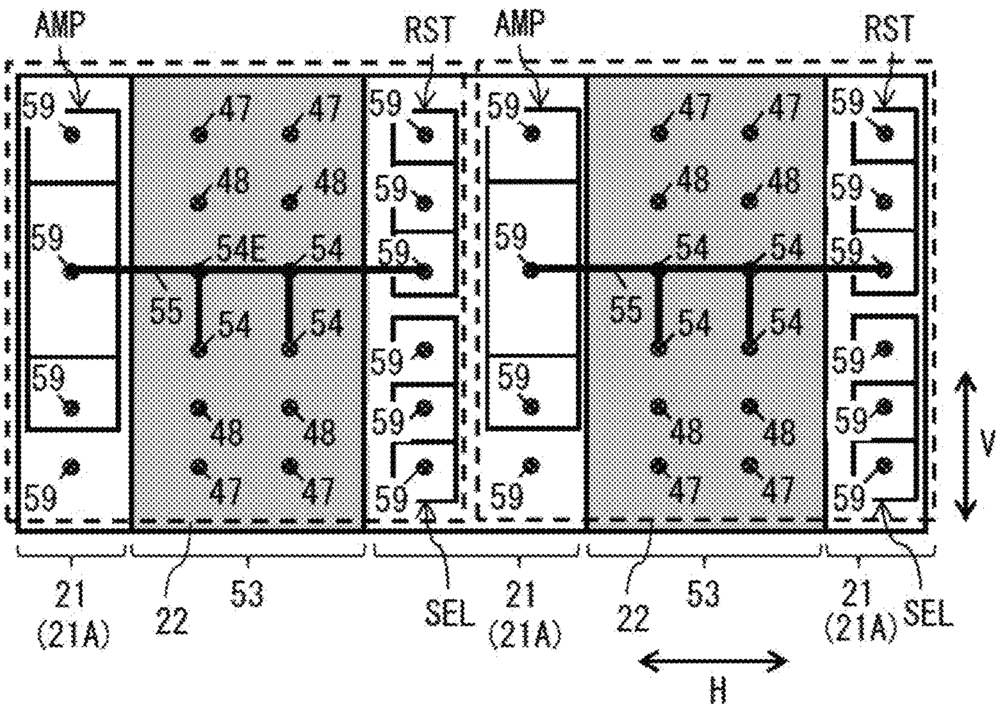
[ FIG. 12 ]
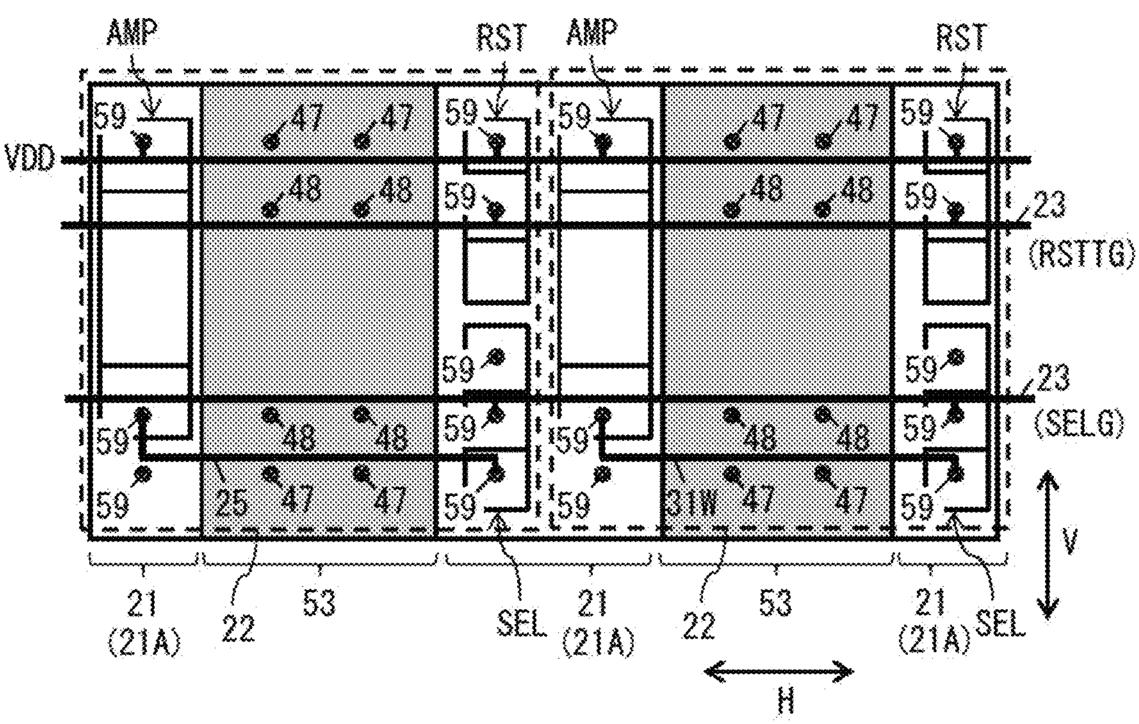

[ FIG. 13 ]
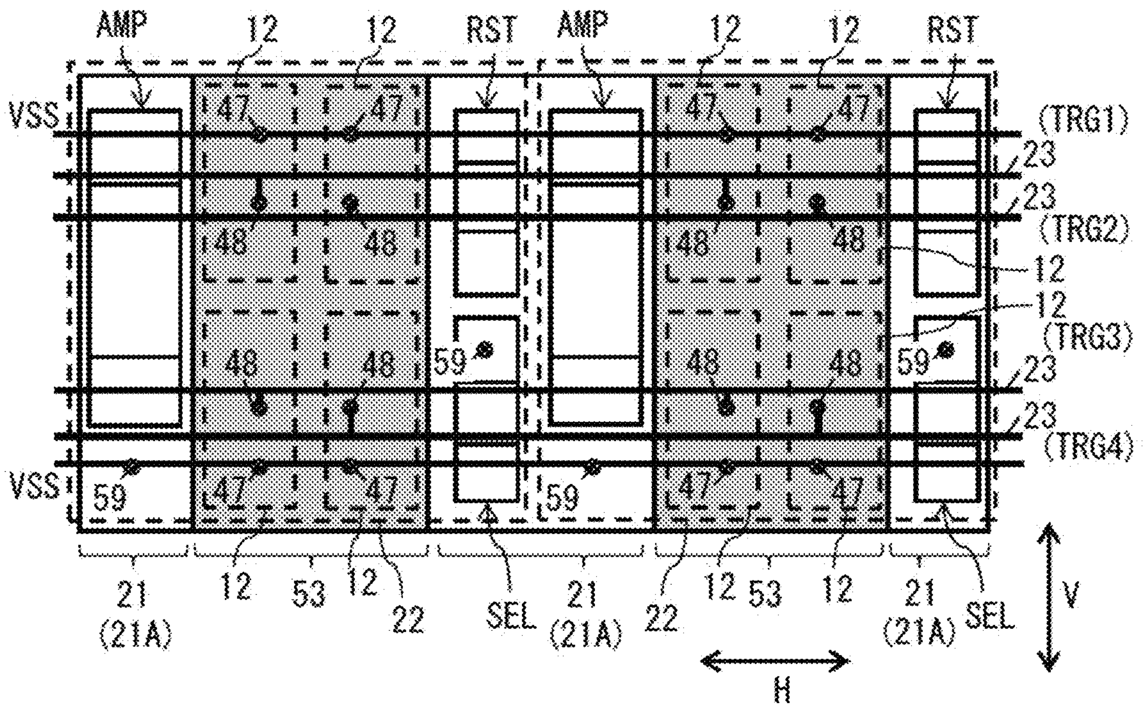
[ FIG. 14 ]
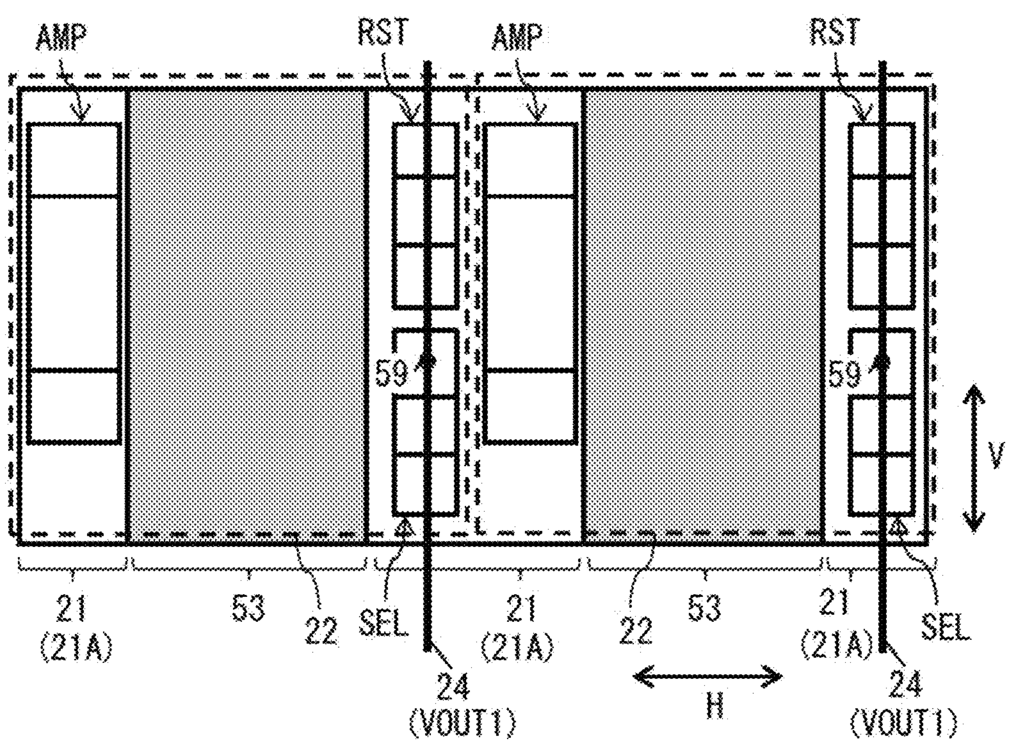

[ FIG. 15A ]
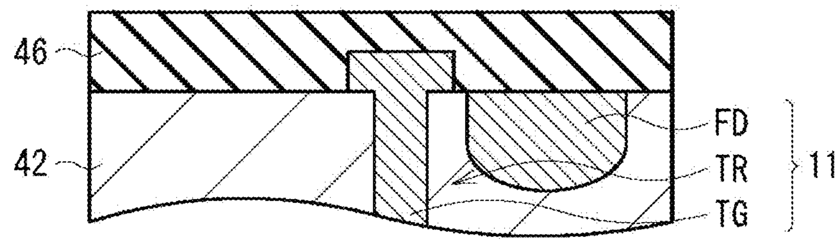
[ FIG. 15B ]
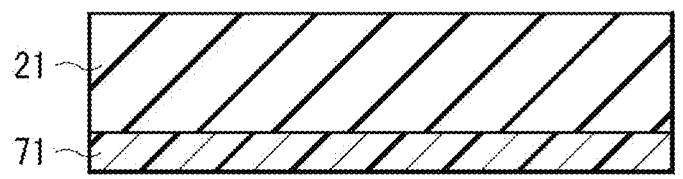
[ FIG. 15C ]
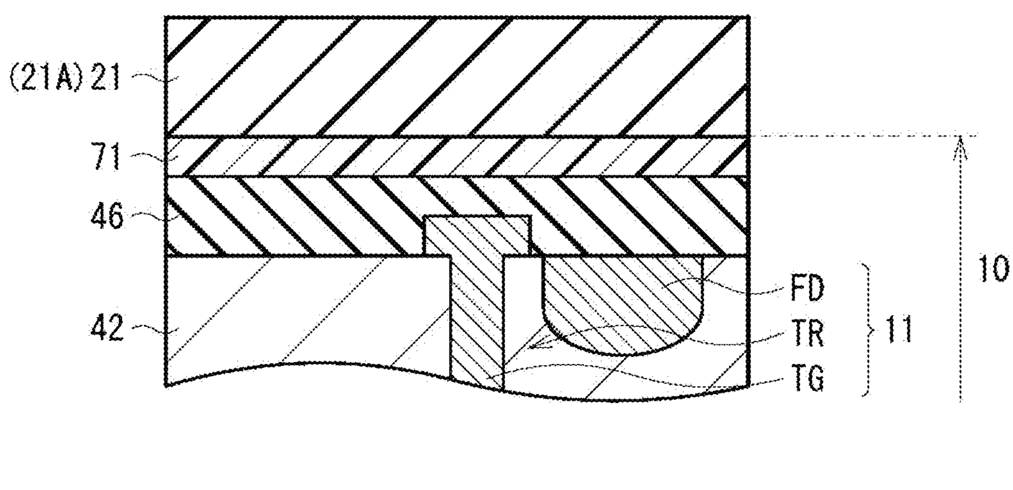

[ FIG. 15D ]
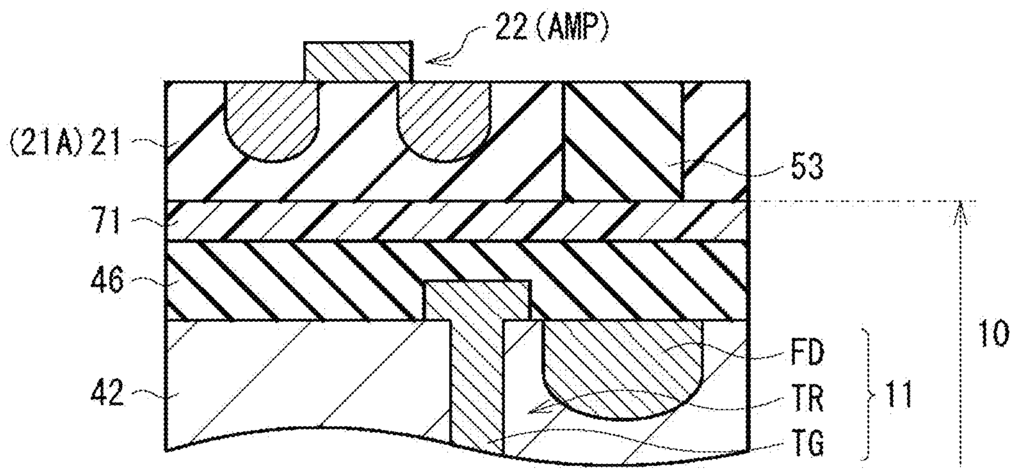
[ FIG. 15E ]
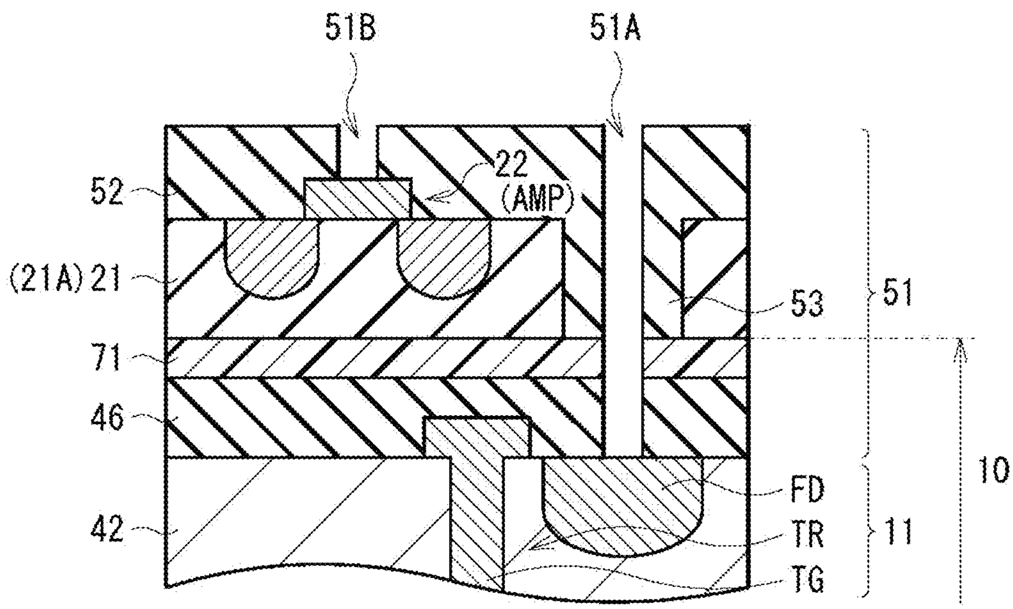

[ FIG. 15F ]
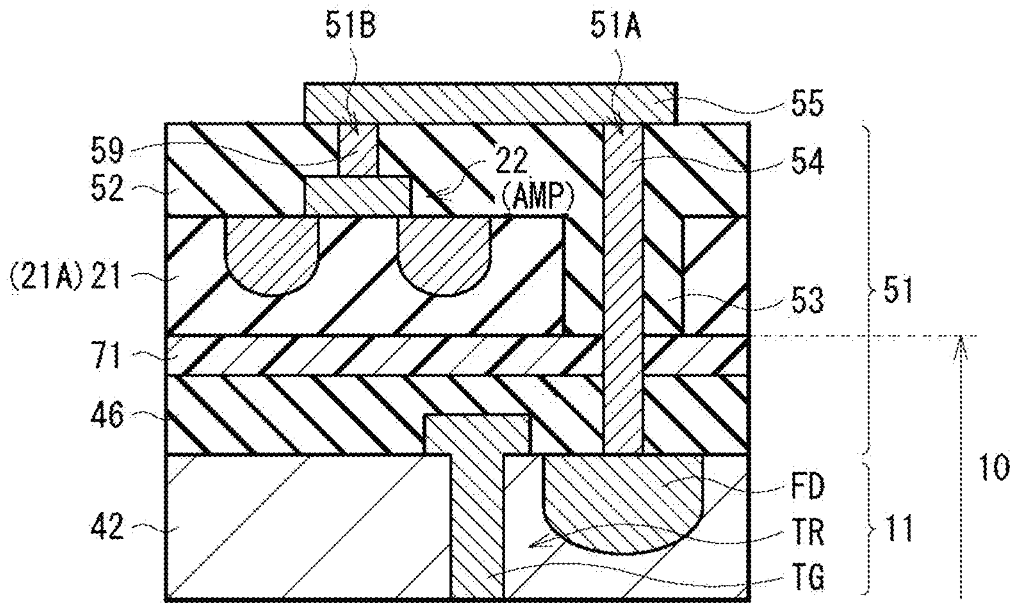
[ FIG. 15G ]
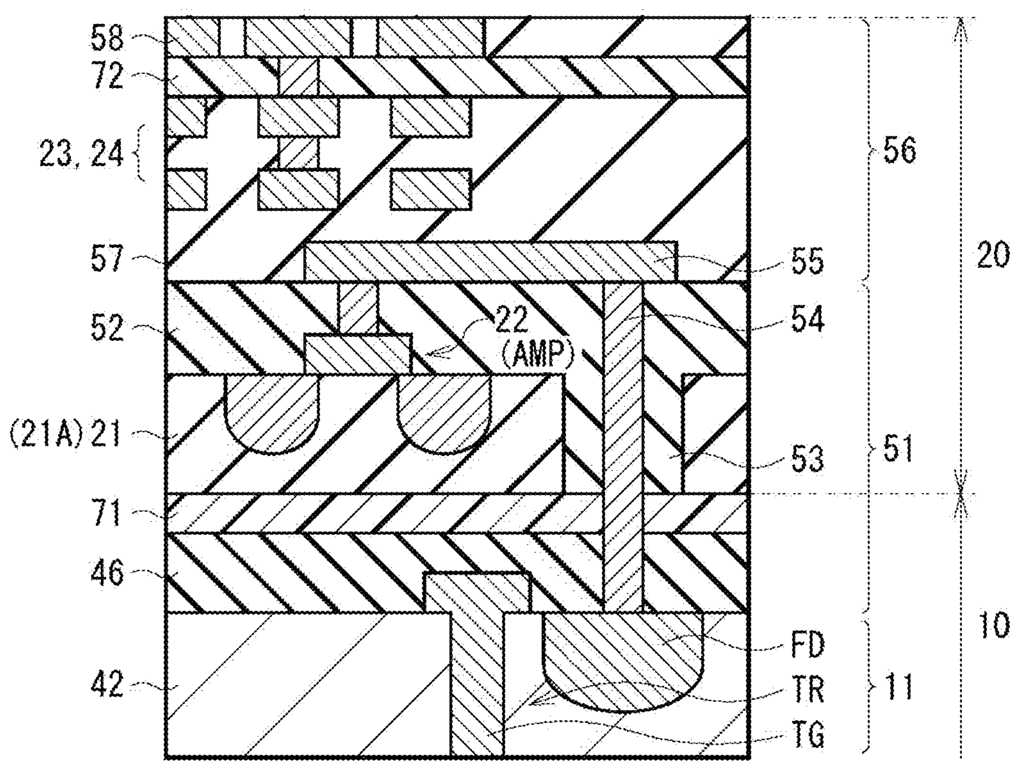

[ FIG. 15H ]
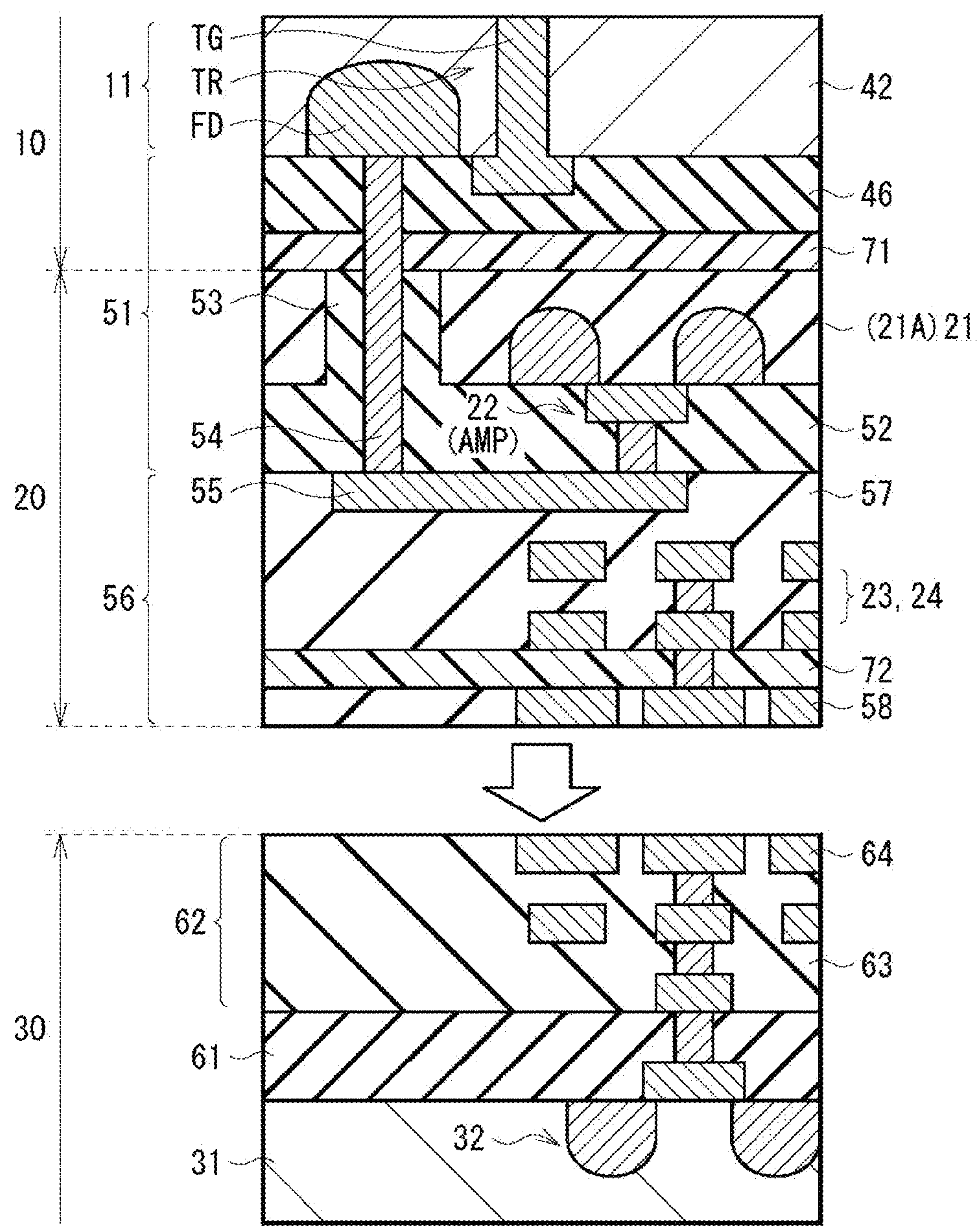

[ FIG. 16 ]
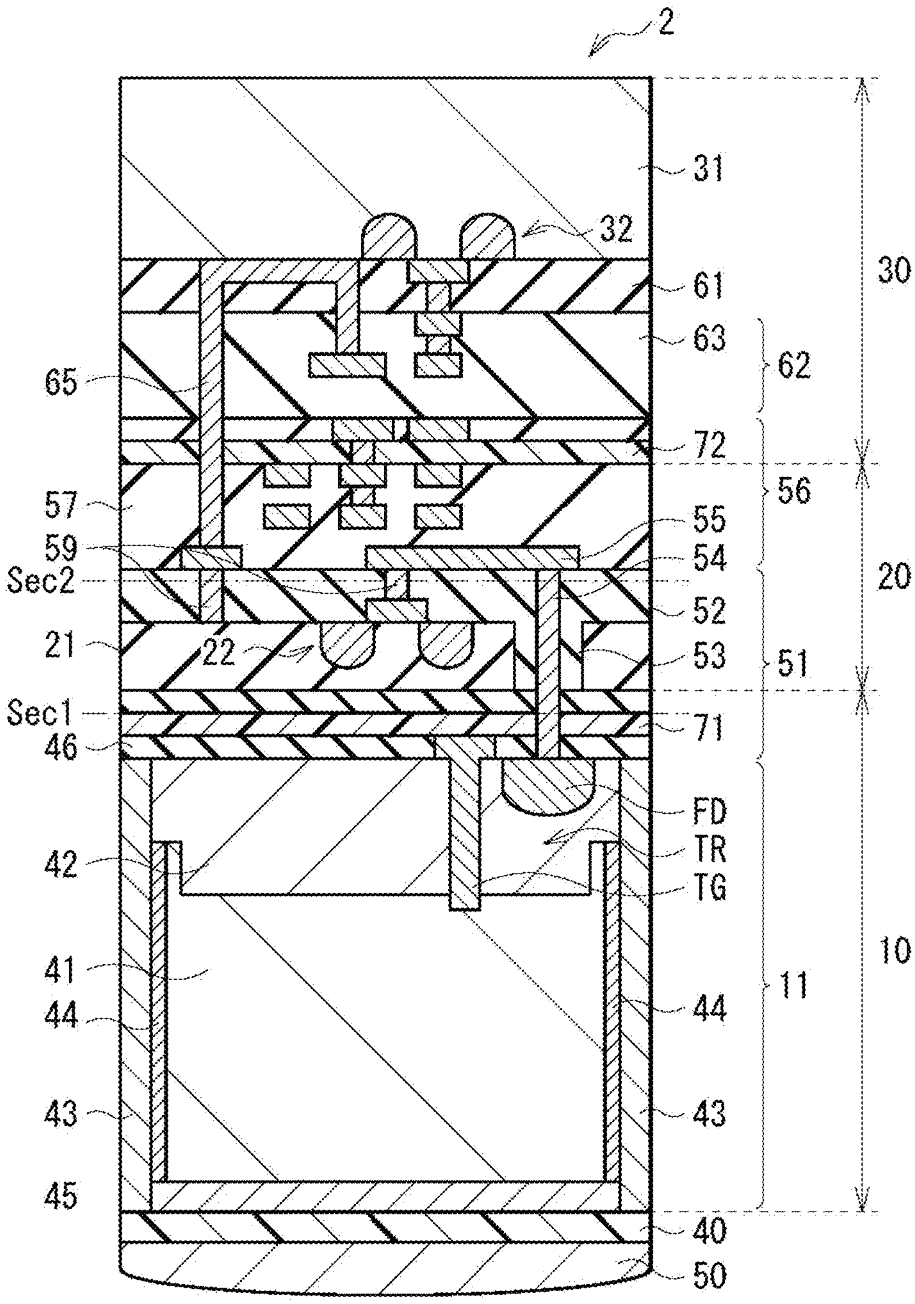

[ FIG. 17 ]
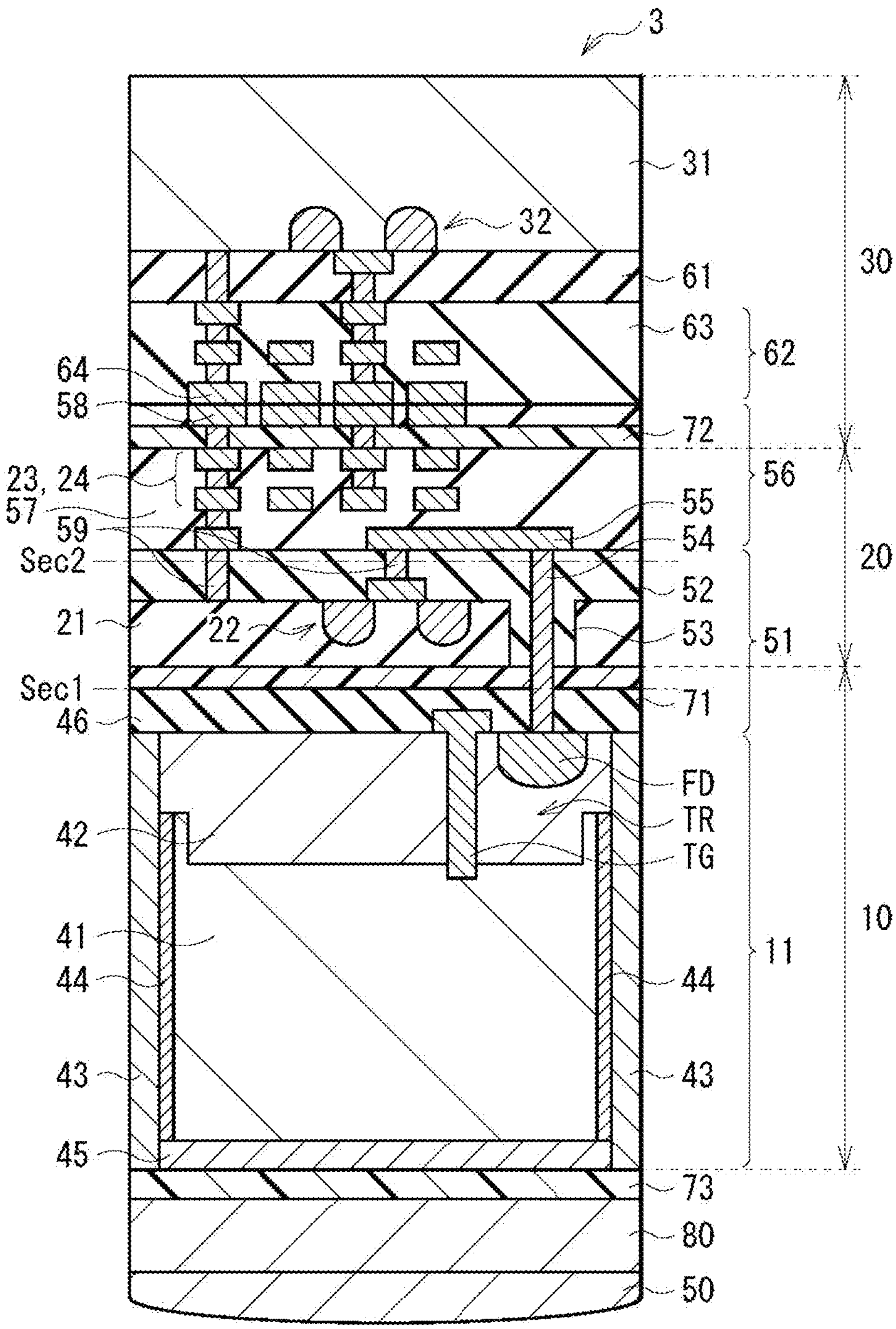

[ FIG. 18 ]
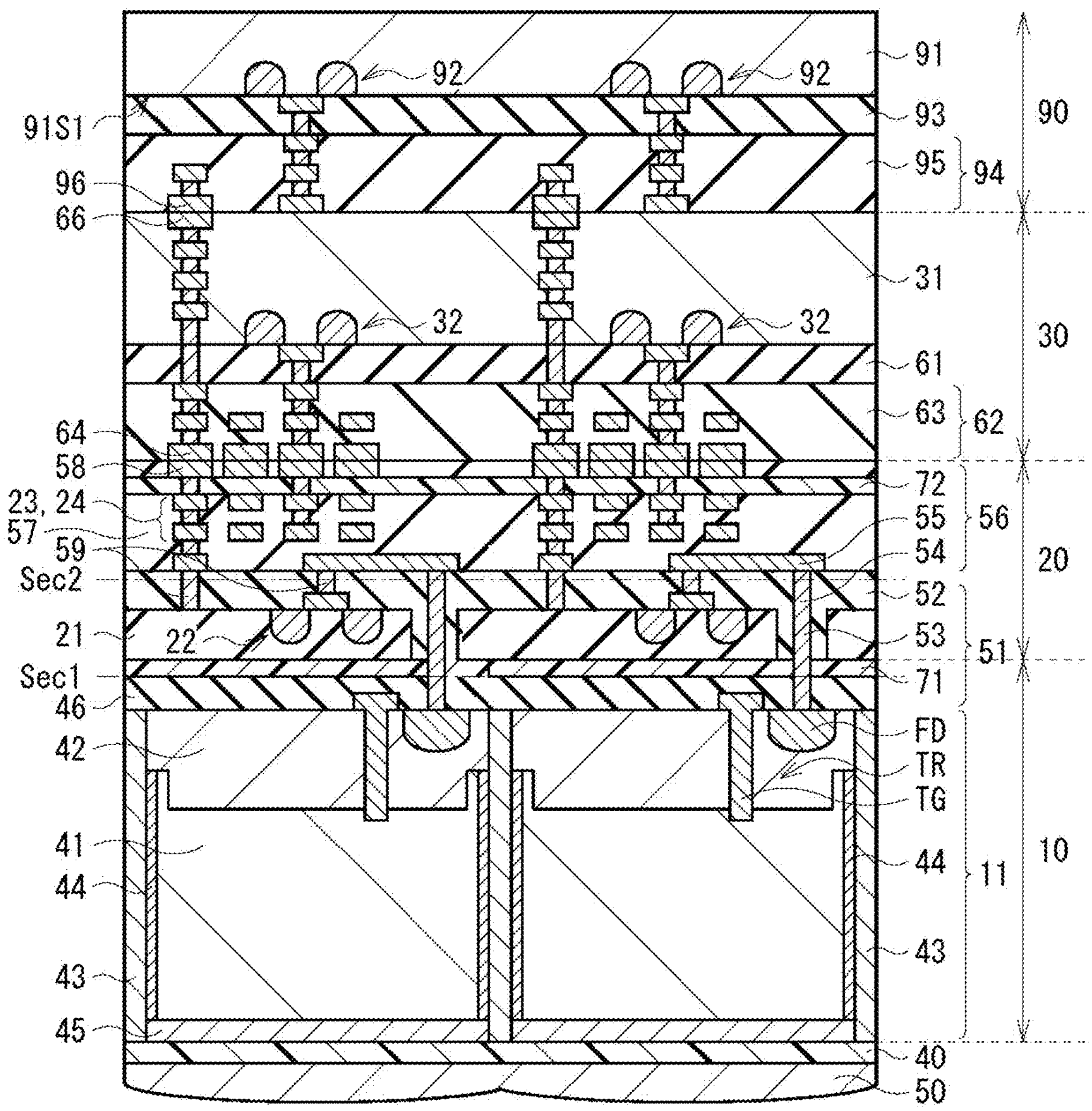

[ FIG. 19 ]
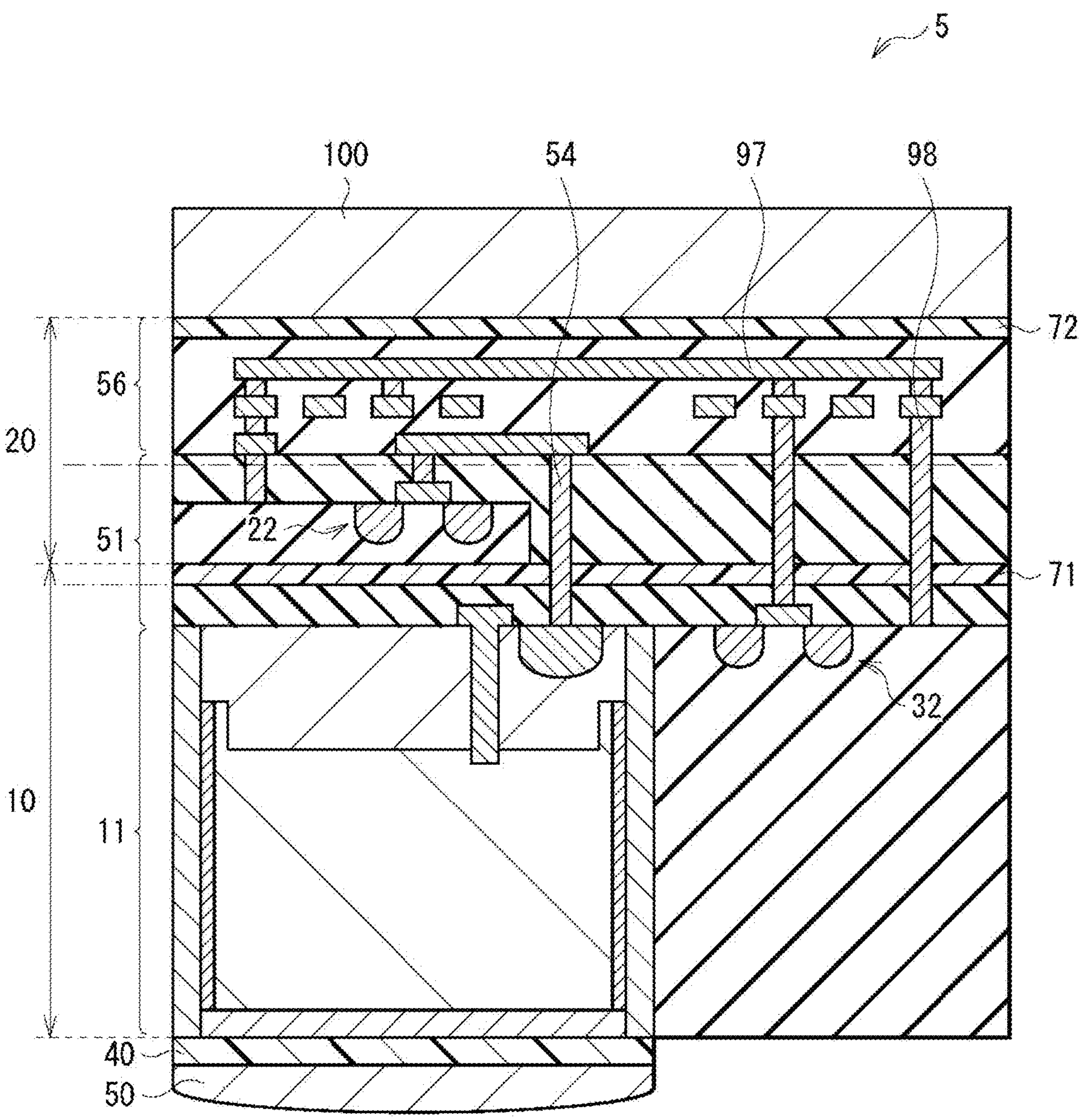

[ FIG. 20 ]
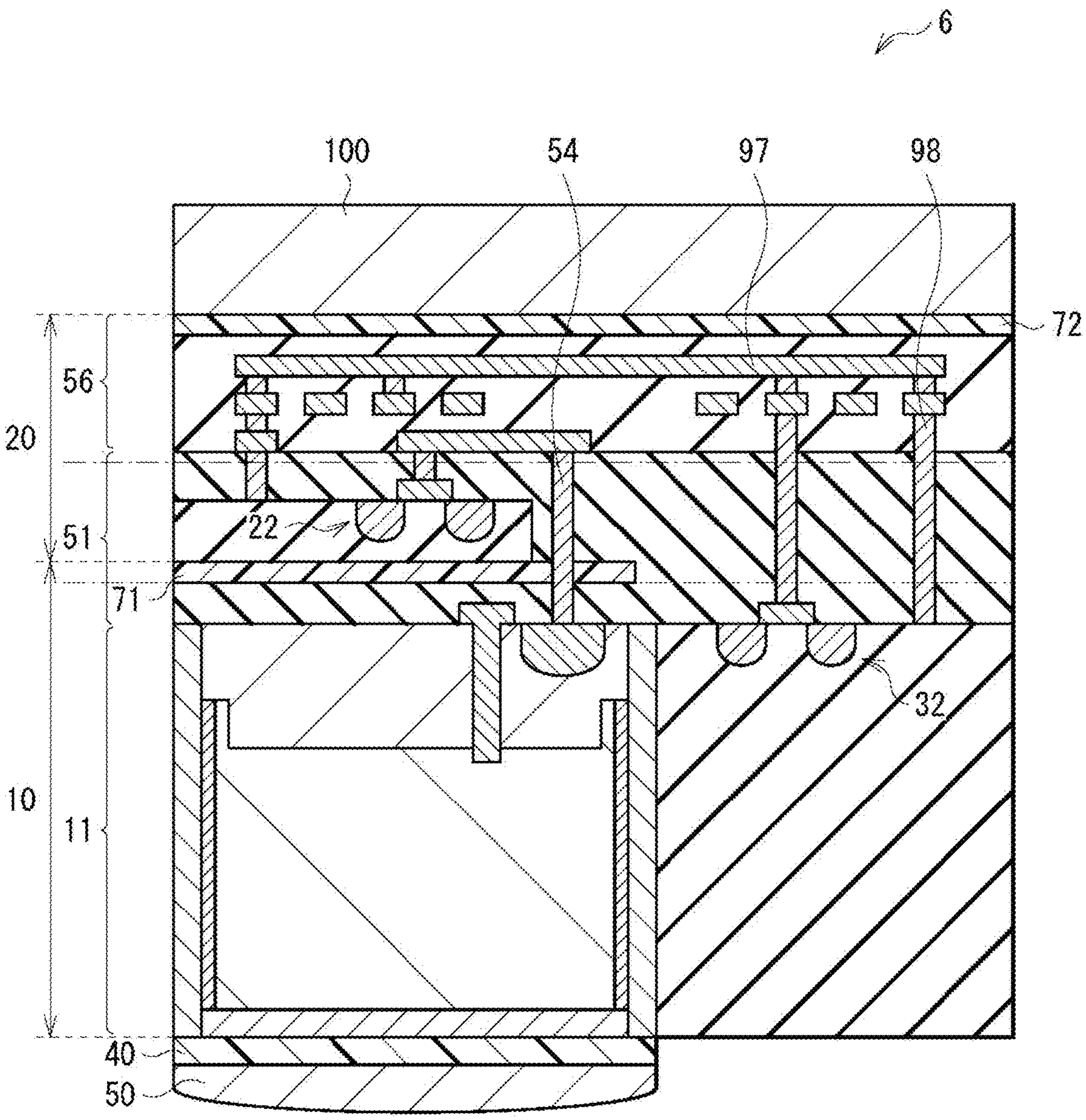

[ FIG. 21 ]
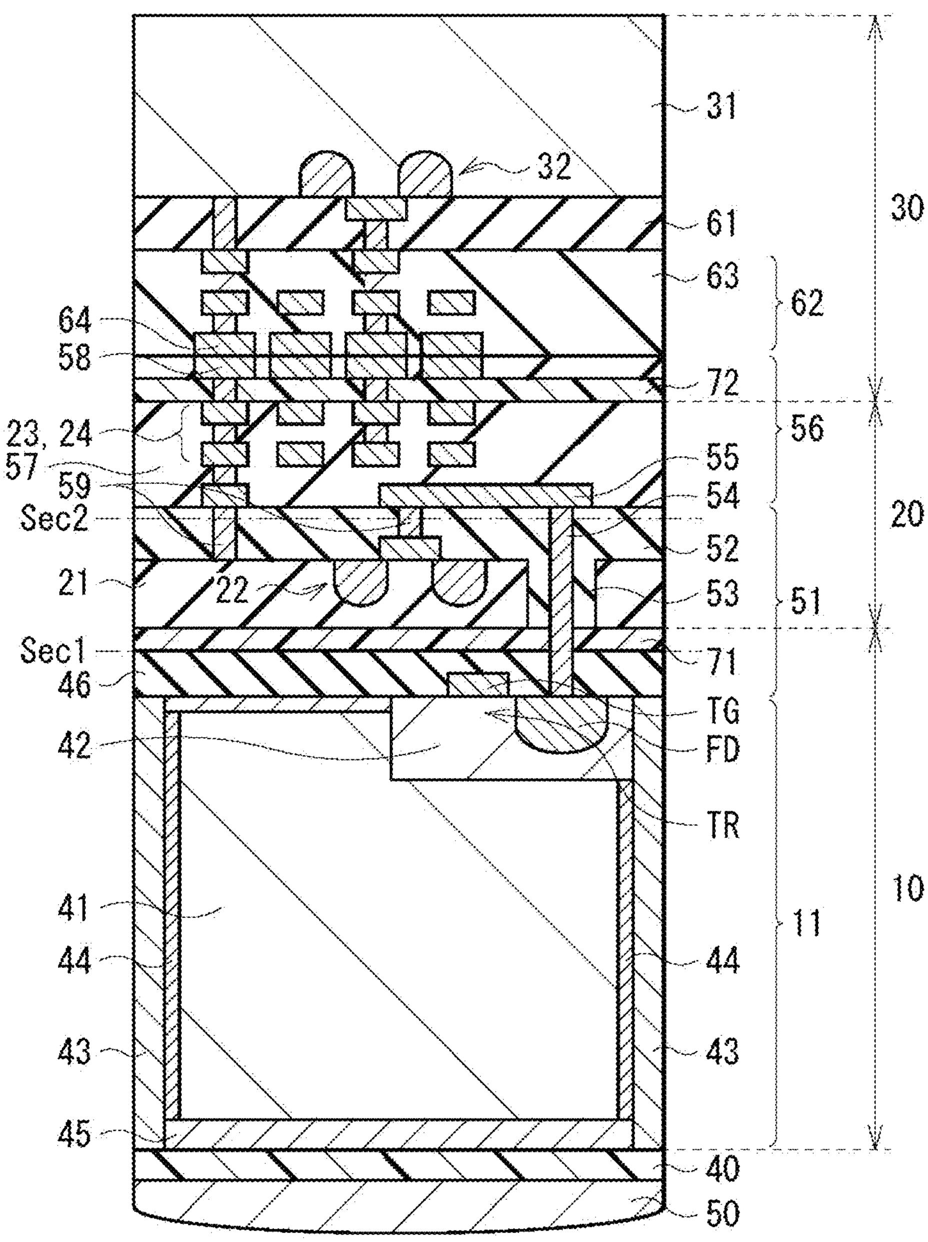

[ FIG. 22 ]
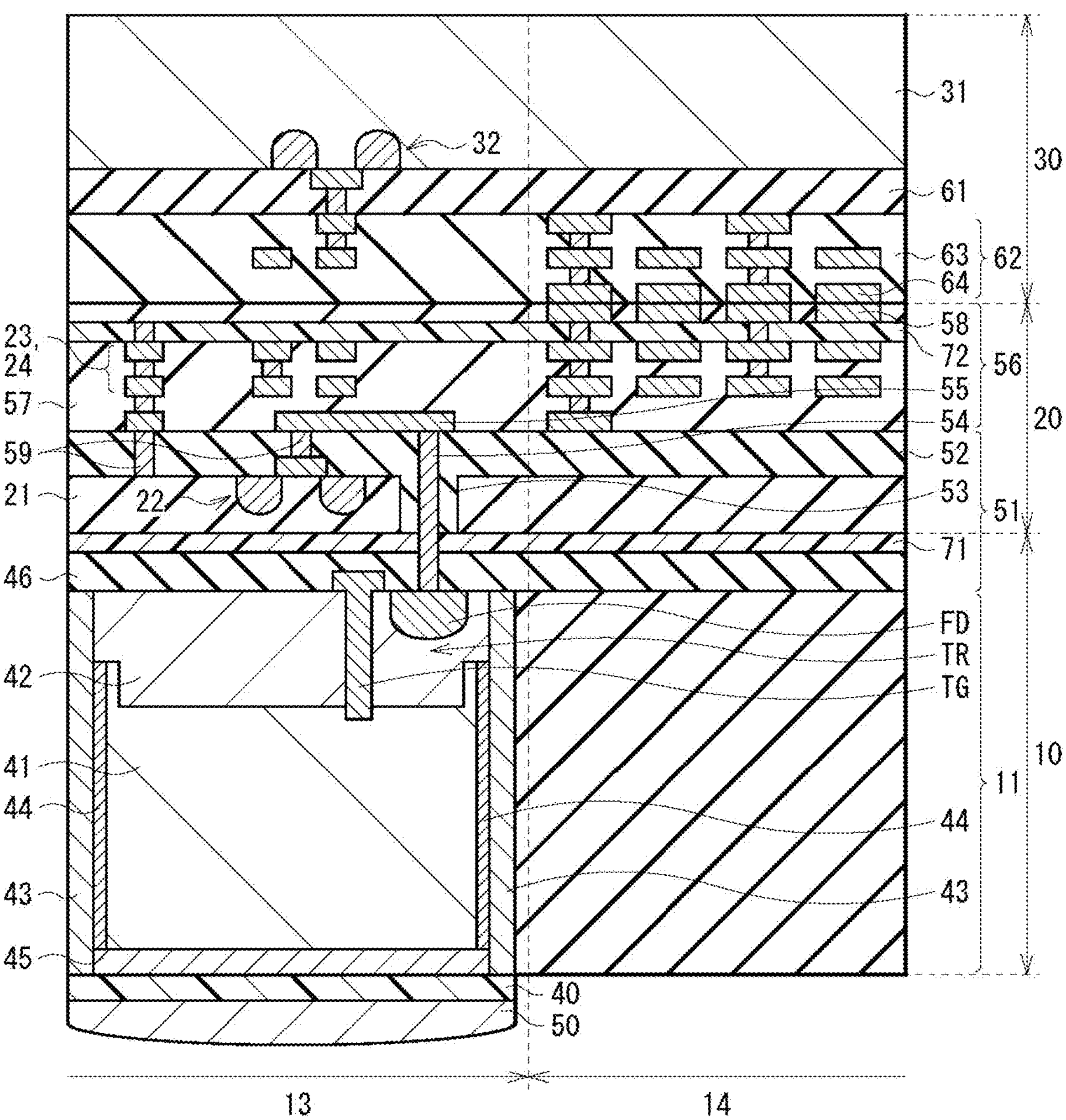

[ FIG. 23 ]
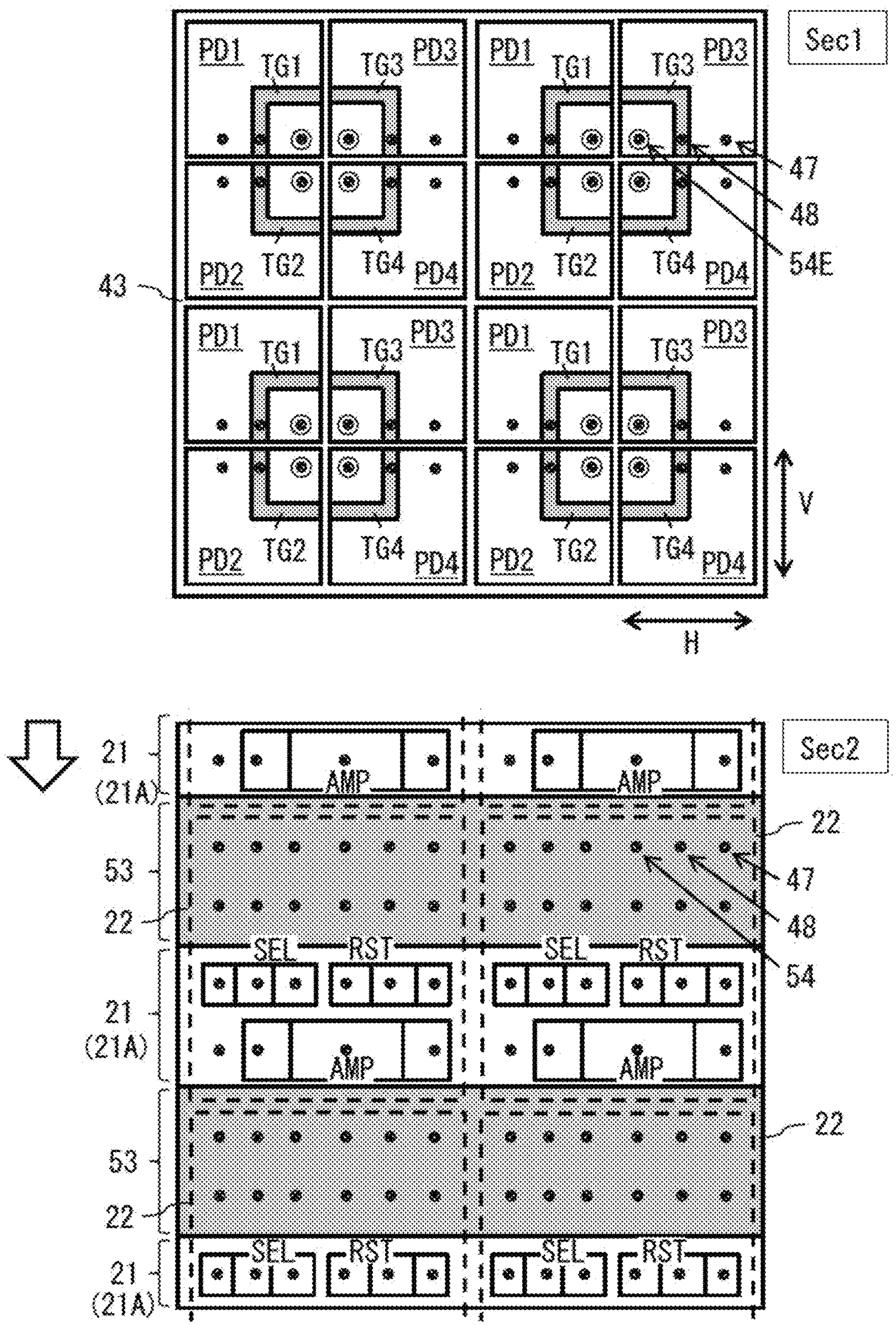

[ FIG. 24 ]
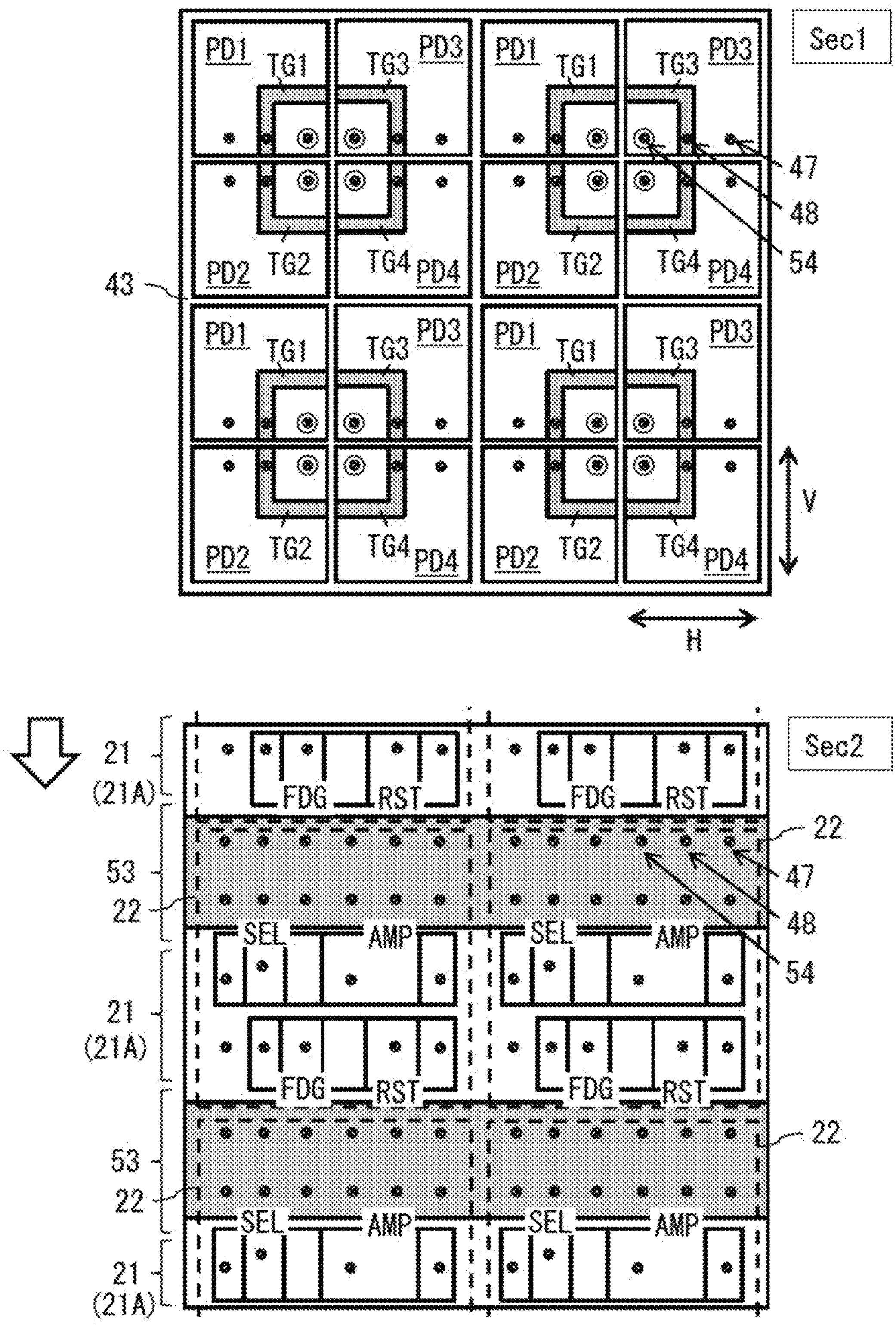

[ FIG. 25 ]
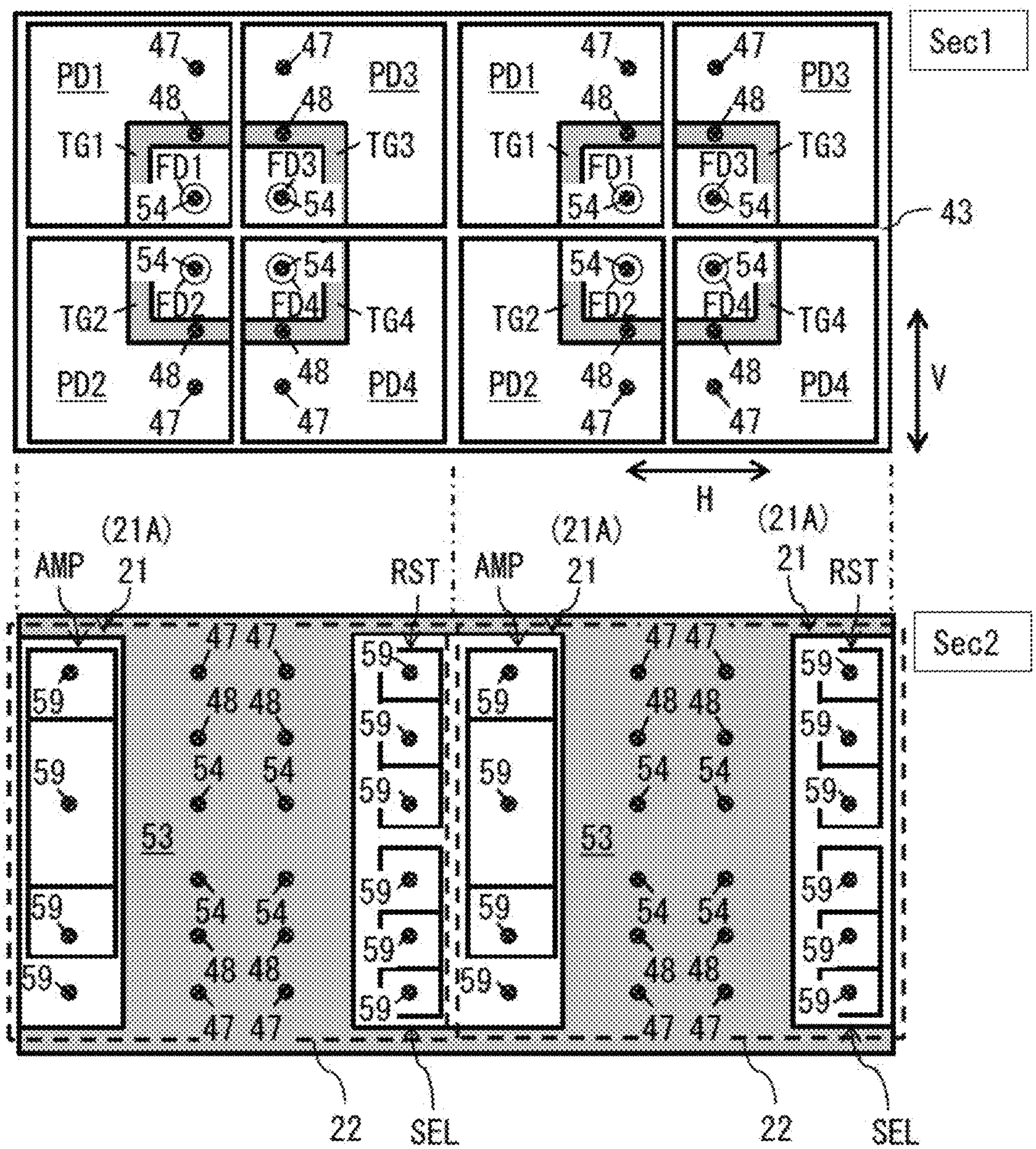

[ FIG. 26 ]
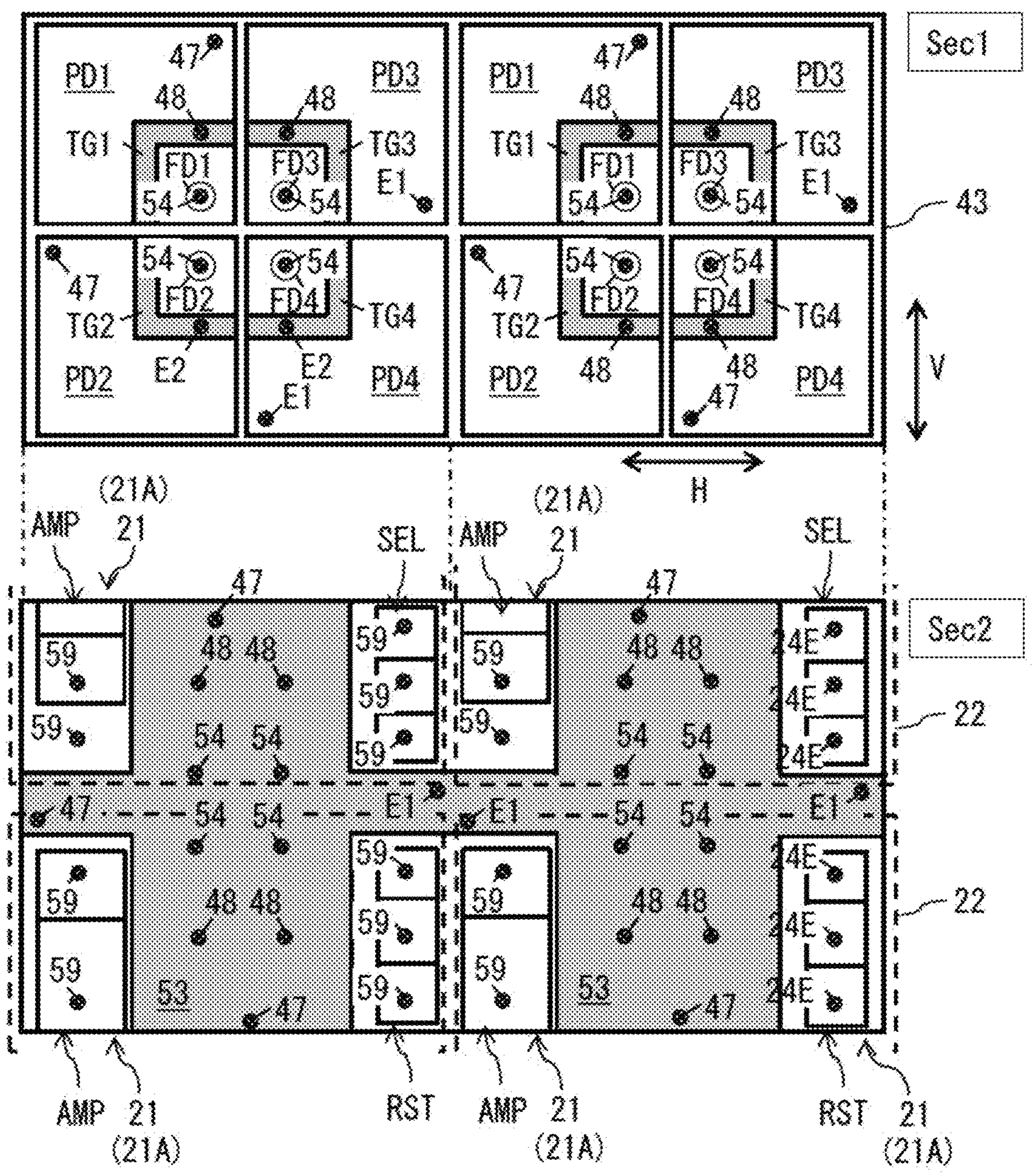

[ FIG. 27 ]
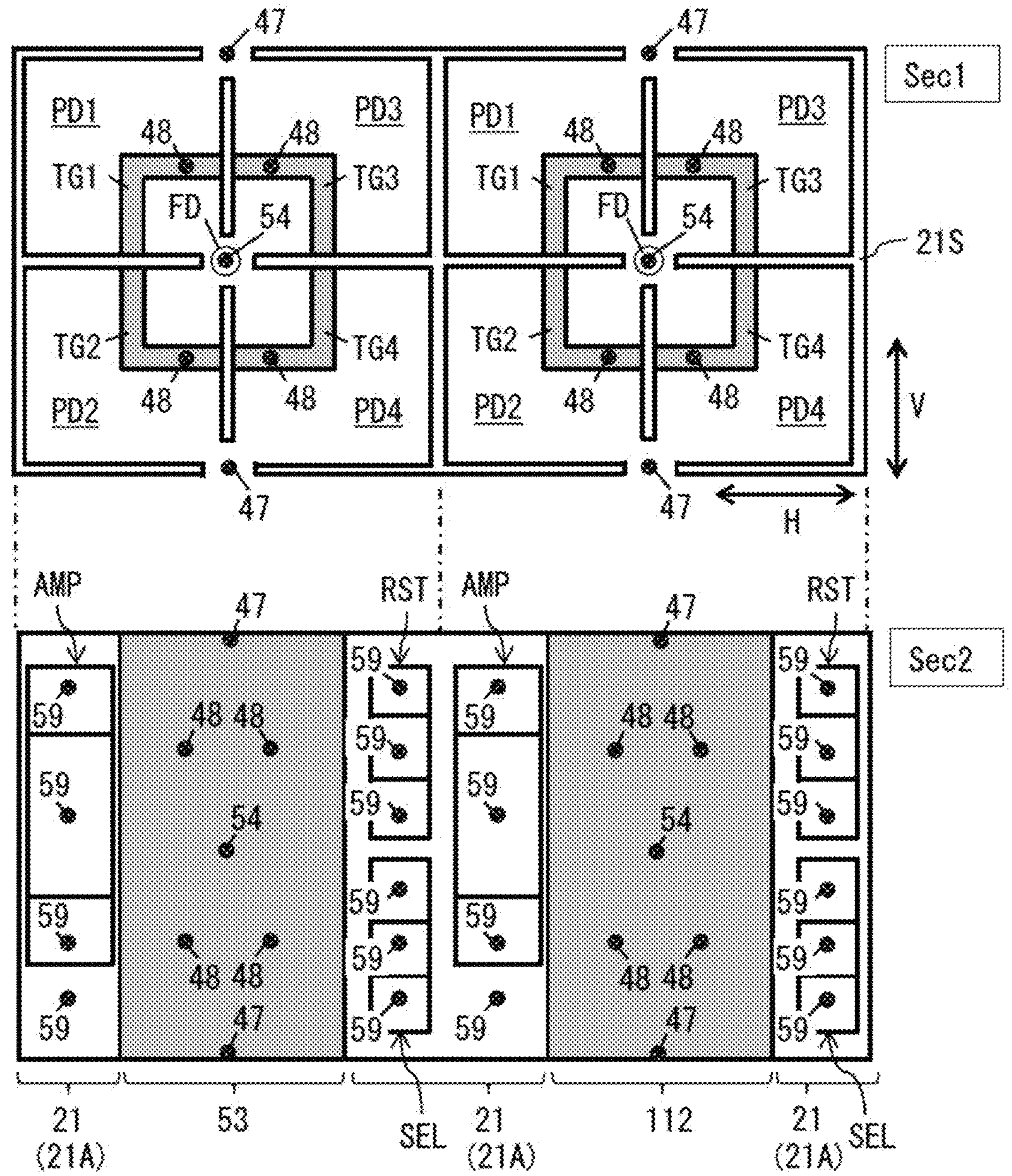

[ FIG. 28 ]
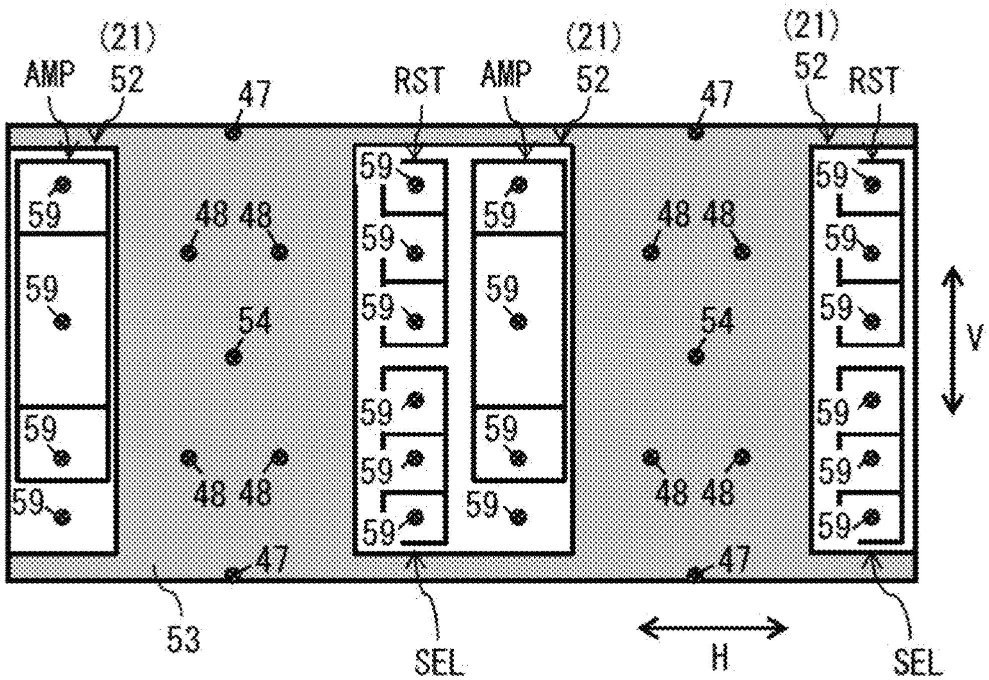
[ FIG. 29 ]
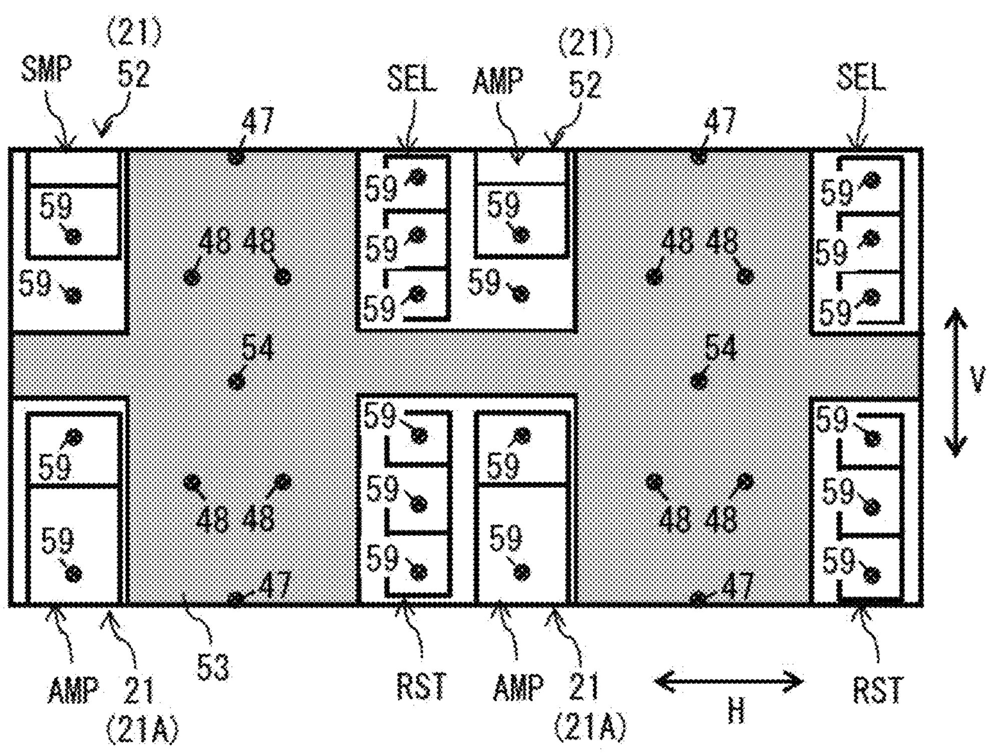

[ FIG. 30 ]
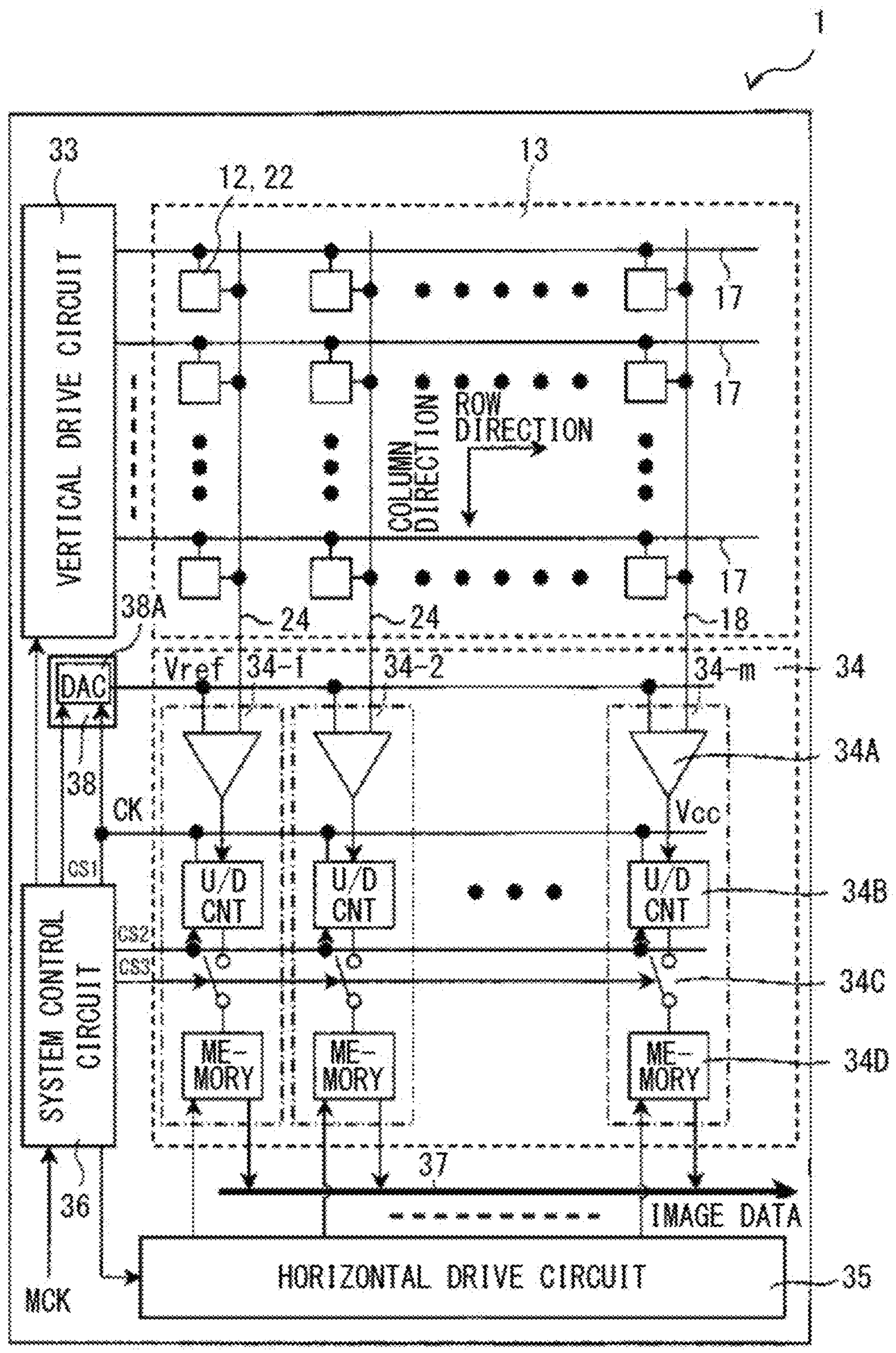

[ FIG. 31 ]
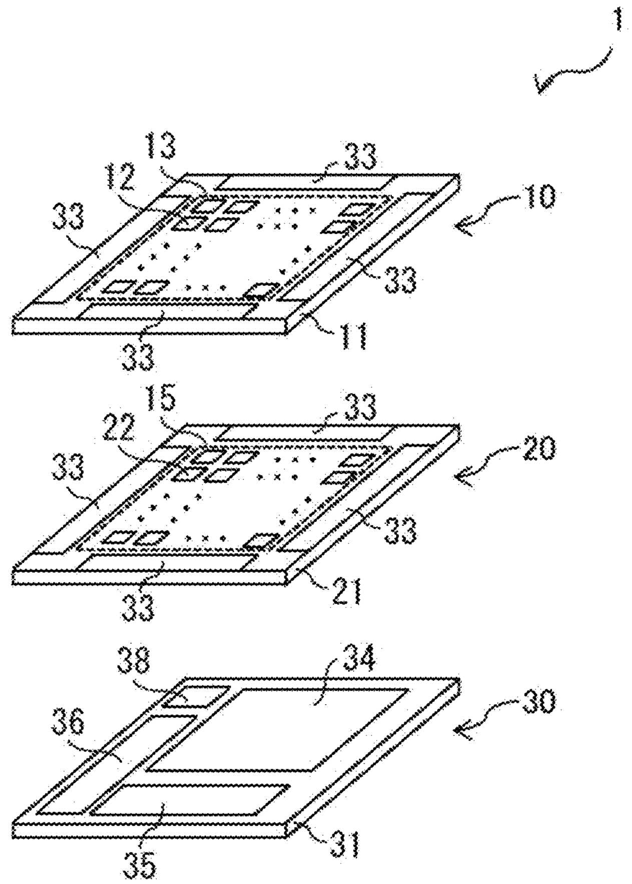
[ FIG. 32 ]
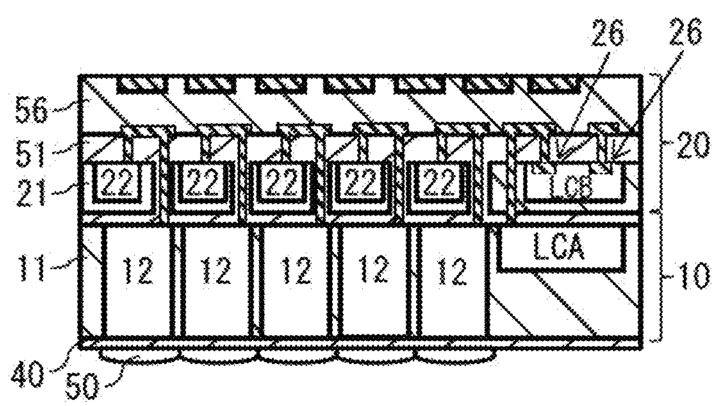

[ FIG. 33 ]
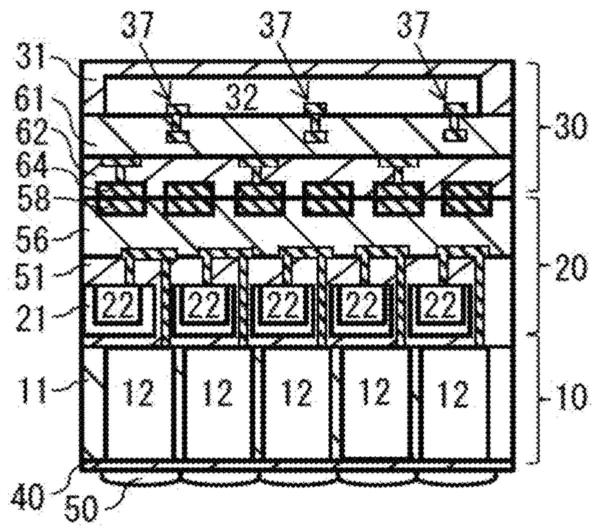

[ FIG. 34 ]
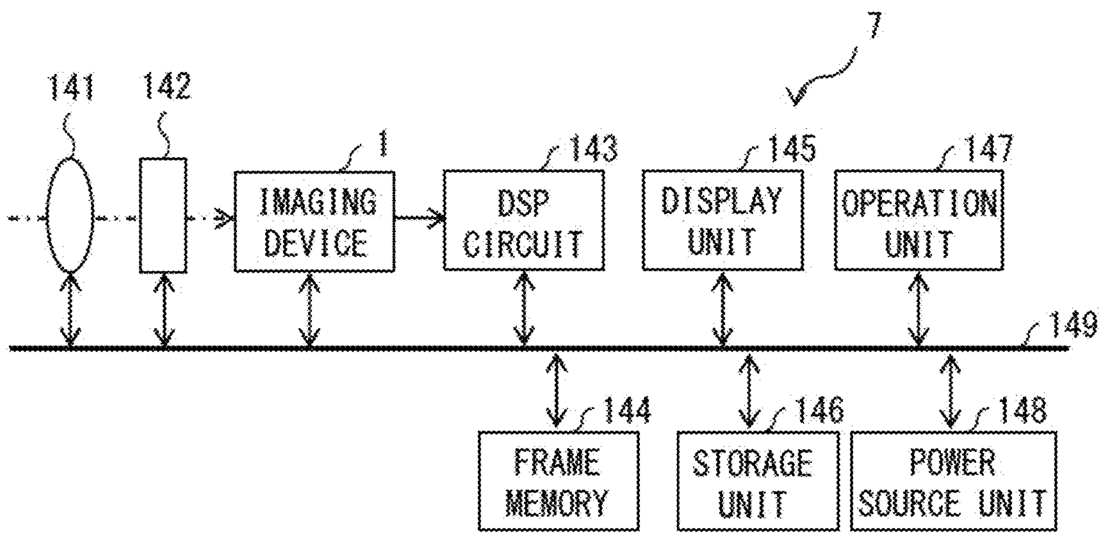
[ FIG. 35 ]
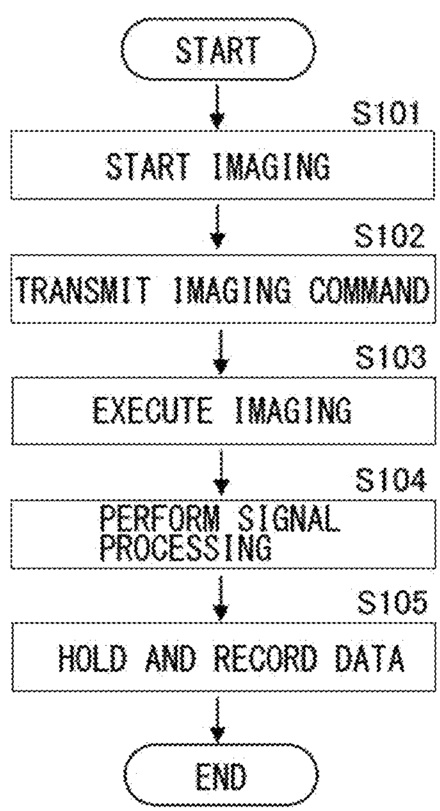

[ FIG. 36 ]
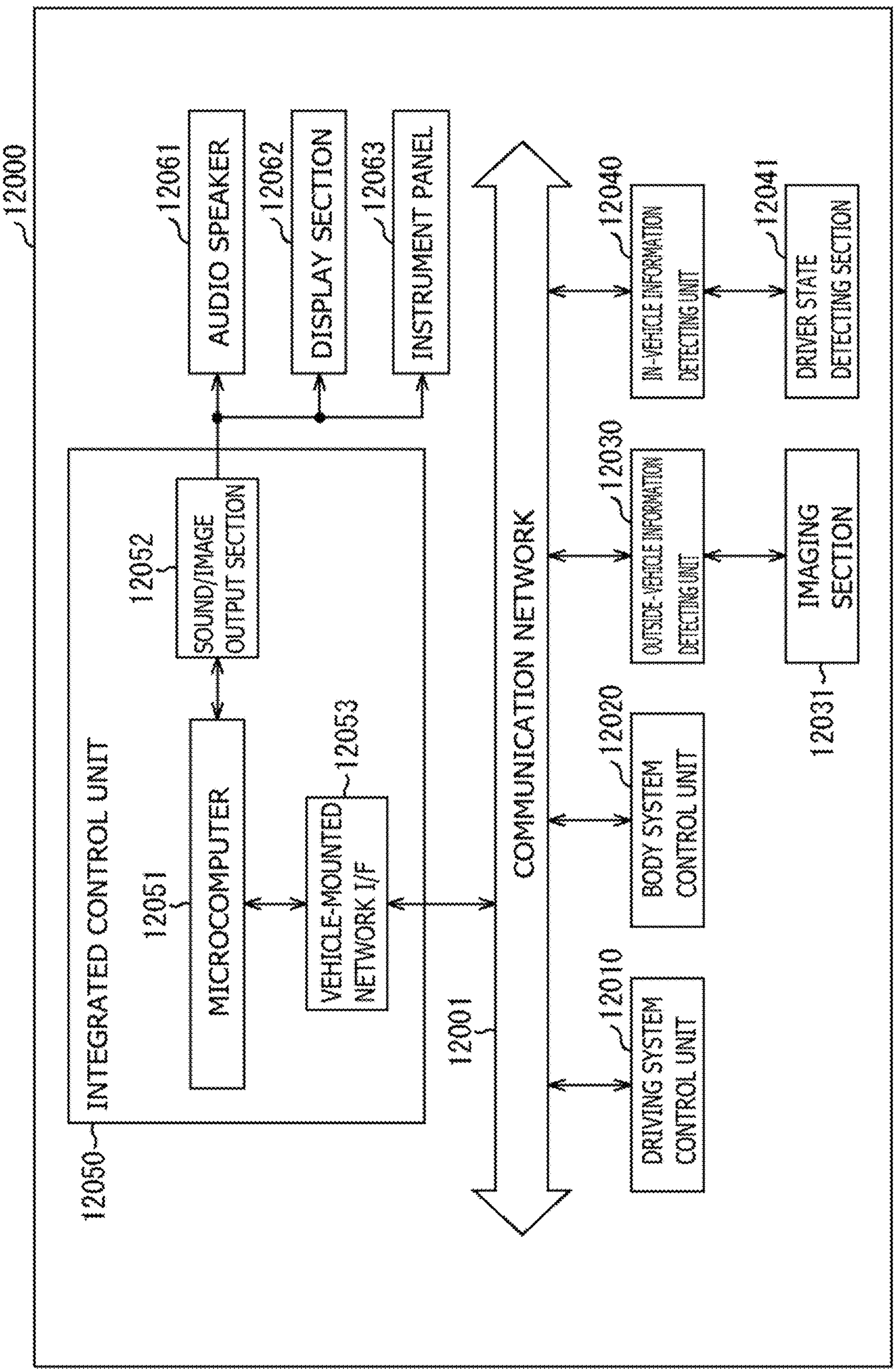

[ FIG. 37 ]
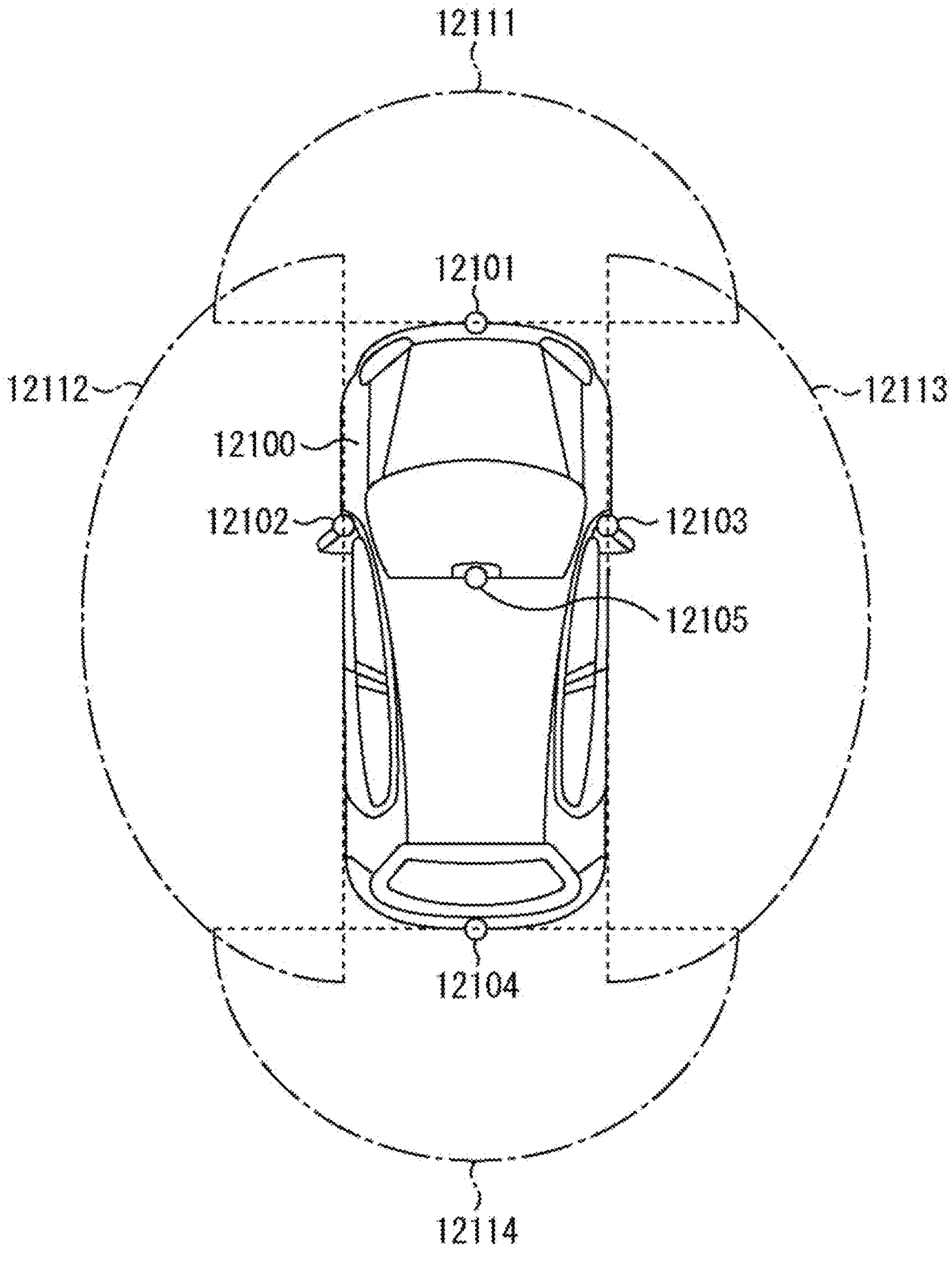

[ FIG. 38 ]
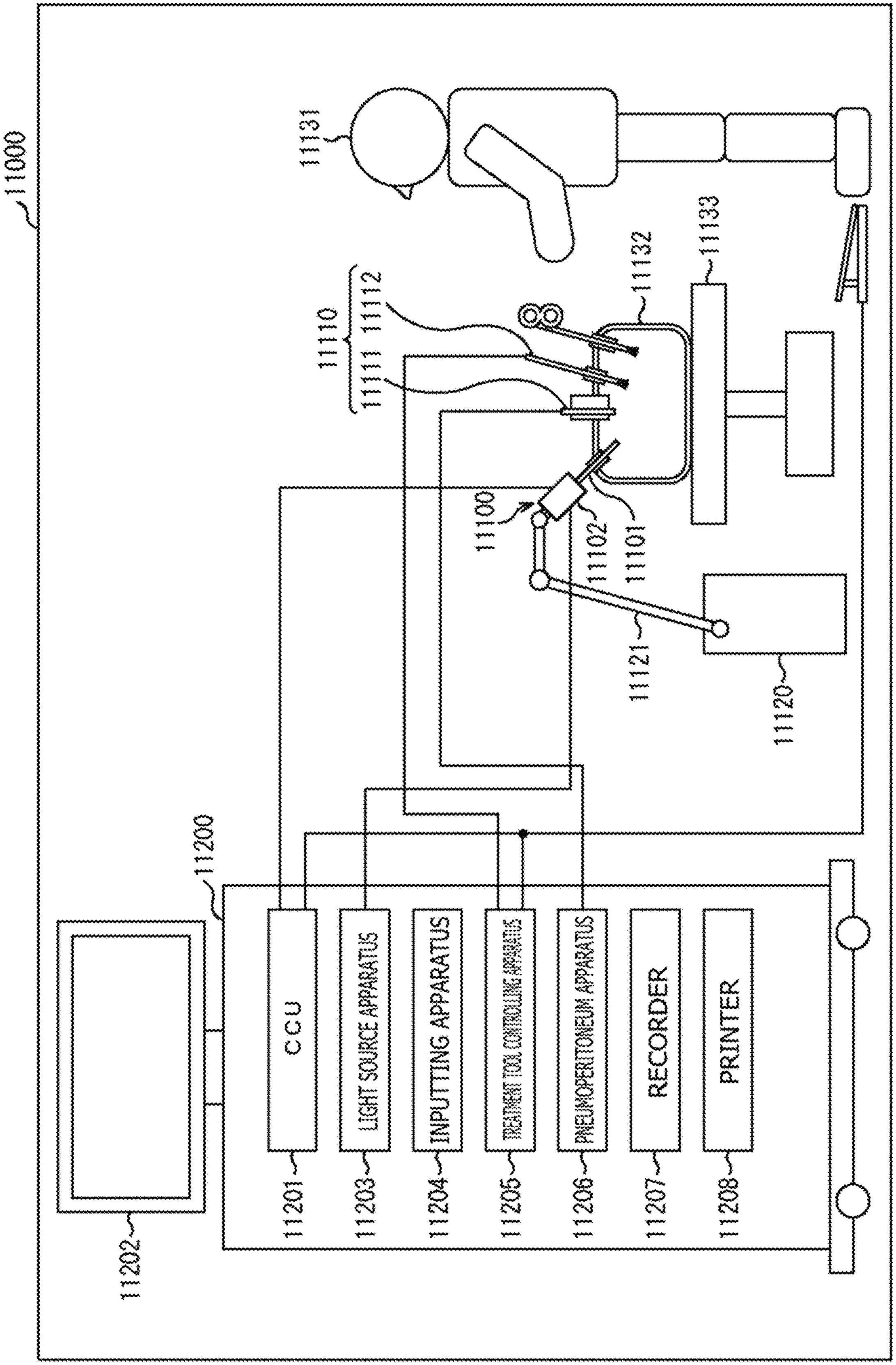

[ FIG. 39 ]
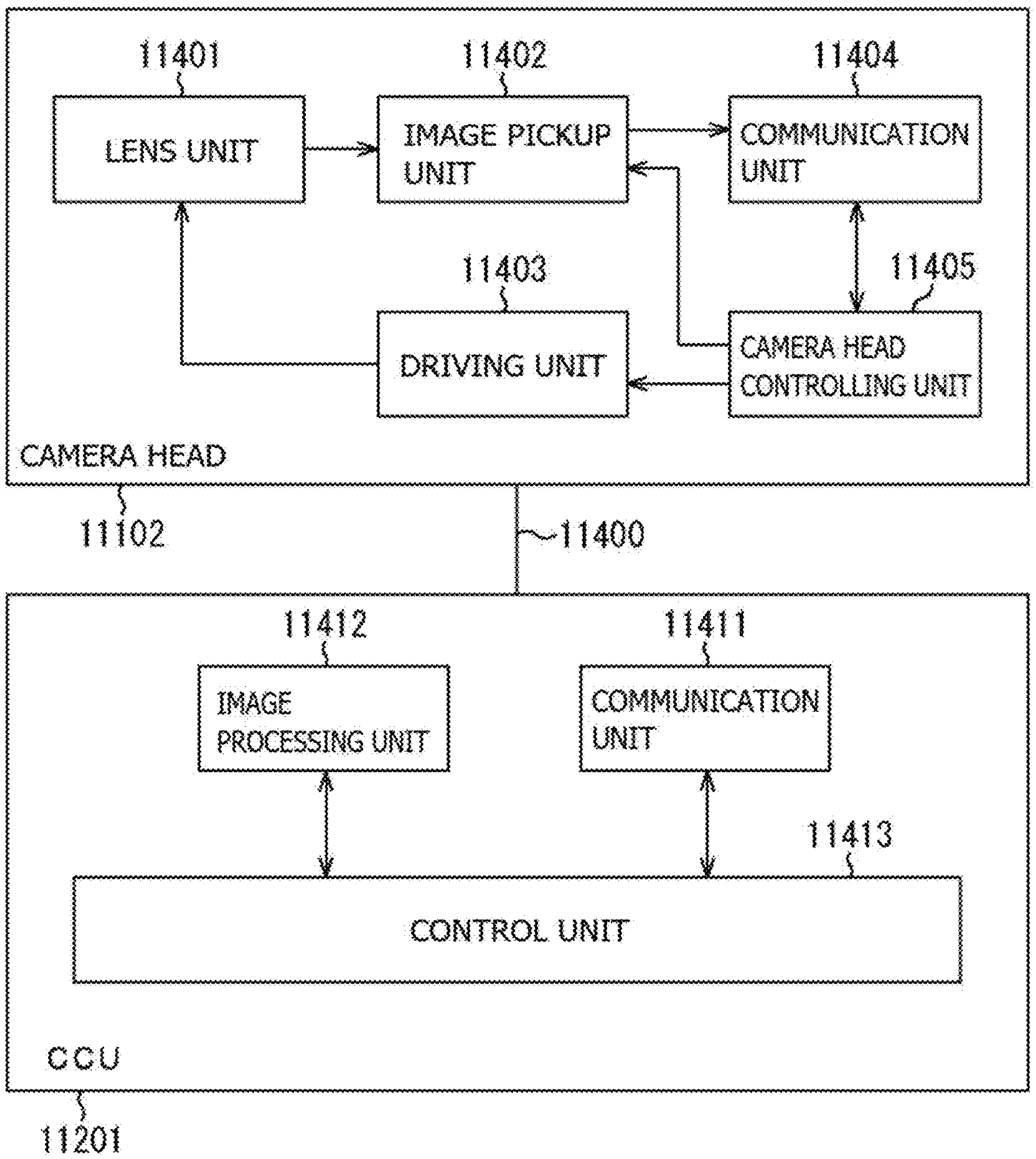

IMAGING DEVICE

TECHNICAL FIELD

The present disclosure relates to an imaging device having a three-dimensional structure.

BACKGROUND ART

Miniaturization of an area per pixel of an imaging device of a two-dimensional structure has heretofore been achieved by introduction of a miniaturization process and improvement in packaging density. In recent years, in order to achieve still smaller size of the imaging device and higher density of pixels, an imaging device of a three-dimensional structure has been developed. In the imaging device of the three-dimensional structure, for example, a semiconductor substrate including a plurality of sensor pixels and a semiconductor substrate including a signal processing circuit that processes a signal obtained in each sensor pixel are stacked on each other.

CITATION LIST

Patent Literature

PTL 1: Japanese Unexamined Patent Application Publication No. 2010-245506

SUMMARY OF THE INVENTION

Incidentally, in the imaging device, for the purpose of reducing a noise in a pixel transistor, which becomes a factor in degradation of image quality, for example, hydrogen atoms may be desorbed from a passivation film (SiN film) to supply hydrogen to the pixel transistor in some cases. However, in the imaging device having the above-described configuration, the hydrogen atoms desorbed from the SiN film are diffused to a semiconductor substrate including a plurality of sensor pixels. The hydrogen atoms may cause depinning of a photodiode PD configuring a sensor pixel, which may possibly result in degradation of imaging characteristics.

It is desirable to provide an imaging device that makes it possible to achieve both noise characteristics and photodiode characteristics.

An imaging device according to an embodiment of the present disclosure includes: a first substrate including, in a first semiconductor substrate, a sensor pixel that performs photoelectric conversion; a second substrate including, in a second semiconductor substrate, a readout circuit that outputs a pixel signal based on charges outputted from the sensor pixel, in which the second substrate is stacked on the first substrate; and a first hydrogen diffusion prevention layer provided between the first semiconductor substrate and the second semiconductor substrate.

In the imaging device according to an embodiment of the present disclosure, the hydrogen diffusion prevention layer (a first hydrogen diffusion prevention layer) is provided between the first semiconductor substrate and the second semiconductor substrate, in a stacked body in which the first substrate and the second substrate are stacked, the first substrate being provided with the first semiconductor substrate including the sensor pixel that performs photoelectric conversion, the second substrate being provided with the second semiconductor substrate including the readout circuit that outputs a pixel signal based on charges outputted from the sensor pixel. This allows hydrogen atoms to be selectively diffused to a desired region

BRIEF DESCRIPTION OF THE DRAWINGS

FIG. 1 illustrates an example of a cross-sectional configuration in a vertical direction of an imaging device according to a first embodiment of the present disclosure.

FIG. 2 illustrates an example of a schematic configuration of the imaging device illustrated in FIG. 1.

FIG. 3 illustrates an example of a sensor pixel and a readout circuit illustrated in FIG. 1.

FIG. 4 illustrates an example of the sensor pixel and the readout circuit illustrated in FIG. 1.

FIG. 5 illustrates an example of the sensor pixel and the readout circuit illustrated in FIG. 1.

FIG. 6 illustrates an example of the sensor pixel and the readout circuit illustrated in FIG. 1.

FIG. 7 illustrates an example of a coupling mode between a plurality of readout circuits and a plurality of vertical signal lines.

FIG. 8 illustrates another example of the cross-sectional configuration in the vertical direction of the imaging device according to the first embodiment of the present disclosure.

FIG. 9 illustrates an example of a cross-sectional configuration in a horizontal direction of the imaging device illustrated in FIG. 1.

FIG. 10 illustrates an example of the cross-sectional configuration in the horizontal direction of the imaging device illustrated in FIG. 1.

FIG. 11 illustrates an example of a wiring line layout in a horizontal plane of the imaging device illustrated in FIG. 1.

FIG. 12 illustrates an example of the wiring line layout in the horizontal plane of the imaging device illustrated in FIG. 1.

FIG. 13 illustrates an example of the wiring line layout in the horizontal plane of the imaging device illustrated in FIG. 1.

FIG. 14 illustrates an example of the wiring line layout in the horizontal plane of the imaging device illustrated in FIG. 1.

FIG. 15A illustrates an example of a manufacturing process of the imaging device illustrated in FIG. 1.

FIG. 15B illustrates an example of a manufacturing process subsequent to FIG. 15A.

FIG. 15C illustrates an example of a manufacturing process subsequent to FIG. 15B.

FIG. 15D illustrates an example of a manufacturing process subsequent to FIG. 15C.

FIG. 15E illustrates an example of a manufacturing process subsequent to FIG. 15D.

FIG. 15F illustrates an example of a manufacturing process subsequent to FIG. 15E.

FIG. 15G illustrates an example of a manufacturing process subsequent to FIG. 15F.

FIG. 15H illustrates an example of a manufacturing process subsequent to FIG. 15G.

FIG. 16 illustrates an example of a cross-sectional configuration in the vertical direction of an imaging device according to a second embodiment of the present disclosure.

FIG. 17 illustrates an example of a cross-sectional configuration in the vertical direction of an imaging device according to a third embodiment of the present disclosure.

FIG. 18 illustrates an example of a cross-sectional configuration in the vertical direction of an imaging device according to a fourth embodiment of the present disclosure.

FIG. 19 illustrates an example of a cross-sectional configuration in the vertical direction of an imaging device according to a fifth embodiment of the present disclosure.

FIG. 20 illustrates another example of the cross-sectional configuration in the vertical direction of the imaging device according to the fifth embodiment of the present disclosure.

FIG. 21 illustrates an example of a cross-sectional configuration in the vertical direction of an imaging device according to Modification Example 1 of the present disclosure.

FIG. 22 illustrates an example of a cross-sectional configuration in the vertical direction of an imaging device according to Modification Example 2 of the present disclosure.

FIG. 23 illustrates an example of a cross-sectional configuration in the horizontal direction of an imaging device according to Modification Example 3 of the present disclosure.

FIG. 24 illustrates another example of the cross-sectional configuration in the horizontal direction of the imaging device according to Modification Example 3 of the present disclosure.

FIG. 25 illustrates an example of a cross-sectional configuration in the horizontal direction of an imaging device according to Modification Example 4 of the present disclosure.

FIG. 26 illustrates an example of a cross-sectional configuration in the horizontal direction of an imaging device according to Modification Example 5 of the present disclosure.

FIG. 27 illustrates an example of a cross-sectional configuration in the horizontal direction of an imaging device according to Modification Example 6 of the present disclosure.

FIG. 28 illustrates another example of the cross-sectional configuration in the horizontal direction of the imaging device according to Modification Example 6 of the present disclosure.

FIG. 29 illustrates another example of the cross-sectional configuration in the horizontal direction of the imaging device according to Modification Example 6 of the present disclosure.

FIG. 30 illustrates an example of a circuit configuration of an imaging device according to Modification Example 7 of the present disclosure.

FIG. 31 illustrates an example of a configuration of the imaging device of FIG. 30 according to Modification Example 8, in which three substrates are stacked.

FIG. 32 illustrates an example according to Modification Example 9 of the present disclosure, in which a logic circuit is formed separately in a substrate including the sensor pixel and a substrate including the readout circuit.

FIG. 33 illustrates an example according to Modification Example 10 of the present disclosure, in which a logic circuit is formed in a third substrate.

FIG. 34 illustrates an example of a schematic configuration of an imaging system including the imaging device according to any of the foregoing first to fifth embodiments and Modification Examples 1 to 10 thereof.

FIG. 35 illustrates an example of an imaging procedure in the imaging system of FIG. 34.

FIG. 36 is a block diagram depicting an example of schematic configuration of a vehicle control system.

FIG. 37 is a diagram of assistance in explaining an example of installation positions of an outside-vehicle information detecting section and an imaging section.

FIG. 38 is a view depicting an example of a schematic configuration of an endoscopic surgery system.

FIG. 39 is a block diagram depicting an example of a functional configuration of a camera head and a camera control unit (CCU).

MODES FOR CARRYING OUT THE INVENTION

Hereinafter, description is given in detail of an embodiment of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. First Embodiment (An example in which a hydrogen diffusion prevention layer is provided between a first semiconductor substrate and a second semiconductor substrate)
    - 1-1. Configuration of Imaging Device
    - 1-2. Manufacturing Method of Imaging Device
    - 1-3. Workings and Effects
2. Second Embodiment (An example in which a pixel array section and a logic circuit are coupled using TCV)
3. Third Embodiment (An example of being provided with an organic photoelectric conversion section and further including a hydrogen diffusion prevention layer between a first semiconductor substrate and the organic photoelectric conversion section)
4. Fourth embodiment (An example in which a substrate having a memory is further stacked)
5. Fifth embodiment (An example in which a logic circuit is provided in a first substrate including a sensor pixel)
6. Modification Examples
    - 6-1. Modification Example 1 (An example of using a planar TG)
    - 6-2. Modification Example 2 (An example of using Cu—Cu junction at a panel outer edge)
    - 6-3. Modification Example 3 (An example in which an offset is provided between a sensor pixel and a readout circuit)
    - 6-4. Modification Example 4 (An example in which a silicon substrate provided with a readout circuit has an island shape)
    - 6-5. Modification Example 5 (An example in which a silicon substrate provided with a readout circuit has an island shape)
    - 6-6. Modification Example 6 (An example in which an FD is shared by four sensor pixels)
    - 6-7. Modification Example 7 (An example in which a column signal processing circuit is configured by a typical column ADC circuit)
    - 6-8. Modification Example 8 (An example in which an imaging device is configured by stacking three substrates)
    - 6-9. Modification Example 9 (An example in which with a logic circuit is provided in a first substrate and a second substrate)

6-10. Modification Example 10 (An example in which a logic circuit is provided in a third substrate)
7. Application example
8. Practical Application Examples

1. FIRST EMBODIMENT

FIG. 1 illustrates an example of a cross-sectional configuration in a vertical direction of an imaging device (an imaging device 1) according to a first embodiment of the present disclosure. FIG. 2 illustrates an example of a schematic configuration of the imaging device 1 illustrated in FIG. 1. The imaging device 1 is an imaging device having a three-dimensional structure, in which a first substrate 10, which includes a sensor pixel 12 that performs photoelectric conversion in a semiconductor substrate 11, and a second substrate 20, which includes a readout circuit 22 that outputs an image signal based on charges outputted from the sensor pixel 12 in a semiconductor substrate 21, are stacked. The imaging device 1 of the present embodiment is provided with a hydrogen diffusion prevention layer 71 (a first hydrogen diffusion prevention layer) between the semiconductor substrate 11 and the semiconductor substrate 21 in a stacked body of the first substrate 10 and the second substrate 20.

1-1. Configuration of Imaging Device

In the imaging device 1, three substrates (the first substrate 10, the second substrate 20, and a third substrate 30) are stacked in this order.

As described above, the first substrate 10 includes, in the semiconductor substrate 11, a plurality of sensor pixels 12 performing photoelectric conversion. The semiconductor substrate 11 corresponds to a specific example of a "first semiconductor substrate" of the present disclosure. The plurality of sensor pixels 12 are provided in matrix inside a pixel region 13 in the first substrate 10. The second substrate 20 includes, in the semiconductor substrate 21, readout circuits 22, which each output a pixel signal based on charges outputted from the sensor pixels 12, with each one provided for every four sensor pixels 12. The semiconductor substrate 21 corresponds to a specific example of a "second semiconductor substrate" of the present disclosure. The second substrate 20 includes a plurality of pixel drive lines 23 extending in a row direction and a plurality of vertical signal lines 24 extending in a column direction. The third substrate 30 includes, in a semiconductor substrate 31, a logic circuit 32 that processes the pixel signal. The semiconductor substrate 31 corresponds to a specific example of a "third semiconductor substrate" of the present disclosure. The logic circuit 32 includes, for example, a vertical drive circuit 33, a column signal processing circuit 34, a horizontal drive circuit 35, and a system control circuit 36. The logic circuit 32 (specifically, the horizontal drive circuit 35) outputs an output-voltage Vout for each sensor pixel 12 to the outside. In the logic circuit 32, for example, a low-resistance region configured by silicide formed using Salicide (Self Aligned Silicide) process such as $CoSi_2$ and NiSi may be formed on a front surface of an impurity diffusion region in contact with a source electrode and a drain electrode.

The vertical drive circuit 33 sequentially selects, for example, the plurality of sensor pixels 12 in a unit of row. The column signal processing circuit 34 performs, for example, correlated double sampling (Correlated Double Sampling: CDS) processing on a pixel signal outputted from each sensor pixel 12 of a row selected by the vertical drive circuit 33. The column signal processing circuit 34 performs, for example, the CDS processing to thereby extract a signal level of the pixel signal and to hold pixel data corresponding to an amount of light reception of each sensor pixel 12. The horizontal drive circuit 35 sequentially outputs, for example, the pixel data held in the column signal processing circuit 34 to the outside. The system control circuit 36 controls, for example, driving of each of the blocks (the vertical drive circuit 33, the column signal processing circuit 34, and the horizontal drive circuit 35) inside the logic circuit 32.

FIG. 3 illustrates an example of the sensor pixel 12 and the readout circuit 22. Hereinafter, description is given of a case where four sensor pixels 12 share one readout circuit 22 as illustrated in FIG. 3. Here, the "share" refers to outputs of the four sensor pixels 12 being inputted to the common readout circuit 22.

Each sensor pixel 12 includes mutually common components. In FIG. 3, in order to distinguish components of the sensor pixels 12 from one another, an identification number (1, 2, 3, or 4) is assigned at the end of a symbol of the component of each sensor pixel 12. Hereinafter, in a case where the components of the respective sensor pixels 12 need to be distinguished from one another, the identification number is assigned to the end of the symbol of the component of each sensor pixel 12; however, in a case where the components of the respective sensor pixels 12 do not need to be distinguished from one another, the identification number at the end of the symbol of the component of each sensor pixel 12 is omitted.

Each sensor pixel 12 includes, for example, a photodiode PD, a transfer transistor TR electrically coupled to the photodiode PD, and a floating diffusion FD that temporarily holds charges outputted from the photodiode PD via the transfer transistor TR. The photodiode PD corresponds to a specific example of a "photoelectric conversion element" of the present disclosure. The photodiode PD performs photoelectric conversion to generate charges corresponding to an amount of light reception. A cathode of the photodiode PD is electrically coupled to a source of the transfer transistor TR, and an anode of the photodiode PD is electrically coupled to a reference potential line (e.g., ground). A drain of the transfer transistor TR is electrically coupled to the floating diffusion FD, and a gate of the transfer transistor TR is electrically coupled to the pixel drive line 23. The transfer transistor TR is, for example, a CMOS (Complementary Metal Oxide Semiconductor) transistor.

The floating diffusions FD of the respective sensor pixels 12 sharing the one readout circuit 22 are electrically coupled to one another and are electrically coupled to an input end of the common readout circuit 22. The readout circuit 22 includes, for example, a reset transistor RST, a selection transistor SEL, and an amplification transistor AMP. It is to be noted that the selection transistor SEL may be omitted as needed. A source of the reset transistor RST (an input end of the readout circuit 22) is electrically coupled to the floating diffusion FD, and a drain of the reset transistor RST is electrically coupled to a power source line VDD and a drain of the amplification transistor AMP. A gate of the reset transistor RST is electrically coupled to the pixel drive line 23 (see FIG. 2). A source of the amplification transistor AMP is electrically coupled to a drain of the selection transistor SEL, and a gate of the amplification transistor AMP is electrically coupled to the source of the reset transistor RST. A source of the selection transistor SEL (an output end of the readout circuit 22) is electrically coupled to the vertical signal line 24, and a gate of the selection transistor SEL is electrically coupled to the pixel drive line 23 (see FIG. 2).

When the transfer transistor TR is brought into an ON state, the transfer transistor TR transfers charges of the photodiode PD to the floating diffusion FD. The gate (a transfer gate TG) of the transfer transistor TR extends to penetrate a p-well layer 42 from a front surface of the semiconductor substrate 11 to such a depth as to reach a PD 41, for example, as illustrated in FIG. 1. The reset transistor RST resets an electric potential of the floating diffusion FD to a predetermined electric potential. When the reset transistor RST is brought into an ON state, the electric potential of the floating diffusion FD is reset to an electric potential of the power source line VDD. The selection transistor SEL controls an output timing of the pixel signal from the readout circuit 22. The amplification transistor AMP generates, as a pixel signal, a signal of a voltage corresponding to a level of charges held in the floating diffusion FD. The amplification transistor AMP configures a source-follower type amplifier, and output a pixel signal of a voltage corresponding to a level of charges generated in the photodiode PD. When the selection transistor SEL is brought into an ON state, the amplification transistor AMP amplifies an electric potential of the floating diffusion FD, and outputs a voltage corresponding to the electric potential to the column signal processing circuit 34 via the vertical signal line 24. The reset transistor RST, the amplification transistor AMP, and the selection transistor SEL are each, for example, a CMOS transistor.

It is to be noted that, as illustrated in FIG. 4, the selection transistor SEL may be provided between the power source line VDD and the amplification transistor AMP. In this case, the drain of the reset transistor RST is electrically coupled to the power source line VDD and the drain of the selection transistor SEL. The source of the selection transistor SEL is electrically coupled to the drain of the amplification transistor AMP, and the gate of the selection transistor SEL is electrically coupled to the pixel drive line 23 (see FIG. 2). The source of the amplification transistor AMP (an output end of the readout circuit 22) is electrically coupled to the vertical signal line 24, and the gate of the amplification transistor AMP is electrically coupled to the source of the reset transistor RST. In addition, as illustrated in FIGS. 5 and 6, an FD transfer transistor FDG may be provided between the source of the reset transistor RST and the gate of the amplification transistor AMP.

The FD transfer transistor FDG is used when switching a conversion efficiency. In general, a pixel signal is small when shooting in a dark place. When performing charge-voltage conversion on a basis of Q=CV, larger capacity of the floating diffusion FD (FD capacity C) causes the value V to be smaller upon conversion to a voltage at the amplification transistor AMP. Meanwhile, the pixel signal becomes large in a bright place; it is therefore not possible, for the floating diffusion FD, to receive the charges of the photodiode PD unless the FD capacity C is large. Further, the FD capacity C needs to be large to allow the value V not to be too large (in other words, to be small) upon the conversion to a voltage at the amplification transistor AMP. Taking these into account, when the FD transfer transistor FDG is turned ON, a gate capacity for the FD transfer transistor FDG is increased, thus causing the entire FD capacity C to be large. Meanwhile, when the FD transfer transistor FDG is turned off, the entire FD capacity C becomes small. In this manner, performing ON/OFF switching of the FD transfer transistor FDG enables the FD capacity C to be variable, thus making it possible to switch the conversion efficiency.

FIG. 7 illustrates an example of a coupling mode between a plurality of readout circuits 22 and the plurality of vertical signal lines 24. In a case where the plurality of readout circuits 22 are arranged side by side in a direction in which the vertical signal lines 24 extend (e.g., column direction), the plurality of vertical signal lines 24 may be assigned one by one for the respective readout circuits 22. For example, as illustrated in FIG. 7, in a case where four readout circuits 22 are arranged side by side in the direction in which the vertical signal lines 24 extend (e.g., column direction), four vertical signal lines 24 may be assigned one by one for the respective readout circuits 22. It is to be noted that, in FIG. 7, in order to distinguish the vertical signal lines 24, the identification number (1, 2, 3, or 4) is assigned to the end of the symbol of each vertical signal line 24.

Next, description is given of a cross-sectional configuration in the vertical direction of the imaging device 1 with reference to FIG. 1. As described above, the imaging device 1 has a configuration, in which the first substrate 10, the second substrate 20, and the third substrate 30 are stacked in this order, and further includes a color filter 40 and a light-receiving lens 50 on side of a back surface (light incident surface) of the first substrate 10. The color filter 40 and the light-receiving lens 50 are each provided one by one for each sensor pixel 12, for example. That is, the imaging device 1 is a backside illumination type imaging device.

The first substrate 10 has a configuration in which an insulating layer 46 is stacked on a front surface (a surface 11S1, one surface) of the semiconductor substrate 11. The first substrate 10 includes the insulating layer 46 as a portion of an interlayer insulating film 51. The insulating layer 46 is provided between the semiconductor substrate 11 and the semiconductor substrate 21 described later. The semiconductor substrate 11 is configured by a silicon substrate. The semiconductor substrate 11 includes, for example, the p-well layer 42 in a portion of the front surface and in the vicinity thereof, and includes the PD 41 of an electric conductivity type different from that of the p-well layer 42 in another region (a region deeper than the p-well layer 42). The p-well layer 42 is configured by a p-type semiconductor region. The PD 41 is configured by a semiconductor region of an electric conductivity type (specifically, n-type) different from that of the p-well layer 42. The semiconductor substrate 11 includes, inside the p-well layer 42, the floating diffusion FD as the semiconductor region of an electric conductivity type (specifically, n-type) different from that of the p-well layer 42.

In the present embodiment, the first substrate 10 further includes the hydrogen diffusion prevention layer 71 on the insulating layer 46. For example, the hydrogen diffusion prevention layer 71 serves to prevent diffusion of hydrogen atoms diffused from a hydrogen supplying layer 72 described later to the semiconductor substrate 11. Specifically, the hydrogen diffusion prevention layer 71 physically separates the photodiode PD configuring the sensor pixel 12 and a pixel transistor such as the reset transistor RST, the selection transistor SEL and the amplification transistor AMP provided in the second substrate 20 from each other. Providing the hydrogen diffusion prevention layer 71 suppresses deactivation of boron (B) due to hydrogen in a P-type layer that is formed by doping of an acceptor such as B on a surface of the photodiode PD, thus suppressing occurrence of pinning. The hydrogen diffusion prevention layer 71 is preferably formed by, for example, a silicon nitride film having a film density in a range from 2.7 g/cm to 3.5 g/cm. A film having a high film density as described above may be formed by using LP-CVD (low pressure-chemical vapor deposition), for example. The hydrogen diffusion prevention layer 71 has a film thickness in the vertical direction (hereinafter, simply referred to as thickness), for example, in a range preferably from 10 nm to 200 nm, and more preferably from 50 nm to 100 nm. FIG. 1 exemplifies the case where the hydrogen diffusion prevention layer 71 is provided at a position, on the insulating layer 46, in contact with the semiconductor substrate 21; however, this is not limitative. The hydrogen diffusion prevention layer 71 may be provided, for example, immediately above the semiconductor substrate 11 (between the semiconductor substrate 21 and the insulating layer 46 in FIG. 1). In such a case, the formation may be made across a side surface and a bottom surface of an element separation section 43 described later. In addition, the hydrogen diffusion prevention layer 71 may be provided at least partially between the semiconductor substrate 11 and the semiconductor substrate 21, but is preferably provided on the entire surface of the pixel region 13, for example.

The first substrate 10 includes, for each sensor pixel 12, the photodiode PD, the transfer transistor TR, and the floating diffusion FD. The first substrate 10 has a configuration in which the transfer transistor TR and the floating diffusion FD are provided in a portion of the semiconductor substrate 11 on side of the surface 11S1 (on side of the second substrate 20 on side opposite to the light incident surface). The first substrate 10 includes an element separation section 43 that separates the sensor pixels 12 from each other. The element separation section 43 is formed to extend in a normal direction of the semiconductor substrate 11 (a direction perpendicular to the front surface of the semiconductor substrate 11). The element separation section 43 is provided between two sensor pixels 12 adjacent to each other. The element separation section 43 electrically separates the adjacent sensor pixels 12 from each other. The element separation section 43 is configured by, for example, silicon oxide. The element separation section 43 penetrates the semiconductor substrate 11, for example. The first substrate 10 further includes, for example, a p-well layer 44, which is a side surface of the element separation section 43 and is in contact with a surface on side of the photodiode PD. The p-well layer 44 is configured by a semiconductor region of an electric conductivity type (specifically, p-type) different from that of the photodiode PD. The first substrate 10 further includes, for example, a fixed-charge film 45 in contact with a back surface (a surface 11S2, the other surface) of the semiconductor substrate 11. The fixed-charge film 45 has negative fixed charges in order to suppress generation of a dark current due to an interface state of the semiconductor substrate 11 on side of a light-receiving surface. The fixed-charge film 45 is formed by, for example, an insulating film having negative fixed charges. Examples of a material of such an insulating film include hafnium oxide, zircon oxide, aluminum oxide, titanium oxide, and tantalum oxide. An electric field induced by the fixed-charge film 45 forms a hole accumulation layer at an interface of the semiconductor substrate 11 on the side of the light-receiving surface. This hole accumulation layer suppresses generation of electrons from the interface. The color filter 40 is provided on the side of the back surface of the semiconductor substrate 11. The color filter 40 is provided in contact with the fixed-charge film 45, for example, and is provided at a position opposed to the sensor pixel 12 with the fixed-charge film 45 interposed therebetween. The light-receiving lens 50 is provided in contact with the color filter 40, for example, and is provided at a position opposed to the sensor pixel 12 with the color filter 40 and the fixed-charge film 45 interposed therebetween.

The second substrate 20 has a configuration in which an insulating layer 52 is stacked on the semiconductor substrate 21. As for the insulating layer 52, the second substrate 20 includes the insulating layer 52 as a portion of the interlayer insulating film 51. The insulating layer 52 is provided between the semiconductor substrate 21 and the semiconductor substrate 31. The semiconductor substrate 21 is configured by a silicon substrate. The second substrate 20 includes one readout circuit 22 for every four sensor pixels 12. The second substrate 20 has a configuration in which the readout circuit 22 is provided in a portion of the semiconductor substrate 21 on side of a front surface (a surface 21S1 opposed to the third substrate 30, one surface). The second substrate 20 is attached to the first substrate 10, with a back surface (a surface 21S2, the other surface) of the semiconductor substrate 21 being opposed to the front surface (the surface 11S1) of the semiconductor substrate 11. That is, the second substrate 20 is attached to the first substrate 10 in a face-to-back manner. The second substrate 20 further includes an insulating layer 53 that penetrates the semiconductor substrate 21, in the same layer as the semiconductor substrate 21. The second substrate 20 includes the insulating layer 53 as a portion of the interlayer insulating film 51. The insulating layer 53 is provided to cover the side surface of a through-wiring line 54 described later.

A stacked body including the first substrate 10 and the second substrate 20 includes the interlayer insulating film 51 and the through-wiring line 54 provided inside the interlayer insulating film 51. The through-wiring line 54 corresponds to a specific example of a "first through-wiring line" of the present disclosure. The stacked body includes one through-wiring line 54 for each sensor pixel 12. The through-wiring line 54 extend in a normal direction of the semiconductor substrate 21, and is provided to penetrate a location, of the interlayer insulating film 51, including the insulating layer 53. The first substrate 10 and the second substrate 20 are electrically coupled to each other by the through-wiring line 54. Specifically, the through-wiring line 54 is electrically coupled to the floating diffusion FD and a coupling wiring line 55 described later. It is to be noted that the through-wiring line 54 preferably includes, for example, a metal layer including a metal having an oxygen absorption effect between the through-wiring line 54 and each of the surrounding insulating layers 46, 52, and 53. This makes it possible to prevent ingress of oxygen via an opening formed due to formation of the through-wiring line 54.

The stacked body including the first substrate 10 and the second substrate 20 further includes through-wiring lines 47 and 48 (see FIG. 9 described later) provided in the interlayer insulating film 51. The through-wiring line 48 corresponds to a specific example of the "first through-wiring line" of the present disclosure. The stacked body includes one through-wiring line 47 and one through-wiring line 48 for each sensor pixel 12. Each of the through-wiring lines 47 and 48 extends in the normal direction of the semiconductor substrate 21, and is provided to penetrate a location, of the interlayer insulating film 51, including the insulating layer 53. The first substrate 10 and the second substrate 20 are electrically coupled to each other by the through-wiring lines 47 and 48. Specifically, the through-wiring line 47 is electrically coupled to the p-well layer 42 of the semiconductor substrate 11 and to a wiring line inside the second substrate 20. The through-wiring line 48 is electrically coupled to the transfer gate TG and to the pixel drive line 23.

The second substrate 20 includes, for example, inside the insulating layer 52, a plurality of coupling sections 59 electrically coupled to the readout circuit 22 and the semiconductor substrate 21. The second substrate 20 further includes, for example, a wiring layer 56 on the insulating layer 52. The wiring layer 56 includes, for example, an insulating layer 57, and the plurality of pixel drive lines 23 and the plurality of vertical signal lines 24 provided inside the insulating layer 57. The wiring layer 56 further includes, inside the insulating layer 57, for example, a plurality of coupling wiring lines 55, with each one provided for every four sensor pixels 12. The coupling wiring line 55 electrically couples respective through-wiring lines 54 electrically coupled to the floating diffusions FD included in the four sensor pixels 12 sharing the readout circuit 22. Here, the total number of the through-wiring lines 54 and 48 is more than the total number of the sensor pixels 12 included in the first substrate 10, and is twice the total number of the sensor pixels 12 included in the first substrate 10. In addition, the total number of the through-wiring lines 54, 48, and 47 is more than the total number of the sensor pixels 12 included in the first substrate 10, and is three times the total number of the sensor pixels 12 included in the first substrate 10.

The wiring layer 56 further includes, for example, a plurality of pad electrodes 58 inside the insulating layer 57. Each of the pad electrodes 58 is formed by a metal such as Cu (copper) and Al (aluminum), for example. Each of the pad electrodes 58 is exposed to a front surface of the wiring layer 56. Each of the pad electrodes 58 is used for electric coupling between the second substrate 20 and the third substrate 30 as well as for attaching the second substrate 20 and the third substrate 30 together. The plurality of pad electrodes 58 are provided one by one for the respective pixel drive lines 23 and the respective vertical signal lines 24, for example. Here, the total number of the pad electrodes 58 (or the total number of junctions between the pad electrode 58 and a pad electrode 64 (described later) is less than the total number of the sensor pixels 12 included in the first substrate 10.

In the present embodiment, the wiring layer 56 further includes the hydrogen supplying layer 72 inside the insulating layer 57. The hydrogen supplying layer 72 serves to supply hydrogen atoms terminating dangling bonds of a device interface (a front surface of the surface 21S1 of the semiconductor substrate 21) of the pixel transistor such as the reset transistor RST, the selection transistor SEL, and the amplification transistor AMP provided in the second substrate 20. Providing the hydrogen supplying layer 72 reduces generation of a dark current on the front surface of the surface 21S1 of the semiconductor substrate 21, thus improving a flicker noise and random telegraph noise characteristics of the pixel transistor. The hydrogen supplying layer 72 preferably contains many hydrogens inside the layer, and is preferably formed by a silicon nitride film formed by plasma CVD, for example. The hydrogen supplying layer 72 preferably has a thickness, for example, in a range preferably from 100 to 2000 nm, and more preferably 200 nm to 500 nm. FIG. 1 illustrates an example in which the hydrogen supplying layer 72 is provided between wiring lines configuring the pixel drive line 23 as well as the vertical signal line 24 provided inside the insulating layer 57 and the pad electrode 58; however, this is not limitative. The hydrogen supplying layer 72 may be provided, for example, immediately above the insulating layer 52, or may be provided immediately above the insulating layer 57 (a position in contact with the third substrate 30 in FIG. 1). In addition, the hydrogen supplying layer 72 may be provided on side closer to the second substrate 20 than the hydrogen diffusion prevention layer 71, and may be provided, for example, at a location on a back surface (surface 21S2) of the semiconductor substrate 21, e.g., at a position in contact with the hydrogen diffusion prevention layer 71, as illustrated in FIG. 8.

In the present embodiment, as described above, the hydrogen diffusion prevention layer 71 is provided between the first substrate 10 and the second substrate 20, and the hydrogen supplying layer 72 is further provided on the side closer to the second substrate 20 than the hydrogen diffusion prevention layer 71. This allows the interface (surface 11S1) of the semiconductor substrate 11 in which the transfer gate TG of the transfer transistor TR is formed and the interface (surface 21S1) of the semiconductor substrate 21 in which the amplification transistor AMP or the like is formed to have mutually different interface state densities.

The third substrate 30 has a configuration in which an interlayer insulating film 61 is stacked on the semiconductor substrate 31, for example. It is to be noted that, as described later, the third substrate 30 is attached to the second substrate 20 by the surfaces on the sides of the front surfaces; therefore, in describing the configurations inside the third substrate 30, a vertical relationship to be described is opposite to the vertical direction in the drawing. The semiconductor substrate 31 is configured by a silicon substrate. The third substrate 30 has a configuration in which the logic circuit 32 is provided in a portion of the semiconductor substrate 31 on side of a front surface (a surface 31S1). The third substrate 30 further includes, for example, a wiring layer 62 on the interlayer insulating film 61. The wiring layer 62 includes, for example, an insulating layer 63 and a plurality of pad electrodes 64 provided inside the insulating layer 63. The plurality of pad electrodes 64 is electrically coupled to the logic circuit 32. Each of the pad electrodes 64 is formed by Cu (copper), for example. Each of the pad electrodes 64 is exposed to a front surface of the wiring layer 62. Each of the pad electrodes 64 is used for electric coupling between the second substrate 20 and the third substrate 30 as well as for attaching the second substrate 20 and the third substrate 30 together. In addition, the pad electrode 64 need not necessarily be a plurality of pad electrodes; even one pad electrode is able to be electrically coupled to the logic circuit 32. The second substrate 20 and the third substrate 30 are electrically coupled to each other by junctions between the pad electrodes 58 and 64. That is, the gate (transfer gate TG) of the transfer transistor TR is electrically coupled to the logic circuit 32 via the through-wiring line 54 and the pad electrodes 58 and 64. The third substrate 30 is attached to the second substrate 20, with the front surface (surface 31S1) of the semiconductor substrate 31 being opposed to side of the front surface (surface 21S1) of the semiconductor substrate 21. That is, the third substrate 30 is attached to the second substrate 20 in a face-to-face manner.

FIGS. 9 and 10 each illustrate an example of a cross-sectional configuration in a horizontal direction of the imaging device 1. Each diagram on upper side of FIGS. 9 and 10 illustrates an example of a cross-sectional configuration along a cross-section Sec1 of FIG. 1, and each diagram on lower side of FIGS. 9 and 10 illustrates an example of a cross-sectional configuration along a cross-section Sec2 of FIG. 1. FIG. 9 exemplifies a configuration in which two sets of four sensor pixels 12 of 2×2 are arranged in a second direction H, and FIG. 10 exemplifies a configuration in which four sets of four sensor pixels 12 of 2×2 are arranged in a first direction V and the second direction H. It is to be noted that, in each cross-sectional view on the upper side of FIGS. 9 and 10, a diagram illustrating an example of the front surface configuration of the semiconductor substrate 11 is superimposed on a diagram illustrating the example of the cross-sectional configuration along the cross-section Sec1 of FIG. 1, with the insulating layer 46 being omitted. In addition, in each cross-sectional view on the lower side of FIGS. 9 and 10, a diagram illustrating an example of the front surface configuration of the semiconductor substrate 21 is superimposed on a diagram illustrating the example of the cross-sectional configuration along the cross-section Sec2 of FIG. 1.

As illustrated in FIGS. 9 and 10, a plurality of through-wiring lines 54, a plurality of through-wiring lines 48, and a plurality of through-wiring lines 47 are arranged side by side in a strip shape in the first direction V (vertical direction in FIG. 9, horizontal direction in FIG. 10) within the plane of the first substrate 10. It is to be noted that FIGS. 9 and 10 each exemplify the case where the plurality of through-wiring lines 54, the plurality of through-wiring lines 48, and the plurality of through-wiring lines 47 are arranged side by side in two rows in the first direction V. The first direction V is parallel to one arrangement direction (e.g., column direction) of two arrangement directions (e.g., row direction and column direction) of the plurality of sensor pixels 12 arranged in matrix. In the four sensor pixels 12 sharing the readout circuit 22, four floating diffusions FD are arranged close to each other, for example, with the element separation section 43 interposed therebetween. In the four sensor pixels 12 sharing the readout circuit 22, four transfer gates TG are arranged to surround the four floating diffusions FD, and the four transfer gates TG form an annular shape, for example.

The insulating layer 53 is configured by a plurality of blocks extending in the first direction V. The semiconductor substrate 21 extends in the first direction V, and is configured by a plurality of island-shaped blocks 21A arranged side by side in the second direction H orthogonal to the first direction V, with the insulating layer 53 interposed therebetween. Each block 21A is provided with, for example, a plurality of sets of the reset transistors RST, the amplification transistors AMP, and the selection transistors SEL. The one readout circuit 22 shared by the four sensor pixels 12 is configured by, for example, the reset transistor RST, the amplification transistor AMP, and the selection transistor SEL in a region facing the four sensor pixels 12. The one readout circuit 22 shared by the four sensor pixels 12 is configured by, for example, the amplification transistor AMP inside the left adjacent block 21A of the insulating layer 53, and the reset transistor RST and the selection transistor SEL inside the right adjacent block 21A of the insulating layer 53.

FIGS. 11, 12, 13 and 14 each illustrate an example of a wiring line layout in a horizontal plane of the imaging device 1. FIGS. 11 to 14 each exemplify the case where the one readout circuit 22 shared by the four sensor pixels 12 is provided inside a region facing the four sensor pixels 12. The wiring lines illustrated in FIGS. 11 to 14 are provided, for example, inside mutually different layers in the wiring layer 56.

Four through-wiring lines 54 adjacent to one another are electrically coupled to the coupling wiring line 55, for example, as illustrated in FIG. 11. The four through-wiring lines 54 adjacent to one another are further electrically coupled to the gate of the amplification transistor AMP included in the left adjacent block 21A of the insulating layer 53 and to the gate of the reset transistor RST included in the right adjacent block 21A of the insulating layer 53 via the coupling wiring line 55 and the coupling section 59, for example, as illustrated in FIG. 11.

The power source line VDD is arranged at positions facing the readout circuits 22 arranged side by side in the second direction H, for example, as illustrated in FIG. 12. The power source line VDD is electrically coupled to the drain of the amplification transistor AMP and the drain of the reset transistor RST of each of the readout circuits 22 arranged side by side in the second direction H via the coupling section 59, for example, as illustrated in FIG. 12. Two pixel drive lines 23 are arranged at positions facing the readout circuits 22 arranged side by side in the second direction H, for example, as illustrated in FIG. 12. One pixel drive line 23 (a second control line) is a wiring line RSTG electrically coupled to the gate of the reset transistor RST of each of the readout circuits 22 arranged side by side in the second direction H, for example, as illustrated in FIG. 12. The other pixel drive line 23 (a third control line) is a wiring line SELG electrically coupled to the gate of the selection transistor SEL of each of the readout circuits 22 arranged side by side in the second direction H, for example, as illustrated in FIG. 12. In each of the readout circuits 22, the source of the amplification transistor AMP and the drain of the selection transistor SEL are electrically coupled to each other via a wiring line 25, for example, as illustrated in FIG. 12.

Two power source lines VSS are arranged at positions facing the readout circuits 22 arranged side by side in the second direction H, for example, as illustrated in FIG. 13. Each of the power source lines VSS is electrically coupled to the plurality of through-wiring lines 47 at positions facing the respective sensor pixels 12 arranged side by side in the second direction H, for example, as illustrated in FIG. 13. Four pixel drive lines 23 are each arranged at positions facing the readout circuits 22 arranged side by side in the second direction H, for example, as illustrated in FIG. 13. Each of the four pixel drive lines 23 is a wiring line TRG electrically coupled to the through-wiring line 48 of one sensor pixel 12 of the four sensor pixels 12 corresponding to each of the readout circuits 22 arranged side by side in the second direction H, for example, as illustrated in FIG. 13. That is, the four pixel drive lines 23 (first control lines) are each electrically coupled to the gate (transfer gate TG) of the transfer transistor TR of each of the sensor pixels 12 arranged side by side in the second direction H. In FIG. 13, in order to distinguish the wiring lines TRG from one another, an identifier (1, 2, 3, or 4) is assigned to the end of each wiring line TRG.

The vertical signal line 24 is arranged at positions facing the readout circuits 22 arranged side by side in the first direction V, for example, as illustrated in FIG. 14. The vertical signal line 24 (an output line) is electrically coupled to an output end (the source of the amplification transistor AMP) of each of the readout circuits 22 arranged side by side in the first direction V, for example, as illustrated in FIG. 14.

1-2. Manufacturing Method of Imaging Device

Next, description is given of a manufacturing method of the imaging device 1. FIGS. 15A to 15H each illustrate an example of a manufacturing process of the imaging device 1.

First, the p-well layer 42, the element separation section 43, and the p-well layer 44 are formed in the semiconductor substrate 11. Next, the photodiode PD, the transfer transistor TR, and the floating diffusion FD are formed in the semiconductor substrate 11 (FIG. 15A). This allows for formation of the sensor pixel 12 in the semiconductor substrate 11. At this time, it is preferable not to use, as an electrode material to be used for the sensor pixel 12, a material having low heat resistance such as $CoSi_2$ and NiSi by Salicide process. Rather, it is preferable to use, as the electrode material to be used for the sensor pixel 12, a material having high heat resistance. Examples of the material having high heat resistance include polysilicon. Thereafter, the insulating layer 46 is formed on the semiconductor substrate 11 (FIG. 15A). In this manner, the first substrate 10 is formed.

Subsequently, the semiconductor substrate 21 with the hydrogen diffusion prevention layer 71 being formed on the surface 21S2 is prepared (FIG. 15B). The hydrogen diffusion prevention layer 71 may be formed, for example, by forming a silicon nitride film using the LP-CVD. Next, the semiconductor substrate 21 is attached onto the first substrate 10 to face the hydrogen diffusion prevention layer 71 (FIG. 15C). At this time, the semiconductor substrate 21 is thinned, as needed. In this occasion, the thickness of the semiconductor substrate 21 is set to a film thickness necessary for formation of the readout circuit 22. The thickness of the semiconductor substrate 21 is typically about several hundred nm. However, an FD (Fully Depletion) type is also available depending on the concept of the readout circuit 22; in such a case, a range from several nm to several μm may be employed as the thickness of the semiconductor substrate 21.

It is to be noted that the hydrogen diffusion prevention layer 71 may be formed on side of the first substrate 10. In a case of forming the hydrogen diffusion prevention layer 71 immediately above the semiconductor substrate 11 across the side surface and the bottom surface of the element separation section 43, for example, an opening is formed in which the element separation section 43 is to be provided, and thereafter ALD, for example, is used to form, as a film, a PSG (Phosphorus Silicon Glass) or a BSG (Boron Silicon Glass), for example, on the semiconductor substrate 11 and on a side surface and a bottom surface of the opening. Subsequently, annealing processing is performed to diffuse phosphorus or boron onto the side surface and the bottom surface of the opening, and then the PSG or BSG is removed. Thereafter, the hydrogen diffusion prevention layer 71 is formed, and then, for example, silicon oxide is buried inside the opening to form the element separation section 43.

Subsequently, the insulating layer 53 is formed inside the same layer as the semiconductor substrate 21 (FIG. 15D). The insulating layer 53 is formed, for example, at a location facing the floating diffusion FD. For example, a slit penetrating the semiconductor substrate 21 is formed in the semiconductor substrate 21 to separate the semiconductor substrate 21 into the plurality of blocks 21A. Thereafter, the insulating layer 53 is formed to fill the slit. Thereafter, the readout circuit 22 including the amplification transistor AMP, and the like is formed in each of the blocks 21A of the semiconductor substrate 21 (FIG. 15D). At this time, in a case where a metal material having high heat resistance is used as the electrode material of the sensor pixel 12, it is possible to form a gate insulating film of the readout circuit 22 by thermal oxidation.

Next, the insulating layer 52 is formed on the semiconductor substrate 21. In this manner, the interlayer insulating film 51 including the insulating layers 46, 52, and 53 is formed. Subsequently, through-holes 51A and 51B are formed in the interlayer insulating film 51 (FIG. 15E). Specifically, the through-hole 51B penetrating the insulating layer 52 is formed at a location, of the insulating layer 52, facing the readout circuit 22. In addition, the through-hole 51A penetrating the interlayer insulating film 51 is formed at a location, of the interlayer insulating film 51, facing the floating diffusion FD (i.e., a location facing the insulating layer 53).

Next, embedding an electrically-conductive material in the through-holes 51A and 51B allows for formation of the through-wiring line 54 inside the through-hole 51A as well as formation of the coupling section 59 inside the through-hole 51B (FIG. 15F). At this time, the through-wiring line 54 penetrating the hydrogen diffusion prevention layer 71 preferably has a two-layer structure of, for example, a barrier metal such as titanium (Ti) having a hydrogen absorption effect and, for example, an electrically-conductive material such as tungsten (W). That is, for example, a titanium film is formed on a side surface and a bottom surface of the through-hole 51A, and then tungsten (W), for example, is embedded therein, to thereby a through-wiring line. At this time, similarly to the through-hole 51A, a titanium film may also be formed as a barrier metal on a side surface and a bottom surface of the through-hole 51B; however, in a case of improving interface termination of the pixel transistor such as the amplification transistor (AMP), tantalum (Ta) or the like, for example, having a low hydrogen absorption effect may be formed as a barrier metal. Subsequently, the coupling wiring line 55 electrically coupling the through-wiring line 54 and the coupling section 59 to each other is formed on the insulating layer 52 (FIG. 15G). Thereafter, the wiring layer 56 including the hydrogen supplying layer 72 and the pad electrode 58 is formed on the insulating layer 52. In this manner, the second substrate 20 is formed.

Next, the second substrate 20 is attached to the third substrate 30 in which the logic circuit 32 and the wiring layer 62 are formed, with the front surface of the semiconductor substrate 21 being opposed to side of the front surface of the semiconductor substrate 31 (FIG. 15H). At this time, the pad electrode 58 of the second substrate 20 and the pad electrode 64 of the third substrate 30 are bonded to each other, thereby electrically coupling the second substrate 20 and the third substrate 30 to each other. In this manner, the imaging device 1 is manufactured.

1-3. Workings and Effects

Miniaturization of an area per pixel of an imaging device of a two-dimensional structure has heretofore been achieved by introduction of a miniaturization process and improvement in packaging density. In recent years, in order to achieve still smaller size of the imaging device and the miniaturization of an area per pixel thereof, an imaging device of a three-dimensional structure has been developed. In the imaging device of the three-dimensional structure, for example, a semiconductor substrate including a plurality of sensor pixels and a semiconductor substrate including a signal processing circuit that processes a signal obtained at each sensor pixel are stacked on each other. This enables sensor pixels to have a higher degree of integration and a signal processing circuit to have a larger size, while having a chip size equivalent to an existing chip size.

Incidentally, the imaging device is required to reduce a dark current on a front surface of a semiconductor substrate, which constitutes a factor deteriorating image quality, and to improve a flicker noise and random telegraph noise characteristics of the pixel transistor. In the manufacturing process of the imaging device, an interface level of the semiconductor substrate increases due to plasma damage such as UV-irradiation and charge-up during plasma processing (CVD and dry etching), which constitutes one of factors of the dark current. In order to reduce the dark current and thus to improve pixel characteristics of an image sensor, a method is used, that terminates dangling bonds of a device interface using atoms such as hydrogen and fluorine. For example, there is a technique in which hydrogen is desorbed from a passivation film (SiN film) and is bonded to a dangling bond on a surface of the photodiode, that is a light-receiving element of a semiconductor substrate, to reduce a dark current of the surface.

However, in a typical imaging device, hydrogen desorbed from the SiN film is diffused to a semiconductor substrate including a plurality of sensor pixels, thus causing depinning of a photodiode PD configuring the sensor pixel, which may possibly result in degradation of the characteristics.

In contrast, in the stacked body in which the first substrate 10 and the second substrate 20 are stacked, the imaging device 1 of the present embodiment includes the hydrogen diffusion prevention layer 71 between the semiconductor substrate 11 configuring the first substrate 10 and including the sensor pixel 12 and the semiconductor substrate 21 configuring the second substrate 20 and including the readout circuit. This enables hydrogen atoms used for improvement in the characteristics of the pixel transistor to be selectively diffused to a desired region. Specifically, for example, it is possible to prevent the diffusion of hydrogen atoms to the semiconductor substrate 11 including the sensor pixel 12 from the hydrogen supplying layer 72 provided on the side of the front surface (surface 21S1) of the semiconductor substrate 21 on side opposite to the back surface (surface 21S2) facing the first substrate 10.

As described above, in the present embodiment, the hydrogen diffusion prevention layer 71 is provided between the semiconductor substrate 11 including the sensor pixel 12 and the semiconductor substrate 21 including the readout circuit 22 that outputs an image signal based on charges outputted from the sensor pixel 12, in the stacked body in which the first substrate 10 and the second substrate 20 are stacked, thus allowing hydrogen atoms used for improvement in the characteristics of the pixel transistor to be selectively diffused to a desired region. This makes it possible to reduce the depinning of the photodiode PD provided in the semiconductor substrate 11. Therefore, it is possible to achieve both of the reduction in the dark current on the front surface of the semiconductor substrate 21, which constitutes a factor of degradation of the image quality as well as the improvement in the flicker noise and random telegraph noise characteristics of the pixel transistor, and the reduction in the depinning of the photodiode PD. This makes it possible to achieve both the noise characteristics and the photodiode characteristics. Thus, it becomes possible to provide the imaging device 1 having superior imaging characteristics.

Further, in the present embodiment, the gate (transfer gate TG) of the transfer transistor TR provided in the first substrate 10 and the pixel transistor (e.g., amplification transistor AMP) provided in the second substrate 20 are electrically coupled to each other, and titanium (Ti) or the like having a hydrogen absorption effect is formed as a barrier metal on the side surface and the bottom surface of the through-hole 51A in which the through-wiring line 54 penetrating the hydrogen diffusion prevention layer 71 is formed. This prevents diffusion of hydrogen atoms to side of the semiconductor substrate 11 via the through-hole 51A, thus making it possible to diffuse hydrogen atoms more selectively.

Hereinafter, description is given of second to fifth embodiments and Modification Examples 1 to 10. It is to be noted that, in following description, the same components as those of the foregoing first embodiment are denoted by the same reference numerals, and the descriptions thereof are omitted as appropriate.

2. SECOND EMBODIMENT

FIG. 16 illustrates an example of a cross-sectional configuration in the vertical direction of an imaging device (an imaging device 2) according to a second embodiment of the present disclosure. Similarly to the imaging device 1 in the foregoing first embodiment, the imaging device 2 includes the hydrogen diffusion prevention layer 71 between the semiconductor substrate 11 and the semiconductor substrate 21, in the stacked body of the first substrate 10 and the second substrate 20. The imaging device 2 of the present embodiment has a configuration of using a through-wiring line 65 penetrating the second substrate 20 and the third substrate 30, as a structure of electrically coupling the second substrate 20 and the third substrate 30 to each other, instead of the junction between the pad electrodes 58 and 64.

That is, the third substrate 30 includes the through-wiring line 65 used for electric coupling between the second substrate 20 and the third substrate 30, and thus the second substrate 20 and the third substrate 30 are electrically coupled to each other by the through-wiring line 65, as illustrated in FIG. 16. That is, the gate (transfer gate TG) of the transfer transistor TR is electrically coupled to the logic circuit 32 via the through-wiring line 54, the pad electrode 58, and the through-wiring line 65. Here, the total number of the through-wiring lines 65 is less the total number of the sensor pixels 12 included in the first substrate 10. The through-wiring line 65 corresponds to a specific example of a “second through-wiring line” of the present disclosure. The through-wiring line 65 is configured by, for example, a so-called TCV (Thorough Chip Via).

As described above, even in a case of using the through-wiring line 65, as a structure for electrically coupling the second substrate 20 and the third substrate 30 to each other, in the imaging device 2 of the present embodiment, the imaging device 2 has effects similar to those of the foregoing first embodiment.

3. THIRD EMBODIMENT

FIG. 17 illustrates an example of a cross-sectional configuration in the vertical direction of an imaging device (an imaging device 3) according to a third embodiment of the present disclosure. Similarly to the imaging device 1 in the foregoing first embodiment, the imaging device 3 includes the hydrogen diffusion prevention layer 71 between the semiconductor substrate 11 and the semiconductor substrate 21, in the stacked body of the first substrate 10 and the second substrate 20. The imaging device 3 of the present embodiment includes, for example, an organic photoelectric conversion section 80 including an organic semiconductor material on the side of the light incident surface of the first substrate 10, and has a configuration in which a hydrogen diffusion prevention layer 73 is provided between the organic photoelectric conversion section 80 and the first substrate 10. The hydrogen diffusion prevention layer 73 corresponds to a specific example of a "second hydrogen diffusion prevention layer" of the present disclosure.

In this manner, in a case of providing an organic film that easily contains hydrogen atoms on the side of the light incident surface of the first substrate 10, it is preferable to provide the hydrogen diffusion prevention layer 73 also on the side of the back surface (surface 11S2) of the semiconductor substrate 11. This makes it possible to reduce the depinning of the photodiode PD due to the diffusion of hydrogen atoms from the back surface (surface 11S2) of the semiconductor substrate 11.

4. FOURTH EMBODIMENT

FIG. 18 illustrates an example of a cross-sectional configuration in the vertical direction of an imaging device (an imaging device 4) according to a fourth embodiment of the present disclosure. Similarly to the imaging device 1 in the foregoing first embodiment, the imaging device 4 includes the hydrogen diffusion prevention layer 71 between the semiconductor substrate 11 and the semiconductor substrate 21 in the stacked body of the first substrate 10 and the second substrate 20. The imaging device 4 of the present embodiment includes, in addition to the first substrate 10, the second substrate 20 and the third substrate 30, for example, a fourth substrate 90 including a functional element such as a memory, which substrates are stacked in this order.

The fourth substrate 90 has a configuration, in which, for example, an interlayer insulating film 93 is stacked on a semiconductor substrate 91. It is to be noted that, similarly to the third substrate 30, a surface on side of a front surface of the fourth substrate 90 is attached to the third substrate 30. The semiconductor substrate 91 is configured by a silicon substrate. The fourth substrate 90 has a configuration in which a memory element 92 is provided in a portion of the semiconductor substrate 91 on side of the front surface (a surface 91S1). The fourth substrate 90 further includes, for example, a wiring layer 94 on the interlayer insulating film 93. The wiring layer 94 includes, for example, an insulating layer 95 and a plurality of pad electrodes 96 provided inside the insulating layer 95. The plurality of pad electrodes 96 is electrically coupled to the memory element 92. Each pad electrode 96 is formed by Cu (copper), for example. Each pad electrode 96 is exposed to a front surface of the wiring layer 94. Each pad electrode 96 is used to electrically couple the third substrate 30 and the fourth substrate 90 to each other and to attach the third substrate 30 and the fourth substrate 90 to each other. In addition, the pad electrode 96 need not necessarily be a plurality of pad electrodes; even one pad electrode is able to be electrically coupled to the logic circuit 32. The third substrate 30 and the fourth substrate 90 are electrically coupled to each other by junctions between pad electrodes 66 and 96.

As described above, in the imaging device having a three-dimensional structure, the fourth substrate 90 including a functional element such as a memory may be further stacked on the third substrate 30 including the logic circuit 32, as in the imaging device 3 of the present embodiment. In addition, on the third substrate 30, an organic film or the like may be formed, without being limited to the substrate including the functional element.

5. FIFTH EMBODIMENT

FIG. 19 illustrates an example of a cross-sectional configuration in the vertical direction of an imaging device (an imaging device 5) according to a fifth embodiment of the present disclosure. Similarly to the imaging device 1 in the foregoing first embodiment, the imaging device 5 includes the hydrogen diffusion prevention layer 71 between the semiconductor substrate 11 and the semiconductor substrate 21 in the stacked body of the first substrate 10 and the second substrate 20. The imaging device 5 of the present embodiment has a configuration in which, for example, the logic circuit 32 provided separately in the third substrate in the foregoing first embodiment is provided partially on the front surface (surface 11S1) of the semiconductor substrate 11 configuring the first substrate 10. In the present embodiment, the gate (transfer gate TG) of the transfer transistor TR and the logic circuit 32 are electrically coupled to each other, via the through-wiring line 54, a coupling wiring line 97 provided in the wiring layer 62 of the second substrate 20, and a through-wiring line 98 penetrating the second substrate 20.

It is to be noted that, although FIG. 19 illustrates the example in which the hydrogen diffusion prevention layer 71 is provided on the entire surface of the first substrate 10, this is not limitative. For example, as in an imaging device 8 illustrated in FIG. 20, the formation may be made selectively in a portion of the first substrate 10, e.g., in a region where the photodiode PD is formed.

As described above, even in a case where the logic circuit 32 is formed in the first substrate 10, the imaging devices 5 and 6 have effects similar to those of the foregoing first embodiment.

6. MODIFICATION EXAMPLES

6-1. Modification Example 1

FIG. 21 illustrates an example of a cross-sectional configuration in the vertical direction of an imaging device (e.g., the imaging device 1) according to a modification example (Modification Example 1) of any of the foregoing first to fifth embodiments. In the present modification example, the transfer transistor TR includes a planar transfer gate TG. Therefore, the transfer gate TG does not penetrate the p-well layer 42, and is formed only on the front surface of the semiconductor substrate 11. Even in a case where the planar transfer gate TG is used for the transfer transistor TR, the imaging device 1 has effects similar to those of the foregoing first embodiment.

Modification Example 2

FIG. 22 illustrates an example of a cross-sectional configuration in the vertical direction of an imaging device (e.g., the imaging device 1) according to a modification example (Modification Example 2) of any of the foregoing first to fifth embodiments. In the present modification example, electric coupling between the second substrate 20 and the third substrate 30 is made in a region facing a peripheral region 14 in the first substrate 10. The peripheral region 14 corresponds to a frame region of the first substrate 10, and is provided on the periphery of the pixel region 13. In the present modification example, the second substrate 20 includes the plurality of pad electrodes 58 in the region facing the peripheral region 14, and the third substrate 30 includes the plurality of pad electrodes 64 in the region facing the peripheral region 14. The second substrate 20 and the third substrate 30 are electrically coupled to each other by junctions between the pad electrodes 58 and 64 provided in the region facing the peripheral region 14.

In this manner, in the present modification example, the second substrate 20 and the third substrate 30 are electrically coupled to each other by the junctions between the pad electrodes 58 and 64 provided in the region facing the peripheral region 14. This makes it possible to reduce the possibility of inhibiting the miniaturization of an area per pixel, as compared with the case of bonding the pad electrodes 58 and 64 to each other in a region facing the pixel region 13. Thus, in addition to the effects of the foregoing first embodiment, it is possible to provide the imaging device 1 having a three-layered structure that does not inhibit the miniaturization of an area per pixel, while having a chip size equivalent to an existing chip size.

Modification Example 3

FIG. 23 illustrates an example of a cross-sectional configuration in the vertical direction of an imaging device (e.g., the imaging device 1) according to a modification example (Modification Example 3) of any of the foregoing first to fifth embodiments. FIG. 24 illustrates another example of the cross-sectional configuration in the vertical direction of the imaging device (e.g., the imaging device 1) according to the modification example (Modification Example 3) of any of the foregoing first to fifth embodiments. Each diagram on upper side of FIGS. 23 and 24 is a modification example of the cross-sectional configuration along the cross-section Sec1 of FIG. 1, and a diagram on lower side of FIG. 23 is a modification example of the cross-sectional configuration along the cross-section Sec2 of FIG. 1. It is to be noted that, in each cross-sectional view on the upper side of FIGS. 23 and 24, a diagram illustrating a modification example of the front surface configuration of the semiconductor substrate 11 of FIG. 1 is superimposed on the diagram illustrating the modification example of the cross-sectional configuration along the cross-section Sec1 of FIG. 1, with the insulating layer 46 being omitted. In addition, in each cross-sectional view on the lower side of FIGS. 23 and 24, a diagram illustrating a modification example of the front surface configuration of the semiconductor substrate 21 is superimposed on the diagram illustrating the modification example of the cross-sectional configuration along the cross-section Sec2 of FIG. 1.

As illustrated in FIGS. 23 and 24, the plurality of through-wiring lines 54, the plurality of through-wiring lines 48, and the plurality of through-wiring lines 47 (a plurality of dots arranged in matrix in the drawing) are arranged side by side in a strip shape in the first direction V (horizontal direction in FIGS. 23 and 24) in a plane of the first substrate 10. It is to be noted that FIGS. 23 and 24 each exemplify the case where the plurality of through-wiring lines 54, the plurality of through-wiring lines 48, and the plurality of through-wiring lines 47 are arranged side by side in two rows in the first direction V. In the four sensor pixels 12 sharing the readout circuit 22, four floating diffusions FD are arranged close to each other with the element separation section 43 interposed therebetween, for example. In the four sensor pixels 12 sharing the readout circuit 22, the four transfer gates TG (TG1, TG2, TG3, and TG4) are arranged to surround the four floating diffusions FD, and the four transfer gates TG form an annular shape, for example.

The insulating layer 53 is configured by a plurality of blocks extending in the first direction V. The semiconductor substrate 21 extends in the first direction V, and is configured by the plurality of island-shaped blocks 21A arranged side by side in the second direction H orthogonal to the first direction V, with the insulating layer 53 interposed therebetween. Each block 21A includes, for example, the reset transistor RST, the amplification transistor AMP, and the selection transistor SEL. One readout circuit 22 shared by the four sensor pixels 12 is not arranged to squarely face the four sensor pixels 12, for example, and is arranged to be shifted in the second direction H.

In FIG. 23, the one readout circuit 22 shared by the four sensor pixels 12 is configured by the reset transistor RST, the amplification transistor AMP, and the selection transistor SEL, which are inside a region, of the second substrate 20, shifted in the second direction H from the region facing the four sensor pixels 12. The one readout circuit 22 shared by the four sensor pixels 12 is configured by, for example, the amplification transistor AMP, the reset transistor RST, and the selection transistor SEL inside one block 21A.

In FIG. 24, the one readout circuit 22 shared by the four sensor pixels 12 is configured by the reset transistor RST, the amplification transistor AMP, the selection transistor SEL, and the FD transfer transistor FDG, which are inside a region, of the second substrate 20, shifted in the second direction H from the region facing the four sensor pixels 12. The one readout circuit 22 shared by the four sensor pixels 12 is configured by, for example, the amplification transistor AMP, the reset transistor RST, the selection transistor SEL, and the FD transfer transistor FDG inside the one block 21A.

In the present modification example, the one readout circuit 22 shared by the four sensor pixels 12 is not arranged to squarely face the four sensor pixels 12, for example, and is arranged to be shifted in the second direction H from a position squarely facing the four sensor pixels 12. In such a case, it may be possible to shorten the wiring line 25, or it may be possible to omit the wiring line 25 and to configure a source of the amplification transistor AMP and a drain of the selection transistor SEL using an impurity region in common. As a result, it is possible to reduce a size of the readout circuit 22 or to increase a size of another location inside the readout circuit 22.

Modification Example 4

FIG. 25 illustrates an example of a cross-sectional configuration in the horizontal direction of an imaging device (e.g., the imaging device 1) according to a modification example (Modification Example 4) of any of the foregoing first to fifth embodiments. FIG. 25 illustrates a modification example of the cross-sectional configuration of FIG. 9.

In the present modification example, the semiconductor substrate 21 is configured by the plurality of island-shaped blocks 21A arranged side by side in the first direction V and the second direction H, with the insulating layer 53 interposed therebetween. Each block 21A includes, for example, a set of the reset transistor RST, the amplification transistor AMP, and the selection transistor SEL. In such a case, it is possible to cause the insulating layer 53 to suppress a crosstalk between the readout circuits 22 adjacent to each other, thus making it possible to suppress image quality degradation due to a decrease in resolution and color mixing on a reproduced image.

Modification Example 5

FIG. 26 illustrates an example of a cross-sectional configuration in the horizontal direction of an imaging device (e.g., the imaging device 1) according to a modification example (Modification Example 5) of any of the foregoing first to fifth embodiments. FIG. 26 illustrates a modification example of the cross-sectional configuration of FIG. 25.

In the present modification example, the one readout circuit 22 shared by the four sensor pixels 12 is not arranged to squarely face the four sensor pixels 12, for example, and is arranged to be shifted in the first direction V. In the present modification example, similarly to Modification Example 4, the semiconductor substrate 21 is further configured by the plurality of island-shaped blocks 21A arranged side by side in the first direction V and the second direction H, with the insulating layer 53 interposed therebetween. Each block 21A includes, for example, a set of the reset transistor RST, the amplification transistor AMP, and the selection transistor SEL. In the present modification example, the plurality of through-wiring lines 47 and the plurality of through-wiring lines 54 are further arranged also in the second direction H. Specifically, the plurality of through-wiring lines 47 is disposed between the four through-wiring lines 54 sharing a certain readout circuit 22 and the four through-wiring lines 54 sharing another readout circuit 22 adjacent to the certain readout circuit 22 in the second direction H. In such a case, it is possible to cause the insulating layer 53 and the through-wiring line 47 to suppress a crosstalk between the readout circuits 22 adjacent to each other, thus making it possible to suppress image quality degradation due to a decrease in resolution and color mixing on a reproduced image.

Modification Example 6

FIG. 27 illustrates an example of a cross-sectional configuration in the horizontal direction of an imaging device (e.g., the imaging device 1) according to a modification example (Modification Example 6) of any of the foregoing first to fifth embodiments. FIG. 27 illustrates a modification example of the cross-sectional configuration of FIG. 9.

In the present modification example, the first substrate 10 includes the photodiode PD and the transfer transistor TR for each sensor pixel 12, and includes the floating diffusion FD shared by every four sensor pixels 12. Accordingly, in the present modification example, one through-wiring line 54 is provided for every four sensor pixels 12.

In the plurality of sensor pixels 12 arranged in matrix, four sensor pixels 12 corresponding to a region, which is obtained by shifting the unit region corresponding to four sensor pixels 12 sharing one floating diffusion FD by one sensor pixel 12 in the first direction V, is referred to as four sensor pixels 12A, for the sake of convenience. At this time, in the present modification example, the first substrate 10 includes the through-wiring line 47 shared by every four sensor pixels 12A. Accordingly, in the present modification example, one through-wiring line 47 is provided for every four sensor pixels 12A.

In the present modification example, the first substrate 10 includes the element separation section 43 that separates the photodiodes PD and the transfer transistors TR for the respective sensor pixels 12. When viewed from the normal direction of the semiconductor substrate 11, the element separation section 43 does not completely surround the sensor pixel 12, and has a gap (unformed region) in the vicinity of the floating diffusion FD (through-wiring line 54) and in the vicinity of the through-wiring line 47. In addition, the gap enables sharing of the one through-wiring line 54 by the four sensor pixels 12 as well as sharing of the one through-wiring line 47 by the four sensor pixels 12A. In the present modification example, the second substrate 20 includes the readout circuit 22 for every four sensor pixels 12 sharing the floating diffusion FD.

FIG. 28 illustrates another example of the cross-sectional configuration in the horizontal direction of the imaging device 1 according to the present modification example. FIG. 28 illustrates a modification example of the cross-sectional configuration of FIG. 25. In the present modification example, the first substrate 10 includes the photodiode PD and the transfer transistor TR for each sensor pixel 12, and includes the floating diffusion FD shared by every four sensor pixels 12. Further, the first substrate 10 includes the element separation section 43 that separates the photodiodes PD and the transfer transistors TR for the respective sensor pixels 12.

FIG. 29 illustrates another example of the cross-sectional configuration in the horizontal direction of the imaging device 1 according to the present modification example. FIG. 43 illustrates a modification example of the cross-sectional configuration of FIG. 26. In the present modification example, the first substrate 10 includes the photodiode PD and the transfer transistor TR for each sensor pixel 12, and includes the floating diffusion FD shared by every four sensor pixels 12. Further, the first substrate 10 includes the element separation section 43 that separates the photodiodes PD and the transfer transistors TR for the respective sensor pixels 12.

Modification Example 7

FIG. 30 illustrates an example of a circuit configuration of an imaging device (e.g., the imaging device 1) according to a modification example (Modification Example 7) of any of the foregoing first to fifth embodiments and Modification Examples 1 to 6. The imaging device 1 according to the present modification example is a CMOS image sensor mounted with a column-parallel ADC.

As illustrated in FIG. 30, the imaging device 1 according to the present modification example is configured to include the vertical drive circuit 33, the column signal processing circuit 34, a reference voltage supply section 38, the horizontal drive circuit 35, a horizontal output line 37, and the system control circuit 36, in addition to the pixel region 13 in which the plurality of sensor pixels 12 each including a photoelectric conversion element are two-dimensionally arranged in matrix (matrix shape).

In this system configuration, on the basis of a master clock MCK, the system control circuit 36 generates a clock signal, a control signal, or the like that serves as a criterion for an operation of the vertical drive circuit 33, the column signal processing circuit 34, the reference voltage supply section 38, the horizontal drive circuit 35, and the like, and provides the clock signal, the control signal, or the like to the vertical drive circuit 33, the column signal processing circuit 34, the reference voltage supply section 38, the horizontal drive circuit 35, and the like.

In addition, the vertical drive circuit 33 is formed in the first substrate 10 together with each of the sensor pixels 12 of the pixel region 13, and is further formed in the second substrate 20, as well, in which the readout circuit 22 is formed. The column signal processing circuit 34, the reference voltage supply section 38, the horizontal drive circuit 35, the horizontal output line 37 and the system control circuit 36 are formed in the third substrate 30.

It may be possible to use, as the sensor pixel 12, for example, a configuration including, in addition to the photodiode PD, the transfer transistor TR that transfers charges obtained by photoelectric conversion at the photodiode PD to the floating diffusion FD, although illustration is omitted here. In addition, it may be possible to use, as the readout circuit 22, for example, a three-transistor configuration including the reset transistor RST that controls an electric potential of the floating diffusion FD, the amplification transistor AMP that outputs a signal corresponding to an electric potential of the floating diffusion FD, and the selection transistor SEL for selecting a pixel, although illustration is omitted here.

In the pixel region 13, the sensor pixels 12 are two-dimensionally arranged; with respect to this pixel arrangement of m-row and n-column, the pixel drive lines 23 are wired for respective rows, and the vertical signal lines 24 are wired for respective columns. Each one end of the plurality of pixel drive lines 23 is coupled to a corresponding output end of the rows of the vertical drive circuit 33. The vertical drive circuit 33 is configured by a shift register or the like, and controls row address and row scanning of the pixel region 13 via the plurality of pixel drive lines 23.

The column signal processing circuit 34 includes, for example, ADCs (analog-to-digital conversion circuits) 34-1 to 34-*m* provided for respective pixel columns, i.e., for the respective vertical signal lines 24 of the pixel region 13, and converts analog signals outputted for respective columns from the sensor pixels 12 of the pixel region 13 into digital signals for outputting.

The reference voltage supply section 38 includes, for example, a DAC (digital-to-analog conversion circuit) 38A as a means to generate a reference voltage Vref of a so-called ramp (RAMP) waveform having a level that changes in an inclined manner as time elapses. It is to be noted that the means to generate the reference voltage Vref of the ramp waveform is not limited to the DAC 38A.

Under the control of a control signal CS1 provided from the system control circuit 36, the DAC 38A generates the reference voltage Vref of the ramp waveform on the basis of a clock CK provided from this system control circuit 36 to supply the generated reference voltage Vref to the ADCs 34-1 to 34-*m*.

It is to be noted that each of the ADCs 34-1 to 34-*m* is configured to selectively perform an AD conversion operation corresponding to each operation mode of a normal frame rate mode in a progressive scanning system for reading information on all of the sensor pixels 12, and a high-speed frame rate mode for setting exposure time of the sensor pixel 12 to 1/N to increase a frame rate by N times, e.g., by twice, as compared with the time of the normal frame rate mode. The switching between the operation modes is executed by controls performed by control signals CS2 and CS3 provided from the system control circuit 36. In addition, instruction information for switching between the operation modes of the normal frame rate mode and the high-speed frame rate mode is provided from an external system controller (unillustrated) to the system control circuit 36.

All of the ADCs 34-1 to 34-*m* have the same configuration; description is given here referring to the example of the ADC 34-*m*. The ADC 34-*m* is configured to include a comparator 34A, an up/down counter (referred to as U/D CNT in the drawing) 34B, e.g., as a number-counting means, a transfer switch 34C, and a memory 34D.

The comparator 34A compares a signal voltage Vx of the vertical signal line 24 corresponding to a signal outputted from each sensor pixel 12 of an n-th column of the pixel region 13 and the reference voltage Vref of the ramp waveform supplied from the reference voltage supply section 38 with each other. For example, when the reference voltage Vref is larger than the signal voltage Vx, an output Vco becomes an "H" level, whereas, when the reference voltage Vref is equal to or less than the signal voltage Vx, the output Vco becomes an "L" level.

The up/down counter 34B is an asynchronous counter; under the control of the control signal CS2 provided from the system control circuit 36, the up/down counter 34B is provided with the clock CK from the system control circuit 36 simultaneously with the DAC 18A, and performs down (DOWN)-counting or up (UP)-counting in synchronization with the clock CK to thereby measure a comparison period from the start of a comparison operation to the end of the comparison operation in the comparator 34A.

Specifically, in the normal frame rate mode, when performing a reading operation of signals from one sensor pixel 12, the down-counting is performed upon a first reading operation to thereby measure comparison time upon the first reading, whereas the up-counting is performed upon a second reading operation to measure comparison time upon the second reading.

Meanwhile, in the high-speed frame rate mode, while holding a count result for the sensor pixel 12 of a certain row as it is, the down-counting is subsequently performed for the sensor pixel 12 of the next row upon a first reading operation from the previous count result to thereby measure comparison time upon the first reading, and the up-counting is performed upon a second reading operation to thereby measure comparison time upon the second reading.

Under the control of the control signal CS3 provided from the system control circuit 36, the transfer switch 34C, in the normal frame rate mode, is brought into an ON (closed) state upon completion of the counting operation of the up/down counter 34B for the sensor pixel 12 of the certain row to transfer, to the memory 34D, the count results of the up/down counter 34B.

Meanwhile, for example, in the high-speed frame rate of N=2, an OFF (open) state remains upon completion of the counting operation of the up/down counter 34B for the sensor pixel 12 of the certain row, and subsequently an ON state is obtained upon completion of the counting operation of the up/down counter 34B for the sensor pixel 12 of the next row to transfer, to the memory 34D, the count results of the up/down counter 34B for the vertical two pixels.

In this manner, analog signals supplied for respective columns from the respective sensor pixels 12 of the pixel region 13 via the vertical signal lines 24 are converted into N-bit digital signals by respective operations of the comparators 34A and the up/down counters 34B in the ADCs 34-1 to 34-*m*, and are stored in the memories 34D.

The horizontal drive circuit 35 is configured by a shift register or the like, and controls column address and column scanning of the ADCs 34-1 to 34-*m* in the column signal processing circuit 34. Under the control of the horizontal drive circuit 35, the N-bit digital signals having been subjected to the AD conversion in the respective ADCs 34-1 to 34-*m* are read to the horizontal output line 37 in order, and are outputted as imaging data via the horizontal output line 37.

It is to be noted that it may also be possible to provide, in addition to the above-described components, a circuit, etc. that performs various types of signal processing on the imaging data outputted via the horizontal output line 37, although no particular illustration is given because there is no direct relationship with the present disclosure.

In the imaging device 1 mounted with the column-parallel ADC according to the present modification example having the above configuration, the count results of the up/down counter 34B are able to be selectively transferred to the memory 34D via the transfer switch 34C. This makes it possible to control the counting operation of the up/down counter 34B and the reading operation of the count results of the up/down counter 34B to the horizontal output line 37 independently of each other.

Modification Example 8

FIG. 31 illustrates an example of a configuration of the imaging device of FIG. 30, in which the three substrates (first substrate 10, second substrate 20, and third substrate 30) are stacked. In the present modification example, the first substrate 10 has a middle part where the pixel region 13 including the plurality of sensor pixels 12 is formed, with the vertical drive circuit 33 being formed around the pixel region 13. In addition, the second substrate 20 has a middle part where a readout circuit region 15 including the plurality of readout circuits 22 is formed, with the vertical drive circuit 33 being formed around the readout circuit region 15. In the third substrate 30, the column signal processing circuit 34, the horizontal drive circuit 35, the system control circuit 36, the horizontal output line 37, and the reference voltage supply section 38 are formed. This eliminates an increase in a chip size and inhibition of miniaturization of an area per pixel due to the structure of electrically coupling substrates to each other, similarly to the foregoing embodiments and modification examples thereof. As a result, it is possible to provide the imaging device 1 having a three-layered structure not inhibiting the miniaturization of an area per pixel, while having a chip size equivalent to an existing chip size. It is to be noted that the vertical drive circuit 33 may be formed only in the first substrate 10 or may be formed only in the second substrate 20.

Modification Example 9

FIG. 32 illustrates an example of a cross-sectional configuration of an imaging device (e.g., the imaging device 1) according to a modification example (Modification Example 9) of any of the foregoing first to fifth embodiments and Modification Examples 1 to 8 thereof. In the foregoing first to fourth embodiments and Modification Examples 1 to 8 thereof, etc., the imaging device 1 is configured by stacking the three substrates (first substrate 10, second substrate 20, and third substrate 30). However, as in the imaging devices 5 and 6 in the foregoing fifth embodiment, two substrates (first substrate 10 and second substrate 20) may be configured to be stacked. At this time, the logic circuits 32 may be formed separately in the first substrate 10 and the second substrate 20, for example, as illustrated in FIG. 32. Here, a circuit 32A, of the logic circuit 32, provided on side of the first substrate 10 is provided with a transistor having a gate structure, in which a high dielectric constant film including a material (e.g., high-k) that is able to withstand a high-temperature process and a metal gate electrode are stacked. Meanwhile, in a circuit 32B provided on side of the second substrate 20, a low-resistance region 26 is formed, which includes a silicide formed using a Salicide (Self Aligned Silicide) process such as $CoSi_2$ and NiSi, on a front surface of an impurity diffusion region in contact with a source electrode and a drain electrode. The low-resistance region including a silicide is formed by a compound of a semiconductor substrate material and a metal. This makes it possible to use a high-temperature process such as thermal oxidation when forming the sensor pixel 12. In addition, it is possible to reduce contact resistance in a case of providing the low-resistance region 26 including a silicide on the front surface of the impurity diffusion region in contact with a source electrode and a drain electrode in the circuit 32B, of the logic circuit 32, provided on the side of the second substrate 20. As a result, it is possible to increase the speed of an arithmetic operation in the logic circuit 32.

Modification Example 10

FIG. 33 illustrates a modification example of the cross-sectional configuration of the imaging device 1 according to a modification example (Modification Example 10) of the foregoing first to fourth embodiments and Modification Examples 1 to 8 thereof. In the logic circuit 32 of the third substrate 30 according to the foregoing first to fourth embodiments and Modification Examples 1 to 8 thereof, a low-resistance region 37 including a silicide formed by using the Salicide (Self Aligned Silicide) process such as $CoSi_2$ and NiSi may be formed on the front surface of the impurity diffusion region in contact with the source electrode and the drain electrode. This makes it possible to use a high-temperature process such as thermal oxidation when forming the sensor pixel 12. In addition, it is possible, in the logic circuit 32, to reduce contact resistance in a case of providing the low-resistance region 37 including a silicide on the front surface of the impurity diffusion region in contact with the source electrode and the drain electrode. As a result, it is possible to increase the speed of an arithmetic operation in the logic circuit 32.

It is to be noted that, in the foregoing first to fifth embodiments and Modification Examples 1 to 10 thereof, the electric conductivity type may be opposite. For example, in the descriptions of the foregoing first to fifth embodiments and Modification Examples 1 to 10 thereof, the p-type may be read as the n-type, and the n-type may be read as the p-type. Even in such a case, it is possible to obtain effects similar to those of the foregoing first to fifth embodiments and Modification Examples 1 to 10 thereof.

7. APPLICATION EXAMPLE

FIG. 34 illustrates an example of a schematic configuration of an imaging system 7 including the imaging device (e.g., the imaging device 1) according to any of the foregoing first to fifth embodiments and Modification Examples 1 to 10 thereof.

The imaging system 7 is an electronic apparatus including, for example, an imaging apparatus such as a digital still camera or a video camera, or a portable terminal apparatus such as a smartphone or a tablet-type terminal. The imaging system 7 includes, for example, an optical system 141, a shutter device 142, the imaging device 1, a DSP circuit 143, a frame memory 144, a display unit 145, a storage unit 146, an operation unit 147, and a power source unit 148. In the imaging system 7, the shutter device 142, the imaging device 1, the DSP circuit 143, the frame memory 144, the display unit 145, the storage unit 146, the operation unit 147, and the power source unit 148 are coupled to one another via a bus line 149.

The imaging device 1 outputs image data corresponding to incident light. The optical system 141 includes one or a plurality of lenses, and guides light (incident light) from a subject to the imaging device 1 to form an image on a light-receiving surface of the imaging device 1. The shutter device 142 is disposed between the optical system 141 and the imaging device 1, and controls periods of light irradiation and light shielding with respect to the imaging device 1 under the control of the operation unit 147. The DSP circuit 143 is a signal processing circuit that processes a signal (image data) outputted from the imaging device 1. The frame memory 144 temporarily holds the image data processed by the DSP circuit 143 in a frame unit. The display unit 145 includes, for example, a panel-type display device such as a liquid crystal panel or an organic EL (Electro Luminescence) panel, and displays a moving image or a still image captured by the imaging device 1. The storage unit 146 records image data of a moving image or a still image captured by the imaging device 1 in a recording medium such as a semiconductor memory or a hard disk. The operation unit 147 issues an operation command for various functions of the imaging system 7 in accordance with an operation by a user. The power source unit 148 appropriately supplies various types of power for operation to the imaging device 1, the DSP circuit 143, the frame memory 144, the display unit 145, the storage unit 146, and the operation unit 147 which are supply targets.

Next, description is given of an imaging procedure in the imaging system 7.

FIG. 35 illustrates an example of a flowchart of an imaging operation in the imaging system 7. A user instructs start of imaging by operating the operation unit 147 (step S101). Then, the operation unit 147 transmits an imaging command to the imaging device 1 (step S102). The imaging device 1 (specifically, the system control circuit 36) executes imaging in a predetermined imaging method upon receiving the imaging command (step S103).

The imaging device 1 outputs light (image data) formed on the light-receiving surface via the optical system 141 and the shutter device 142 to the DSP circuit 143. As used herein, the image data refers to data for all pixels of pixel signals generated on the basis of charges temporarily held in the floating diffusion FD. The DSP circuit 143 performs predetermined signal processing (e.g., noise reduction processing, etc.) on the basis of the image data inputted from the imaging device 1 (step S104). The DSP circuit 143 causes the frame memory 144 to hold the image data having been subjected to the predetermined signal processing, and the frame memory 144 causes the storage unit 146 to store the image data (step S105). In this manner, the imaging in the imaging system 7 is performed.

In the present application example, the imaging device 1 is applied to the imaging system 7. This enables smaller size or higher definition of the imaging device 1, thus making it possible to provide a small or high-definition imaging system 7.

8. EXAMPLES OF PRACTICAL APPLICATIONS

Practical Application Example 1

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 36 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 36, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 36, an audio speaker 12061, a display section 12062, and an instrument panel 12063 are illustrated as the output device. The display section 12062 may, for example, include at least one of an on-board display and a head-up display.

FIG. 37 is a diagram depicting an example of the installation position of the imaging section 12031.

In FIG. 37, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 37 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to an embodiment of the present disclosure may be applied. The technology according to an embodiment of the present disclosure may be applied to the imaging section 12031 among components of the configuration described above. Specifically, the imaging device 1 according to any of the foregoing embodiment and modification examples thereof is applicable to the imaging section 12031. The application of the technology according to an embodiment of the present disclosure to the imaging section 12031 allows for a high-definition captured image with less noise, thus making it possible to perform highly accurate control utilizing the captured image in the mobile body control system.

Practical Application Example 2

FIG. 38 is a view depicting an example of a schematic configuration of an endoscopic surgery system to which the technology according to an embodiment of the present disclosure (present technology) can be applied.

In FIG. 38, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 39 is a block diagram depicting an example of a functional configuration of the camera head 11102 and the CCU 11201 depicted in FIG. 38.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is suitably applicable to, for example, the image pickup unit 11402 provided in the camera head 11102 of the endoscope 11100, among the configurations described above. Applying the technology according to an embodiment of the present disclosure to the image pickup unit 11402 enables miniaturization or higher definition of the image pickup unit 11402, thus making it possible to provide the miniaturized or high-definition endoscope 11100.

Although the description has been given hereinabove of the present disclosure with reference to the first to fifth embodiments and Modification Examples 1 to 10 thereof, the application example, and the practical application examples, the present disclosure is not limited to the foregoing embodiment, etc., and various modifications may be made. It is to be noted that the effects described herein are merely illustrative. The effects of the present disclosure are not limited to those described herein. The present disclosure may have other effects than those described herein.

It is to be noted that the present disclosure may also have the following configurations. According to the present technology having the following configuration, a first hydrogen diffusion prevention layer is provided between a first semiconductor substrate including a sensor pixel that performs photoelectric conversion and configuring a first substrate and a second semiconductor substrate including a readout circuit that outputs a pixel signal based on charges outputted from the sensor pixel and configuring a second substrate, in a stacked body including the first substrate and the second substrate. Thus, hydrogen is selectively diffused to a desired region. This makes it possible to achieve both the noise characteristics and the photodiode characteristics.

(1)

An imaging device including:

a first substrate including, in a first semiconductor substrate, a sensor pixel that performs photoelectric conversion;

a second substrate including, in a second semiconductor substrate, a readout circuit that outputs a pixel signal based on charges outputted from the sensor pixel, the second substrate being stacked on the first substrate; and a first hydrogen diffusion prevention layer provided between the first semiconductor substrate and the second semiconductor substrate.

(2)

The imaging device according to (1), in which the first hydrogen diffusion prevention layer has a film density in a range from 2.7 g/cm to 3.5 g/cm.

(3)

The imaging device according to (1) or (2), in which a stacked body including the first substrate and the second substrate further includes a hydrogen supplying layer on side closer to the second substrate than the first hydrogen diffusion prevention layer.

(4)

The imaging device according to any one of (1) to (3), in which the first semiconductor substrate has one surface opposed to the second substrate and another surface opposed to the one surface, and the stacked body including the first substrate and the second substrate includes the first hydrogen diffusion prevention layer on side of the one surface and further includes a second hydrogen diffusion prevention layer on side of the other surface, with respect to the first semiconductor substrate.

(5)

The imaging device according to any one of (1) to (4), in which the stacked body including the first substrate and the second substrate includes, between the first semiconductor substrate and the second semiconductor substrate, an interlayer insulating film and a first through-wiring line provided inside the interlayer insulating film, and the first substrate and the second substrate are electrically coupled to each other by the first through-wiring line.

(6)

The imaging device according to (5), in which the first through-wiring line includes a metal layer between the first through-wiring line and the interlayer insulating film, the metal layer including a metal having an oxygen absorption effect.

(7)

The imaging device according to any one of (1) to (6), in which the first substrate further includes a logic circuit that processes the pixel signal.

(8)

The imaging device according to any one of (1) to (7), in which the sensor pixel includes a photoelectric conversion element, a transfer transistor electrically coupled to the photoelectric conversion element, and a floating diffusion that temporarily holds charges outputted from the photoelectric conversion element via the transfer transistor, and the readout circuit includes a reset transistor that resets an electric potential of the floating diffusion to a predetermined electric potential, an amplification transistor that generates, as the pixel signal, a signal of a voltage corresponding to a level of the charges held in the floating diffusion, and a selection transistor that controls an output timing of the pixel signal from the amplification transistor.

(9)

The imaging device according to (8), in which the first substrate includes, on the side of the one surface of the first semiconductor substrate opposed to the second substrate, the photoelectric conversion element, the transfer transistor, and the floating diffusion, and the second substrate includes the readout circuit on side of one surface of the second semiconductor substrate, and is attached to the first substrate, with another surface, opposed to the one surface, of the second semiconductor substrate being opposed to the side of the one surface of the first semiconductor substrate.

(10)

The imaging device according to (9), in which the one surface of the first semiconductor substrate and the one surface of the second semiconductor substrate have mutually different interface state densities.

(11)

The imaging device according to any one of (1) to (10), further including a third substrate including, in a third semiconductor substrate, the logic circuit that processes the pixel signal, in which the first substrate, the second substrate, and the third substrate are stacked in this order.

(12)

The imaging device according to (11), in which the second substrate and the third substrate are electrically coupled to each other by a junction between pad electrodes in a case where the second substrate and the third substrate include the respective pad electrodes, and the second substrate and the third substrate are electrically coupled to each other by a second through-wiring line penetrating the third semiconductor substrate in a case where the third substrate includes the second through-wiring line.

(13)

The imaging device according to any one of (9) to (12), further including the third substrate including, in the third semiconductor substrate, the logic circuit that processes the pixel signal, in which the third substrate includes the logic circuit on side of one surface of the third semiconductor substrate, and is attached to the second substrate, with another surface, opposed to the one surface, of the third semiconductor substrate being opposed to the side of the one surface of the second semiconductor substrate.

(14)

The imaging device according to (13), in which the logic circuit includes a silicide on a front surface of an impurity diffusion region in contact with a source electrode or a drain electrode.

(15)

The imaging device according to any one of (12) to (14), in which the sensor pixel includes the photoelectric conversion element, the transfer transistor electrically coupled to the photoelectric conversion element, and the floating diffusion that temporarily holds charges outputted from the photoelectric conversion element via the transfer transistor, the readout circuit includes the reset transistor that resets an electric potential of the floating diffusion to a predetermined electric potential, the amplification transistor that generates, as the pixel signal, a signal of a voltage corresponding to a level of the charges held in the floating diffusion, and the selection transistor that controls an output timing of the pixel signal from the amplification transistor, the stacked body including the first substrate and the second substrate includes, between the first semiconductor substrate and the second semiconductor substrate, the interlayer insulating film and the first through-wiring line provided inside the interlayer insulating film, and a gate of the transfer transistor is electrically coupled to the logic circuit via the first through-wiring line and the pad electrodes or the second through-wiring line.

(16)

The imaging device according to any one of (13) to (15), including the interlayer insulating film between the first semiconductor substrate and the second semiconductor substrate, in which the first substrate further includes, inside the interlayer insulating film, a gate wiring line extending in a direction parallel to the first substrate, and the gate of the transfer transistor is electrically coupled to the logic circuit via the gate wiring line.

(17)

The imaging device according to (15) or (16), in which the second substrate includes the readout circuit for every four of the sensor pixels, and a plurality of the first through-wiring lines are arranged side by side in a strip shape in a first direction in a plane of the first substrate.

(18)

The imaging device according to (17), in which the sensor pixels are arranged in matrix in the first direction and a second direction orthogonal to the first direction, and the second substrate further includes

- a first control line electrically coupled to the gate of the transfer transistor of each of the sensor pixels arranged side by side in the second direction,
- a second control line electrically coupled to a gate of each of the reset transistors arranged side by side in the second direction,
- a third control line electrically coupled to a gate of each of the selection transistors arranged side by side in the second direction, and
- an output line electrically coupled to an output end of each of the readout circuits arranged side by side in the first direction.

This application claims the benefit of Japanese Priority Patent Application JP2018-238179 filed with the Japan Patent Office on Dec. 20, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device comprising:

- a first substrate including, in a first semiconductor substrate, a sensor pixel that performs photoelectric conversion, and the first semiconductor substrate defines a first surface and a second surface such that the first surface is opposite the second surface;
- a second substrate including, in a second semiconductor substrate, a readout circuit that outputs a pixel signal based on charges outputted from the sensor pixel, the second substrate being stacked on the first substrate, such that the second substrate is opposed to the first surface of the first semiconductor substrate;
- a first hydrogen diffusion prevention layer abutting the first surface, disposed between the first semiconductor substrate and the second semiconductor substrate; and
- a second hydrogen diffusion prevention layer abutting the second surface.

2. The imaging device according to claim 1, wherein the first hydrogen diffusion prevention layer has a film density in a range from 2.7 g/cm to 3.5 g/cm.

3. The imaging device according to claim 1, wherein a stacked body including the first substrate and the second substrate further includes a hydrogen supplying layer on side closer to the second substrate than the first hydrogen diffusion prevention layer.

4. The imaging device according to claim 1, wherein a stacked body including the first substrate and the second substrate includes, between the first semiconductor substrate and the second semiconductor substrate, an interlayer insulating film and a first through-wiring line provided inside the interlayer insulating film, and the first substrate and the second substrate are electrically coupled to each other by the first through-wiring line.

5. The imaging device according to claim 4, wherein the first through-wiring line includes a metal layer between the first through-wiring line and the interlayer insulating film, the metal layer including a metal having an oxygen absorption effect.

6. The imaging device according to claim 1, wherein the first substrate further includes a logic circuit that processes the pixel signal.

7. The imaging device according to claim 1, wherein the sensor pixel includes a photoelectric conversion element, a transfer transistor electrically coupled to the photoelectric conversion element, and a floating diffusion that temporarily holds charges outputted from the photoelectric conversion element via the transfer transistor, and the readout circuit includes a reset transistor that resets an electric potential of the floating diffusion to a predetermined electric potential, an amplification transistor that generates, as the pixel signal, a signal of a voltage corresponding to a level of the charges held in the floating diffusion, and a selection transistor that controls an output timing of the pixel signal from the amplification transistor.

8. The imaging device according to claim 7, wherein the first substrate includes, on side of one surface of the first semiconductor substrate opposed to the second substrate, the photoelectric conversion element, the transfer transistor, and the floating diffusion, and the second substrate includes the readout circuit on side of one surface of the second semiconductor substrate, and is attached to the first substrate, with another surface, opposed to the one surface, of the second semiconductor substrate being opposed to the side of the one surface of the first semiconductor substrate.

9. The imaging device according to claim 8, wherein the one surface of the first semiconductor substrate and the one surface of the second semiconductor substrate have mutually different interface state densities.

10. The imaging device according to claim 1, further comprising a third substrate including, in a third semiconductor substrate, a logic circuit that processes the pixel signal, wherein the first substrate, the second substrate, and the third substrate are stacked in this order.

11. The imaging device according to claim 10, wherein the second substrate and the third substrate are electrically coupled to each other by a junction between pad electrodes in a case where the second substrate and the third substrate include the respective pad electrodes, and the second substrate and the third substrate are electrically coupled to each other by a second through-wiring line penetrating the third semiconductor substrate in a case where the third substrate includes the second through-wiring line.

12. The imaging device according to claim 8, further comprising a third substrate including, in a third semiconductor substrate, a logic circuit that processes the pixel signal, wherein the third substrate includes the logic circuit on side of one surface of the third semiconductor substrate, and is attached to the second substrate, with another surface, opposed to the one surface, of the third semiconductor substrate being opposed to the side of the one surface of the second semiconductor substrate.

13. The imaging device according to claim 12, wherein the logic circuit includes a silicide on a front surface of an impurity diffusion region in contact with a source electrode or a drain electrode.

14. The imaging device according to claim 11, wherein the sensor pixel includes a photoelectric conversion element, a transfer transistor electrically coupled to the photoelectric conversion element, and a floating diffusion that temporarily holds charges outputted from the photoelectric conversion element via the transfer transistor, the readout circuit includes a reset transistor that resets an electric potential of the floating diffusion to a predetermined electric potential, an amplification transistor that generates, as the pixel signal, a signal of a voltage corresponding to a level of the charges held in the floating diffusion, and a selection transistor that controls an output timing of the pixel signal from the amplification transistor, a stacked body including the first substrate and the second substrate includes, between the first semiconductor substrate and the second semiconductor substrate, an interlayer insulating film and a first through-wiring line provided inside the interlayer insulating film, and a gate of the transfer transistor is electrically coupled to the logic circuit via the first through-wiring line and the pad electrodes or the second through-wiring line.

15. The imaging device according to claim 12, comprising an interlayer insulating film between the first semiconductor substrate and the second semiconductor substrate, wherein the first substrate further includes, inside the interlayer insulating film, a gate wiring line extending in a direction parallel to the first substrate, and a gate of the transfer transistor is electrically coupled to the logic circuit via the gate wiring line.

16. The imaging device according to claim 14, wherein the second substrate includes the readout circuit for every four of the sensor pixels, and a plurality of the first through-wiring lines are arranged side by side in a strip shape in a first direction in a plane of the first substrate.

17. The imaging device according to claim 16, wherein the sensor pixels are arranged in matrix in the first direction and a second direction orthogonal to the first direction, and the second substrate further includes a first control line electrically coupled to the gate of the transfer transistor of each of the sensor pixels arranged side by side in the second direction, a second control line electrically coupled to a gate of each of the reset transistors arranged side by side in the second direction, a third control line electrically coupled to a gate of each of the selection transistors arranged side by side in the second direction, and an output line electrically coupled to an output end of each of the readout circuits arranged side by side in the first direction.

* * * * *